(12) United States Patent
Xu et al.

(10) Patent No.: US 12,171,117 B2
(45) Date of Patent: Dec. 17, 2024

(54) DISPLAY SUBSTRATE, MANUFACTURING METHOD THEREOF AND DISPLAY DEVICE

(71) Applicant: BOE TECHNOLOGY GROUP CO., LTD., Beijing (CN)

(72) Inventors: Cheng Xu, Beijing (CN); Chen Xu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 538 days.

(21) Appl. No.: 17/604,931

(22) PCT Filed: Jul. 8, 2021

(86) PCT No.: PCT/CN2021/105278
§ 371 (c)(1),
(2) Date: Oct. 19, 2021

(87) PCT Pub. No.: WO2022/151681
PCT Pub. Date: Jul. 21, 2022

(65) Prior Publication Data
US 2023/0108752 A1  Apr. 6, 2023

(30) Foreign Application Priority Data
Jan. 13, 2021 (CN) .......................... 202110039159.4

(51) Int. Cl.
H10K 50/86  (2023.01)
H01L 27/12  (2006.01)
(Continued)

(52) U.S. Cl.
CPC ......... H10K 50/865 (2023.02); H01L 27/124 (2013.01); H10K 59/1213 (2023.02);
(Continued)

(58) Field of Classification Search
CPC .............. H10K 50/865; H10K 59/353; H10K 59/1213; H10K 59/38; H10K 59/1315; H01L 27/124
See application file for complete search history.

(56) References Cited

U.S. PATENT DOCUMENTS

2012/0075270 A1   3/2012  Kitakado
2021/0296365 A1   9/2021  Liu et al.

FOREIGN PATENT DOCUMENTS

CN  110854140 A  2/2020
CN  111370426 A  7/2020
(Continued)

OTHER PUBLICATIONS

International Search Report of PCT/CN2021/105278 in Chinese, mailed Oct. 12, 2021.
(Continued)

Primary Examiner — Mohammad M Choudhry
(74) Attorney, Agent, or Firm — Collard & Roe, P.C.

(57) ABSTRACT

A display substrate and a display device are disclosed. In the display substrate, each sub-pixel includes: a conductive light-shielding structure; a buffer layer; a semiconductor layer; an interlayer insulating layer, located on a side of the semiconductor layer away from the buffer layer; and a conductive layer, located on a side of the interlayer insulating layer away from the semiconductor layer, and including a conductive structure. The conductive light-shielding structure includes a first main body portion and a first recessed portion, an average thickness of the first recessed portion is smaller than an average thickness of the first main body portion. The display substrate further includes a first contact hole, the first contact hole penetrates both the interlayer insulating layer and the buffer layer, the conductive structure (Continued)

is electrically connected with the first recessed portion through the first contact hole.

23 Claims, 11 Drawing Sheets

(51) Int. Cl.
  *H10K 59/121* (2023.01)
  *H10K 59/131* (2023.01)
  *H10K 59/35* (2023.01)
  *H10K 59/38* (2023.01)
(52) U.S. Cl.
  CPC ....... *H10K 59/1315* (2023.02); *H10K 59/353* (2023.02); *H10K 59/38* (2023.02)

(56) References Cited

FOREIGN PATENT DOCUMENTS

| CN | 111370428 A | 7/2020 |
|---|---|---|
| CN | 112366226 A | 2/2021 |

OTHER PUBLICATIONS

Notice of Transmittal of the International Search Report of PCT/CN2021/105278 in Chinese, mailed Oct. 12, 2021.
Written Opinion of the International Searching Authority of PCT/CN2021/105278 in Chinese, mailed Oct. 12, 2021.

DISPLAY SUBSTRATE, MANUFACTURING METHOD THEREOF AND DISPLAY DEVICE

CROSS REFERENCE TO RELATED APPLICATIONS

This application is the National Stage of PCT/CN2021/105278 filed on Jul. 8, 2021, which claims priority under 35 U.S.C. § 119 of Chinese Application No. 202110039159.4 filed on Jan. 13, 2021, the disclosure of which is incorporated by reference.

The present disclosure claims priority of Chinese Patent Application No. 202110039159.4 filed with CNIPA on Jan. 13, 2021, for all purposes, the present disclosure of which is incorporated herein by reference in its entirety as part of the present disclosure.

TECHNICAL FIELD

Embodiments of the present disclosure relate to a display substrate, a manufacturing method of the display substrate and a display device.

BACKGROUND

With the continuous development of display technology, an active matrix organic light emitting diode display device (AMOLED) has become a current research hotspot and a technology development direction of major manufacturers due to its advantages of wide color gamut, high contrast, light and thin design, self-luminescence, and wide viewing angle.

At present, the active matrix organic light emitting diode display device (AMOLED) has been widely used in various electronic products, from small electronic products such as a smart bracelet, a smart watch, a smart phone and a tablet computer to large electronic products such as a notebook computer, a desktop computer and a television. Therefore, the demand of the market for the active matrix organic light emitting diode display device has also increased.

SUMMARY

Embodiments of the present disclosure provide a display substrate, a manufacturing method thereof, and a display device. The display substrate includes a base substrate and a plurality of sub-pixels located on the base substrate, each of the plurality of sub-pixel includes: a conductive light-shielding structure, located on the base substrate; a buffer layer, located on a side of the conductive light-shielding structure away from the base substrate; a semiconductor layer, located on a side of the buffer layer away from the conductive light-shielding structure; an interlayer insulating layer, located on a side of the semiconductor layer away from the buffer layer; and a conductive layer, located on a side of the interlayer insulating layer away from the semiconductor layer, and the conductive layer includes a conductive structure, the conductive light-shielding structure includes a first main body portion and a first recessed portion, an average thickness of the first recessed portion in a direction perpendicular to the base substrate is smaller than an average thickness of the first main body portion in the direction perpendicular to the base substrate, the display substrate further includes a first contact hole, the first contact hole penetrates the interlayer insulating layer and the buffer layer, the conductive structure is electrically connected with the first recessed portion through the first contact hole, an area of a surface of the first recessed portion close to the conductive layer is larger than an area of an orthographic projection of the first recessed portion on the base substrate. In this way, the display substrate is provided with the first recessed portion in the conductive light-shielding structure, thus a contact area between a first drain electrode and the conductive light-shielding structure is increased, and the contact is more sufficient, so that a contact resistance is reduced, and an electrical connection effect between the first drain electrode and the conductive light-shielding structure is improved.

At least one embodiment of the present disclosure provides a display substrate, which includes a base substrate and a plurality of sub-pixels located on the base substrate, wherein each of the plurality of sub-pixels includes: a conductive light-shielding structure, located on the base substrate; a buffer layer, located on a side of the conductive light-shielding structure away from the base substrate; a semiconductor layer, located on a side of the buffer layer away from the conductive light-shielding structure; an interlayer insulating layer, located on a side of the semiconductor layer away from the buffer layer; and a conductive layer, located on a side of the interlayer insulating layer away from the semiconductor layer, and including a conductive structure, the conductive light-shielding structure includes a first main body portion and a first recessed portion, the display substrate further includes a first contact hole, the first contact hole penetrates both the interlayer insulating layer and the buffer layer, the conductive structure is electrically connected with the first recessed portion through the first contact hole, an area of a surface of the first recessed portion close to the conductive layer is larger than an area of an orthographic projection of the first recessed portion on the base substrate, and an average thickness of the first recessed portion in a direction perpendicular to the base substrate is smaller than an average thickness of the first main body portion in the direction perpendicular to the base substrate.

For example, in the display substrate provided by an embodiment of the present disclosure, the buffer layer includes: a first buffer portion, wherein a side of the first buffer portion away from the base substrate is arranged in contact with the conductive layer, and a side of the first buffer portion close to the base substrate is arranged in contact with the conductive light-shielding structure; and a second buffer portion, wherein a side of the second buffer portion away from the base substrate is arranged in contact with the interlayer insulating layer, and a side of the second buffer portion close to the base substrate is arranged in contact with the conductive light-shielding structure.

For example, in the display substrate provided by an embodiment of the present disclosure, the first contact hole includes a side wall, and the side wall at least includes: a first sub side wall, located in the interlayer insulating layer; and a second sub side wall, located in the buffer layer, an included angle between the first sub side wall and the base substrate constitutes a first slope angle, an included angle between the second sub side wall and the base substrate constitutes a second slope angle, the first slope angle is smaller than the second slope angle; and a contact portion of the second sub side wall and the first buffer portion is located between the first buffer portion and the second buffer portion.

For example, in the display substrate provided by an embodiment of the present disclosure, the side wall of the first contact hole further includes: a third sub side wall, located in the first buffer portion, an included angle between the third sub side wall and the base substrate constitutes a third slope angle, and the first slope angle, the second slope angle, and the third slope angle are different from each other.

For example, in the display substrate provided by an embodiment of the present disclosure, along a radial direction of the first contact hole, a ratio of a length of the first buffer portion to an average thickness of the first buffer portion is greater than a ratio of a projected length of the first sub side wall on the base substrate to an average thickness of the interlayer insulating layer.

For example, in the display substrate provided by an embodiment of the present disclosure, along a radial direction of the first contact hole, a ratio of a projected length of the first sub side wall on the base substrate to an average thickness of the interlayer insulating layer is greater than a ratio of a projected length of the second sub side wall on the base substrate to an average thickness of the buffer layer.

For example, in the display substrate provided by an embodiment of the present disclosure, the second slope angle is greater than the third slope angle, and the first slope angle is greater than the third slope angle.

For example, in the display substrate provided by an embodiment of the present disclosure, a dimension L of an orthographic projection of the first recessed portion on the base substrate in a direction parallel to the base substrate satisfies the following formula:

$$2(A cot \beta + B cot \gamma + C cot \theta) < L < D$$

wherein A is a maximum thickness of the first buffer portion, B is a maximum thickness of the second buffer portion, C is a maximum thickness of the interlayer insulating layer, $\beta$ is the first slope angle, $\gamma$ is the second slope angle, $\theta$ is the third slope angle, and D is a largest dimension of an orthographic projection of the first contact hole on the base substrate in the direction parallel to the base substrate.

For example, in the display substrate provided by an embodiment of the present disclosure, the first recessed portion includes a first edge portion, and in a direction from an edge of the first recessed portion to a center of the first recessed portion, a thickness of the first edge portion in the direction perpendicular to the base substrate gradually decreases.

For example, in the display substrate provided by an embodiment of the present disclosure, the first recessed portion includes a first edge portion, and in the direction perpendicular to the base substrate, a fourth slope angle of a surface of the first edge portion close to the conductive layer is continuously changed.

For example, in the display substrate provided by an embodiment of the present disclosure, the surface of the first recessed portion close to the conductive structure is a continuous arc surface, or a combined surface composed of at least one segment of a continuous arc surface and at least one segment of a plane.

For example, in the display substrate provided by an embodiment of the present disclosure, the first recessed portion includes a first edge portion, and a fourth slope angle $\alpha$ of a surface of the first edge portion close to the conductive layer satisfies the following formula:

$$0 < \alpha < k*H/Lmax$$

wherein Lmax is a maximum aperture of an orthographic projection of the first recessed portion on the base substrate, H is an average thickness of the first main body portion, and k is a constant greater than 1 and less than or equal to 2.

For example, in the display substrate provided by an embodiment of the present disclosure, k=2, a range of the fourth slope angle is from 1 to $\pi/18$.

For example, in the display substrate provided by an embodiment of the present disclosure, the first recessed portion includes a first edge portion, a fourth slope angle $\alpha$ of a surface of the first edge portion close to the conductive layer is smaller than the third slope angle of the third sub side wall, and the following formula is satisfied:

$$(A cot \beta + B cot \gamma + C cot \theta + L/2 \tan \alpha) \leq D/2,$$

wherein A is a maximum thickness of the first buffer portion, B is a maximum thickness of the second buffer portion, C is a maximum thickness of the interlayer insulating layer, $\beta$ is the first slope angle, $\gamma$ is the second slope angle, $\theta$ is the third slope angle, and D is a largest dimension of an orthographic projection of the first contact hole on the base substrate in the direction parallel to the base substrate.

For example, the display substrate provided by an embodiment of the present disclosure further includes: a planarization layer, wherein the planarization layer is located on a side of the conductive layer away from the semiconductor layer, and the planarization layer includes an anode hole; and an anode, wherein the anode is located on a side of the planarization layer away from the semiconductor layer, and includes a light emitting portion, a driving portion and an extension portion connecting the light emitting portion and the driving portion, and at least a portion of the driving portion is located within the anode hole, in at least one of the sub-pixels, an orthographic projection of the first contact hole on the base substrate at least partially overlaps with an orthographic projection of the driving portion on the base substrate, the display substrate further includes: a power line, located in the conductive layer; and a sensing line, located in the conductive layer; the power line and the sensing line are arranged in a first direction, both the power line and the sensing line extend in a second direction that intersects the first direction; the plurality of sub-pixels include a first sub-pixel pair and a second sub-pixel pair, the first sub-pixel pair includes two of the sub-pixels, which are located on two sides of the power line respectively, the second sub-pixel pair includes two of the sub-pixels, which are located on two sides of the sensing line respectively; the first sub-pixel pair and the second sub-pixel pair are alternately arranged in the first direction, in the two sub-pixels in the second sub-pixel pair, a first overlapping region is provided between an orthographic projection of the anode hole on the base substrate and an orthographic projection of the first recessed portion on the base substrate, and an area of the first overlapping region is smaller than an area of an orthographic projection of the first contact hole on the base substrate.

For example, in the display substrate provided by an embodiment of the present disclosure, the anode further includes a concave structure at an edge position of the anode hole, and a concave direction of the concave structure faces the conductive light-shielding structure.

For example, in the display substrate provided by an embodiment of the present disclosure, a size range of an orthographic projection of the first recessed portion on the base substrate in a direction parallel to the base substrate is from 5 microns to 10 microns.

For example, in the display substrate provided by an embodiment of the present disclosure, an orthographic projection of the first contact hole on the base substrate at least partially overlaps with an orthographic projection of the first recessed portion on the base substrate.

For example, in the display substrate provided by an embodiment of the present disclosure, each of the sub-pixels includes a pixel driving circuit, the pixel driving circuit includes a first thin film transistor, and the conductive structure is a first drain electrode of the first thin film transistor.

For example, in the display substrate provided by an embodiment of the present disclosure, the first thin film transistor further includes: a first active layer, wherein the first active layer is located in the semiconductor layer, and includes a first channel region, and a first source electrode region and a first drain electrode region that are located on two sides of the first channel region respectively; and a first source electrode, located in the conductive layer, the display substrate further includes a first via hole and a second via hole, the first via hole and the second via hole are located in the interlayer insulating layer, the first source electrode is connected with the first source electrode region through the first via hole, and the first drain electrode is connected with the first drain electrode region through the second via hole.

For example, in the display substrate provided by an embodiment of the present disclosure, the conductive light-shielding structure further includes: a first insulating portion, wherein an orthographic projection of the first insulating portion on the base substrate at least partially overlaps with an orthographic projection of the first via hole on the base substrate, and an orthographic projection of the first insulating portion on the base substrate at least partially overlaps with an orthographic projection of the first source electrode region on the base substrate.

For example, in the display substrate provided by an embodiment of the present disclosure, the first insulating portion includes a first hollow portion, and the first hollow portion is filled with a material of the buffer layer.

For example, in the display substrate provided by an embodiment of the present disclosure, the first hollow portion includes a first hollow ring, and both a material of an inner part of the first hollow ring and a material of an outer side of the first hollow ring are a material of the conductive light-shielding structure.

For example, in the display substrate provided by an embodiment of the present disclosure, the first insulating portion is an oxidation portion.

For example, the display substrate provided by an embodiment of the present disclosure further includes: a gate insulating layer, located between the semiconductor layer and the interlayer insulating layer; a gate electrode layer, located between the gate insulating layer and the interlayer insulating layer; a passivation layer, located on a side of the conductive layer away from the base substrate; a color filter layer, wherein the color filter layer is located on a side of the passivation layer away from the conductive layer, and includes at least three color filters with different colors; and an anode layer, the planarization layer is located on a side of the color filter layer away from the passivation layer, the anode layer is located on a side of the planarization layer away from the color filter layer, and the anode is located in the anode layer.

For example, the display substrate provided by an embodiment of the present disclosure further includes a power connection line, arranged on a same layer as the conductive light-shielding structure, wherein the power connection line includes a second main body portion and a plurality of power recessed portions, an average thickness of the power recessed portions in the direction perpendicular to the base substrate is smaller than an average thickness of the second main body portion in the direction perpendicular to the base substrate, and an area of a surface of one of the power recessed portions close to the conductive layer is larger than an area of an orthographic projection of the one of the power recessed portions on the base substrate.

For example, in the display substrate provided by an embodiment of the present disclosure, an orthographic projection of at least one of the plurality of power recessed portions on the base substrate at least partially overlaps with orthographic projections of the color filters in the color filter layer on the base substrate.

For example, in the display substrate provided by an embodiment of the present disclosure, each of the power recessed portions includes a second edge portion, and in a direction from an edge of one of the power recessed portions to a center of the one of the power recessed portions, a thickness of the second edge portion in the direction perpendicular to the base substrate continuously and gradually decreases.

For example, in the display substrate provided by an embodiment of the present disclosure, each of the power recessed portions includes a second edge portion, and in a direction perpendicular to the base substrate, a fifth slope angle of a surface of the second edge portion close to the conductive layer is continuously changed.

For example, in the display substrate provided by an embodiment of the present disclosure, the display substrate further includes a power contact hole, the power contact hole is located in the interlayer insulating layer and the buffer layer, and an orthographic projection of the power contact hole on the base substrate at least partially overlaps with an orthographic projection of one of the power recessed portions corresponding to the power contact hole on the base substrate.

For example, in the display substrate provided by an embodiment of the present disclosure, the buffer layer includes: a third buffer portion, wherein the third buffer portion is located in the power contact hole, a side of the third buffer portion away from the base substrate is arranged in contact with the power connection line, and a side of the third buffer portion close to the base substrate is arranged in contact with the conductive light-shielding structure; and a fourth buffer portion, wherein the fourth buffer portion is located on a side of the third buffer portion away from a center of one of the power recessed portions, and a side wall of the power contact hole includes: a fourth sub side wall, located in the interlayer insulating layer; and a fifth sub side wall, located in the fourth buffer portion, wherein an included angle between the fourth sub side wall and the base substrate constitutes a sixth slope angle, an included angle between the fifth sub side wall and the base substrate constitutes a seventh slope angle, the sixth slope angle is smaller than the seventh slope angle; and a contact portion of the fifth sub side wall and the third buffer portion is located between the third buffer portion and the fourth buffer portion.

For example, in the display substrate provided by an embodiment of the present disclosure, the side wall of the power contact hole further includes: a sixth sub side wall, located in the third buffer portion, an included angle between the sixth sub side wall and the base substrate constitutes an eighth slope angle, and the sixth slope angle, the seventh slope angle, and the eighth slope angle are different from each other.

For example, in the display substrate provided by an embodiment of the present disclosure, the seventh slope angle is smaller than the second slope angle.

For example, in the display substrate provided by an embodiment of the present disclosure, the eighth slope angle is greater than the third slope angle.

For example, the display substrate provided by an embodiment of the present disclosure further includes: a sensing connection line, arranged on a same layer as the conductive light-shielding structure, the sensing connection line includes a third main body portion and a plurality of sensing recessed portions, an average thickness of the sensing recessed portions in a direction perpendicular to the base substrate is smaller than an average thickness of the third main body portion in a direction perpendicular to the base substrate, an area of a surface of one of the sensing recessed portions close to the conductive layer is larger than an area of an orthographic projection of the one of the sensing recessed portions on the base substrate.

For example, in the display substrate provided by an embodiment of the present disclosure, an orthographic projection of at least one of the plurality of sensing recessed portions on the base substrate at least partially overlaps with orthographic projections of the color filters in the color filter layer on the base substrate.

For example, in the display substrate provided by an embodiment of the present disclosure, each of the sensing recessed portions includes a third edge portion, and in a direction from an edge of one of the sensing recessed portions to a center of the one of the sensing recessed portions, a thickness of the third edge portion in the direction perpendicular to the base substrate continuously and gradually decreases.

For example, in the display substrate provided by an embodiment of the present disclosure, each of the sensing recessed portions includes a third edge portion, and in a direction perpendicular to the base substrate, a ninth slope angle of a surface of the third edge portion close to the conductive layer is continuously changed.

For example, in the display substrate provided by an embodiment of the present disclosure, the display substrate further includes a sensing contact hole, the sensing contact hole is located in the interlayer insulating layer and the buffer layer, and an orthographic projection of the sensing contact hole on the base substrate at least partially overlaps with an orthographic projection of one of the sensing recessed portions corresponding to the sensing contact hole on the base substrate.

For example, in the display substrate provided by an embodiment of the present disclosure, the buffer layer includes: a fifth buffer portion, located in the sensing contact hole, wherein a side of the fifth buffer portion away from the base substrate is arranged in contact with the sensing connection line, and a side of the fifth buffer portion close to the base substrate is arranged in contact with the conductive light-shielding structure; and a sixth buffer portion located on a side of the fifth buffer portion away from a center of one of the sensing recessed portions corresponding to the sensing contact hole, and a side wall of the sensing contact hole includes: a seventh sub side wall, located in the interlayer insulating layer; and an eighth sub side wall, located in the sixth buffer portion; wherein an included angle between the seventh sub side wall and the base substrate constitutes a tenth slope angle, an included angle between the eighth sub side wall and the base substrate constitutes an eleventh slope angle, the tenth slope angle is smaller than the eleventh slope angle; and a contact portion of the eighth sub side wall and the fifth buffer portion is located between the fifth buffer portion and the sixth buffer portion.

For example, in the display substrate provided by an embodiment of the present disclosure, the buffer layer further includes: a ninth sub side wall, located in the fifth buffer portion, an included angle between the ninth sub side wall and the base substrate constitutes a twelfth slope angle, the tenth slope angle, the eleventh slope angle, and the twelfth slope angle are different from each other.

For example, in the display substrate provided by an embodiment of the present disclosure, the eleventh slope angle is smaller than the second slope angle.

For example, in the display substrate provided by an embodiment of the present disclosure, the twelfth slope angle is greater than the third slope angle.

For example, in the display substrate provided by an embodiment of the present disclosure, each of the sub-pixels includes a driving region and a light emitting region, the conductive light-shielding structure is located in the driving region, the driving portion of the anode is located in the driving region, and the light emitting portion of the anode is located in the light emitting region.

For example, the display substrate provided by an embodiment of the present disclosure further includes a first gate line, wherein the first gate line is located in the gate electrode layer, and extends along the first direction; a second gate line, wherein the second gate line is located in the gate electrode layer, and extends along the first direction; and a data line, wherein the data line is located in the conductive layer, and extends along the second direction, wherein the power line extends along the second direction, and the sensing line extends along the second direction, the plurality of sub-pixels are arranged in an array along the first direction and the second direction to form a plurality of sub-pixel rows arranged in the second direction and a plurality of sub-pixel columns arranged in the first direction, and in each of the sub-pixel rows, the first gate line is located between the driving region and the light emitting region, the second gate line is located between adjacent two of the sub-pixel rows, the power line is located between adjacent two of the sub-pixel columns, the sensing line is located between adjacent two of the sub-pixel columns, and the data line is located between adjacent two of the sub-pixel columns.

For example, in the display substrate provided by an embodiment of the present disclosure, each of the sub-pixels includes a pixel driving circuit, the pixel driving circuit includes a first thin film transistor, the first thin film transistor includes a first gate electrode, a first source electrode, and a first drain electrode, the conductive structure is a first drain electrode of the first thin film transistor, the pixel driving circuit further includes a second thin film transistor and a third thin film transistor, the second thin film transistor includes a second gate electrode, a second source electrode, and a second drain electrode, the third thin film transistor includes a third gate electrode, a third source electrode, and a third drain electrode, and the semiconductor layer further includes a conductive block, the first source electrode of the first thin film transistor is connected with the power line, the second source electrode of the second thin film transistor is connected with the data line, the second gate electrode of the second thin film transistor is connected with the first gate line, the second drain electrode of the second thin film transistor is connected with the first gate electrode of the first thin film transistor and the conductive block respectively, and the third gate electrode of the third thin film transistor is connected with the second gate line, the third source electrode of the third thin film transistor is connected with the sensing line, the third drain electrode of the third thin film transistor is connected with the first drain electrode of the first thin film transistor, the conductive light-shielding structure, the first drain electrode connected with the conductive light-shielding structure, and the conductive block located between the conductive light-shielding structure and the first drain electrode form a storage capacitor.

For example, in the display substrate provided by an embodiment of the present disclosure, the first source electrode of the first thin film transistor is connected with the power line through a first connection portion, the second source electrode of the second thin film transistor is connected with the data line through a second connection portion, the first connection portion is arranged on the same layer as the power line, and the second connection portion is arranged on a same layer as the data line.

For example, in the display substrate provided by an embodiment of the present disclosure, a direction from the first source electrode to the first drain electrode intersects with an extension direction of the first connection portion, and a direction from the second source electrode to the second drain electrode intersects with an extension direction of the second connection portion.

For example, in the display substrate provided by an embodiment of the present disclosure, the plurality of sub-pixels at least include a first color sub-pixel, a second color sub-pixel, a third color sub-pixel, and a fourth color sub-pixel, in each of the sub-pixel rows, the first color sub-pixel, the second color sub-pixel, the third color sub-pixel, and the fourth color sub-pixel are sequentially arranged along the first direction to form a sub-pixel group, and the power line is located between the second color sub-pixel and the third color sub-pixel in the sub-pixel group.

For example, in the display substrate provided by an embodiment of the present disclosure, the display substrate further includes a power connection line, and the power connection line is arranged in a same layer as the conductive light-shielding structure.

For example, in the display substrate provided by an embodiment of the present disclosure, the display substrate further includes a second contact hole, a third contact hole and a fourth contact hole, the second contact hole, the third contact hole and the fourth contact hole are located in both the interlayer insulating layer and the buffer layer, in the sub-pixel group, the power line is connected with the power connection line through the second contact hole, the first source electrode of the second color sub-pixel is connected with the power line in the same layer, the first source electrode of the third color sub-pixel is connected with the power line in the same layer, and the first source electrode of the first color sub-pixel is connected with the power connection line through the third contact hole, and the first source electrode of the fourth color sub-pixel is connected with the power connection line through the fourth contact hole.

For example, in the display substrate provided by an embodiment of the present disclosure, the power connection line includes a second main body portion, a second recessed portion, a third recessed portion, and a fourth recessed portion, an orthographic projection of the second recessed portion on the base substrate at least partially overlaps with an orthographic projection of the second contact hole on the base substrate, an orthographic projection of the third recessed portion on the base substrate at least partially overlaps with an orthographic projection of the third contact hole on the base substrate, an orthographic projection of the fourth recessed portion on the base substrate at least partially overlaps with an orthographic projection of the fourth contact hole on the base substrate, and a thickness of the second recessed portion, a thickness of the third recessed portion, and a thickness of the fourth recessed portion in the direction perpendicular to the base substrate are respectively smaller than a thickness of the second main body portion in the direction perpendicular to the base substrate, an area of a surface of the second recessed portion close to the power line is greater than an area of an orthographic projection of the second recessed portion on the base substrate, an area of a surface of the third recessed portion away from the base substrate is greater than an area of an orthographic projection of the third recessed portion on the base substrate, and an area of a surface of the fourth recessed portion away from the base substrate is greater than an area of an orthographic projection of the fourth recessed portion on the base substrate.

For example, in the display substrate provided by an embodiment of the present disclosure, an orthographic projection of at least one of the second recessed portion, the third recessed portion, and the fourth recessed portion on the base substrate at least partially overlaps with the orthographic projections of the color filters in the color filter layer on the base substrate.

For example, in the display substrate provided by an embodiment of the present disclosure, the second color sub-pixel includes a first color filter, the third color sub-pixel includes a second color filter, and the fourth color sub-pixel includes a third color filter, and in the sub-pixel group, an orthographic projection of at least one of the first color filter and the second color filter on the base substrate at least partially overlaps with an orthographic projection of the second recessed portion on the base substrate, and an orthographic projection of the third color filter on the base substrate at least partially overlaps with an orthographic projection of the fourth recessed portion on the base substrate.

For example, in the display substrate provided by an embodiment of the present disclosure, the sensing line is located between adjacent two of the sub-pixel groups in the first direction, and the adjacent two of the sub-pixel groups in the first direction include a first sub-pixel group and a second sub-pixel group, the display substrate further includes a sensing connection line, a fifth contact hole, a sixth contact hole, a seventh contact hole, an eighth contact hole and a ninth contact hole, the sensing connection line and the conductive light-shielding structure are arranged in a same layer, the fifth contact hole, the sixth contact hole, the seventh contact hole, the eighth contact hole, and the ninth contact hole are located in both the interlayer insulating layer and the buffer layer, in the adjacent two of the sub-pixel groups, the sensing line is connected with the sensing connection line through the fifth contact hole, the third source electrode of the third color sub-pixel in the first sub-pixel group is connected with the sensing connection line through the sixth contact hole, and the third source electrode of the fourth color sub-pixel in the first sub-pixel group is connected with the sensing connection line through the seventh contact hole, and the third source electrode of the first color sub-pixel in the first sub-pixel group is connected with the sensing connection line through the eighth contact hole, and the third source electrode of the second color sub-pixel in the second sub-pixel group is connected with the sensing connection line through the ninth contact hole.

For example, in the display substrate provided by an embodiment of the present disclosure, the sensing connection line includes a third main body portion, a fifth recessed portion, a sixth recessed portion, a seventh recessed portion, an eighth recessed portion and a ninth recessed portion, an orthographic projection of the fifth recessed portion on the base substrate at least partially overlaps with an orthographic projection of the fifth contact hole on the base substrate, an orthographic projection of the sixth recessed portion on the base substrate at least partially overlaps with an orthographic projection of the sixth contact hole on the base substrate, an orthographic projection of the seventh recessed portion on the base substrate at least partially overlaps with an orthographic projection of the seventh contact hole on the base substrate, an orthographic projection of the eighth recessed portion on the base substrate at least partially overlaps with an orthographic projection of the eighth contact hole on the base substrate, and an orthographic projection of the ninth recessed portion on the base substrate at least partially overlaps with an orthographic projection of the ninth contact hole on the base substrate, and a thickness of the fifth recessed portion, a thickness of the sixth recessed portion, a thickness of the seventh recessed portion, a thickness of the eighth recessed portion, and a thickness of the ninth recessed portion in the direction perpendicular to the base substrate are respectively smaller than the thickness of the third main body portion in the direction perpendicular to the base substrate, an area of a surface of the fifth recessed portion close to the sensing line is greater than an area of an orthographic projection of the fifth recessed portion on the base substrate, an area of a surface of the sixth recessed portion away from the base substrate is greater than an area of an orthographic projection of the sixth recessed portion on the base substrate, an area of a surface of the seventh recessed portion away from the base substrate is greater than an area of an orthographic projection of the seventh recessed portion on the base substrate, an area of a surface of the eighth recessed portion away from the base substrate is greater than an area of an orthographic projection of the eighth recessed portion on the base substrate, and an area of a surface of the ninth recessed portion away from the base substrate is greater than an area of an orthographic projection of the ninth recessed portion on the base substrate.

For example, in the display substrate provided by an embodiment of the present disclosure, an orthographic projection of at least one of the fifth recessed portion, the sixth recessed portion, the seventh recessed portion, the eighth recessed portion, and the ninth recessed portion on the base substrate at least partially overlaps with orthographic projections of the color filters in the color filter layer on the base substrate.

For example, in the display substrate provided by an embodiment of the present disclosure, in the second direction, the sensing connection line is located on a side of the second gate line away from the first gate line, an orthographic projection of the second color filter in the first sub-pixel group on the base substrate at least partially overlaps with an orthographic projection of the sixth recessed portion of the first sub-pixel group adjacent in the second direction on the base substrate, an orthographic projection of the third color filter in the first sub-pixel group on the base substrate at least partially overlaps with an orthographic projection of the seventh recessed portion adjacent in the second direction on the base substrate, and an orthographic projection of the first color filter in the second sub-pixel group on the base substrate at least partially overlaps with an orthographic projection of the ninth recessed portion adjacent in the second direction on the base substrate.

For example, in the display substrate provided by an embodiment of the present disclosure, in the sub-pixel group, an orthographic projection of the first color filter on the base substrate at least partially overlaps with an orthographic projection of the power connection line on the base substrate, an orthographic projection of the second color filter on the base substrate at least partially overlaps with the orthographic projection of the power connection line on the base substrate and the orthographic projection of the first gate line on the base substrate, respectively, and an orthographic projection of the third color filter on the base substrate at least partially overlaps with an orthographic projection of the power connection line on the base substrate.

For example, in the display substrate provided by an embodiment of the present disclosure, in the sub-pixel group, an orthographic projection of the first color filter on the base substrate at least partially overlaps with an orthographic projection of the sensing connection line on the base substrate, an orthographic projection of the second color filter on the base substrate at least partially overlaps with an orthographic projection of the sensing connection line on the base substrate, respectively, and an orthographic projection of the third color filter on the base substrate at least partially overlaps with an orthographic projection of the sensing connection line on the base substrate.

For example, in the display substrate provided by an embodiment of the present disclosure, the first thin film transistor further includes: a first active layer, and the first active layer is located in the semiconductor layer, and includes a first channel region and a first source electrode region and a first drain electrode region that are located on two sides of the first channel region; the first gate electrode is located in the gate electrode layer, an orthographic projection of the first gate electrode on the base substrate at least partially overlaps with an orthographic projection of the first channel region on the base substrate; the first source electrode and the first drain electrode are both located in the conductive layer, and the display substrate further includes a first via hole and a second via hole, the first via hole and the second via hole are located in the interlayer insulating layer, the first source electrode is connected with the first source electrode region through the first via hole, and the first drain electrode is connected with the first drain electrode region through the second via hole.

For example, in the display substrate provided by an embodiment of the present disclosure, an orthographic projection of the first channel region on the base substrate falls into an orthographic projection of the first main body portion on the base substrate.

For example, in the display substrate provided by an embodiment of the present disclosure, the display substrate further includes: a fourth via hole, located in the interlayer insulating layer, wherein the second drain electrode is connected with the conductive block through the fourth via hole, the conductive light-shielding structure further includes: a second insulating portion, and an orthographic projection of the second insulating portion on the base substrate at least partially overlaps with an orthographic projection of the fourth via hole on the base substrate.

For example, in the display substrate provided by an embodiment of the present disclosure, the second insulating portion includes a second hollow portion, and the second hollow portion is filled with a material of the buffer layer.

For example, in the display substrate provided by an embodiment of the present disclosure, the second hollow portion includes a second hollow ring, and both a material of an inner part of the second hollow ring and a material of an outer side of the second hollow ring are a material of the conductive light-shielding structure.

For example, in the display substrate provided by an embodiment of the present disclosure, the second insulating portion is an oxidation portion.

For example, in the display substrate provided by an embodiment of the present disclosure, shapes of orthographic projections of the first via hole and the fourth via hole on the base substrate are both anisotropic patterns, and both include a long side.

For example, in the display substrate provided by an embodiment of the present disclosure, in the sub-pixel group, a long side of the first via hole of the second color sub-pixel and a long side of the first via hole of the third color sub-pixel both extend along the first direction, and a long side of the first via hole of the first color sub-pixel and a long side of the first via hole of the fourth color sub-pixel both extend along the second direction.

For example, in the display substrate provided by an embodiment of the present disclosure, in the sub-pixel group, a long side of the fourth via hole of the second color sub-pixel and a long side of the fourth via hole of the third color sub-pixel both extend along the second direction, and a long side of the fourth via hole of the first color sub-pixel and a long side of the fourth via hole of the fourth color sub-pixel both extend along the first direction.

For example, in the display substrate provided by an embodiment of the present disclosure, in the sub-pixel group, a center of the fourth via hole of the first color sub-pixel, a center of the fourth via hole of the second color sub-pixel, a center of the fourth via hole of the third color sub-pixel and a center of the fourth via hole of the fourth color sub-pixel are misaligned in the second direction, and the center of the fourth via hole of the first color sub-pixel and the center of the fourth via hole of the fourth color sub-pixel are located on a first virtual straight line, the center of the fourth via hole of the second color sub-pixel and the center of the fourth via hole of the third color sub-pixel are located on a second virtual straight line parallel to the first virtual straight line.

For example, in the display substrate provided by an embodiment of the present disclosure, a material of the conductive light-shielding structure is at least one selected from the group consisting of molybdenum and titanium, and a material of the conductive layer is at least one selected from the group consisting of copper, molybdenum and titanium.

For example, in the display substrate provided by an embodiment of the present disclosure, the conductive layer includes a first sub metal layer and a second sub metal layer stacked in the direction perpendicular to the base substrate, a material of the first sub metal layer is copper, and a material of the second sub metal layer is a molybdenum-titanium alloy.

For example, in the display substrate provided by an embodiment of the present disclosure, a material of the gate electrode layer is at least one selected from the group consisting of copper, molybdenum and titanium.

For example, in the display substrate provided by an embodiment of the present disclosure, a thickness of the conductive light-shielding structure in the direction perpendicular to the base substrate ranges from 90 nanometers to 120 nanometers, and a thickness of the conductive layer in the direction perpendicular to the base substrate ranges from 200 nanometers to 600 nanometers.

At least one embodiment of the present disclosure further provides a display device, including any one of the above-mentioned display substrate.

At least one embodiment of the present disclosure further provides a manufacturing method of a display substrate, which includes: forming a conductive light-shielding material layer on a base substrate; patterning the conductive light-shielding material layer to form a conductive light-shielding structure; forming a buffer layer on a side of the conductive light-shielding structure away from the base substrate; forming a semiconductor layer on a side of the buffer layer away from the conductive light-shielding structure; forming an interlayer insulating layer on a side of the semiconductor layer away from the buffer layer; forming a first contact hole in the interlayer insulating layer and the buffer layer; and forming a conductive layer on a side of the interlayer insulating layer away from the semiconductor layer; the conductive layer includes a conductive structure, the conductive light-shielding structure includes a first main body portion and a first recessed portion, an average thickness of the first recessed portion in a direction perpendicular to the base substrate is smaller than an average thickness of the first main body portion in the direction perpendicular to the base substrate, the first contact hole penetrates the interlayer insulating layer and the buffer layer, the conductive structure is connected with the first recessed portion through the first contact hole, an area of a surface of the first recessed portion close to the conductive layer is larger than an area of an orthographic projection of the first recessed portion on the base substrate.

For example, in the manufacturing method of the display substrate provided by an embodiment of the present disclosure, forming a first contact hole in the interlayer insulating layer and the buffer layer includes: forming a first buffer portion and a second buffer portion in the buffer layer, a side of the first buffer portion away from the base substrate is arranged in contact with the conductive layer, and a side of the first buffer portion close to the base substrate is arranged in contact with the conductive light-shielding structure a side of the second buffer portion away from the base substrate is arranged in contact with the interlayer insulating layer, and a side of the second buffer portion close to the base substrate is arranged in contact with the conductive light-shielding structure.

For example, in the manufacturing method of the display substrate provided by an embodiment of the present disclosure, the first contact hole includes a side wall, the side wall at least includes: a first sub side wall, located in the interlayer insulating layer; and a second side wall, located in the buffer layer, an included angle between the first sub side wall and the base substrate constitutes a first slope angle, an included angle between the second sub side wall and the base substrate constitutes a second slope angle, the first slope angle is smaller than the second slope angle; and a contact portion of the second sub side wall and the first buffer portion is located between the first buffer portion and the second buffer portion.

For example, in the manufacturing method of the display substrate provided by an embodiment of the present disclosure, the side wall of the first contact hole further includes: a third sub side wall, located in the first buffer portion, an included angle between the third sub side wall and the base substrate constitutes a third slope angle, and the first slope angle, the second slope angle, and the third slope angle are different from each other.

For example, the manufacturing method of the display substrate provided by an embodiment of the present disclosure further includes: forming a planarization layer on a side of the conductive layer away from the interlayer insulating layer, wherein the planarization layer includes an anode hole; and forming an anode layer on a side of the planarization layer away from the conductive layer to form a plurality of sub-pixels on the base substrate, wherein each of the sub-pixels includes an anode, the anode includes a light emitting portion, a driving portion and an extension portion connecting the light emitting portion and the driving portion, and the driving portion is at least partially located within the anode hole, in at least one of the sub-pixels, an orthographic projection of the first contact hole on the base substrate at least partially overlaps with an orthographic projection of the driving portion on the base substrate, and the display substrate further includes: a power line, located in the conductive layer; and a sensing line, located in the conductive layer; wherein the power line and the sensing line are arranged in a first direction, both the power line and the sensing line extend in a second direction that intersects the first direction; the plurality of sub-pixels include a first sub-pixel pair and a second sub-pixel pair, the first sub-pixel pair includes two of the sub-pixels, which are located on two sides of the power line respectively, the second sub-pixel pair includes two of the sub-pixels, which are located on two sides of the sensing line respectively; and the first sub-pixel pair and the second sub-pixel pair are alternately arranged in the first direction, and in the two sub-pixels in the second sub-pixel pair, a first overlapping region is provided between an orthographic projection of the anode hole on the base substrate and an orthographic projection of the first recessed portion on the base substrate, and an area of the first overlapping region is smaller than an area of an orthographic projection of the first contact hole on the base substrate.

For example, in the manufacturing method of the display substrate provided by an embodiment of the present disclosure, the conductive layer further includes a first source electrode and a first drain electrode, and the conductive structure is the first drain electrode.

For example, in the manufacturing method of the display substrate provided by an embodiment of the present disclosure, the semiconductor layer includes a first active layer, the first active layer includes a first channel region and a first source electrode region and a first drain electrode region that are located on two sides of the first channel region, the manufacturing method further includes: at the same time of forming a first contact hole in the interlayer insulating layer and the buffer layer, forming a first via hole and a second via hole in the interlayer insulating layer, the first source electrode is connected with the first source electrode region through the first via hole, and the first drain electrode is connected with the first drain electrode region through the second via hole.

For example, in the manufacturing method of the display substrate provided by an embodiment of the present disclosure, a same etching process is used to simultaneously pattern the interlayer insulating layer and the buffer layer to form the first via hole and the first contact hole.

For example, in the manufacturing method of the display substrate provided by an embodiment of the present disclosure, a halftone mask process is used to pattern the interlayer insulating layer and the buffer layer to form the first via hole and the first contact hole.

For example, in the manufacturing method of the display substrate provided by an embodiment of the present disclosure, the using a halftone mask process to pattern the interlayer insulating layer and the buffer layer to form the first via hole and the first contact hole includes: forming a first photoresist on a side of the interlayer insulating layer away from the base substrate; exposing and developing the first photoresist by using a first halftone mask, to form a first photoresist pattern including a first photoresist completely removed portion, a first photoresist partially removed portion, and a first photoresist remaining portion; etching the interlayer insulating layer by using the first photoresist pattern as a mask, to remove the interlayer insulating layer corresponding to the first photoresist completely removed portion; ashing the first photoresist pattern, removing the first photoresist partially removed portion and thinning the first photoresist remaining portion to form a second photoresist pattern; and etching the buffer layer by using the second photoresist pattern as a mask, an orthographic projection of the first contact hole on the base substrate overlaps with an orthographic projection of the first photoresist completely removed portion on the base substrate, and an orthographic projection of the first via hole on the base substrate overlaps with an orthographic projection of the first photoresist partially removed portion on the base substrate.

For example, in the manufacturing method of the display substrate provided by an embodiment of the present disclosure, the conductive light-shielding structure further includes a first insulating portion, an orthographic projection of the first insulating portion on the base substrate at least partially overlaps with an orthographic projection of the first via hole on the base substrate, and an orthographic projection of the first insulating portion on the base substrate at least partially overlaps with an orthographic projection of the first source electrode region on the base substrate.

For example, in the manufacturing method of the display substrate provided by an embodiment of the present disclosure, the first insulating portion includes a first hollow portion, the first hollow portion is filled with a material of the buffer layer, patterning the conductive light-shielding material layer to form the conductive light-shielding structure includes: patterning a conductive light-shielding material layer by using a same patterning process to form the first main body portion, the first recessed portion, and the first hollow portion.

For example, in the manufacturing method of the display substrate provided by an embodiment of the present disclosure, patterning the conductive light-shielding material layer to form the conductive light-shielding structure includes: forming a photoresist on a side of the conductive light-shielding structure away from the base substrate; exposing and developing the photoresist by using a second halftone mask, to form a third photoresist pattern including a second photoresist completely removed portion, a second photoresist partially removed portion, and a second photoresist remaining portion; etching the conductive light-shielding material layer by using the third photoresist pattern as a mask, to remove the conductive light-shielding material layer corresponding to the completely removed portion of the second photoresist; ashing the third photoresist pattern, removing the second photoresist partially removed portion and thinning the second photoresist remaining portion to form a fourth photoresist pattern; and etching the conductive light-shielding material layer by using the fourth photoresist pattern as a mask, an orthographic projection of the first main body portion on the base substrate overlaps with an orthographic projection of the second photoresist remaining portion on the base substrate, and an orthographic projection of the first recessed portion on the base substrate overlaps with an orthographic projection of the second photoresist partially removed portion on the base substrate.

For example, in the manufacturing method of the display substrate provided by an embodiment of the present disclosure, the first recessed portion includes a first edge portion, and in a direction from an edge of the first recessed portion to a center of the first recessed portion, a thickness of the first edge portion in a direction perpendicular to the base substrate gradually decreases.

For example, in the manufacturing method of the display substrate provided by an embodiment of the present disclosure, the first recessed portion includes a first edge portion, and in the direction perpendicular to the base substrate, a fourth slope angle of a surface of the first edge portion close to the conductive layer is continuously changed.

For example, in the manufacturing method of the display substrate provided by an embodiment of the present disclosure, a surface of the first recessed portion close to the conductive structure is a continuous arc surface, or is a combined surface composed of at least one segment of a continuous arc surface and at least one segment of a plane.

For example, in the manufacturing method of the display substrate provided by an embodiment of the present disclosure, the first recessed portion includes a first edge portion, the fourth slope angle α of a surface of the first edge portion close to the conductive layer satisfies the following formula:

$0 < \alpha < k*H/Lmax$, wherein Lmax is a maximum aperture of an orthographic projection of the first recessed portion on the base substrate, H is an average thickness of the first main body portion, and k is a constant greater than 1 and less than or equal to 2.

For example, in the manufacturing method of the display substrate provided by an embodiment of the present disclosure, k=2, a range of the fourth slope angle is from 1 to π/18.

For example, in the manufacturing method of the display substrate provided by an embodiment of the present disclosure, a size range of an orthographic projection of the first recessed portion on the base substrate in a direction parallel to the base substrate is from 5 microns to 10 microns.

BRIEF DESCRIPTION OF THE DRAWINGS

In order to clearly illustrate the technical solution of the embodiments of the present disclosure, the drawings of the embodiments will be briefly described. It is apparent that the described drawings are only related to some embodiments of the present disclosure and thus are not limitative of the present disclosure.

In order to clearly illustrate the technical solution of the embodiments of the present disclosure, the drawings of the embodiments will be briefly described. It is apparent that the described drawings are only related to some embodiments of the present disclosure and thus are not limitative of the present disclosure.

DETAILED DESCRIPTION

In order to make objects, technical details and advantages of embodiments of the present disclosure clear, the technical solutions of the embodiments will be described in a clearly and fully understandable way in connection with the related drawings. It is apparent that the described embodiments are just a part but not all of the embodiments of the present disclosure. Based on the described embodiments herein, those skilled in the art can obtain, without any inventive work, other embodiment(s) which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and claims of the present disclosure, are not intended to indicate any sequence, amount or importance, but distinguish various components. The terms "comprises," "comprising," "includes," "including," etc., are intended to specify that the elements or the objects stated before these terms encompass the elements or the objects listed after these terms as well as equivalents thereof, but do not exclude other elements or objects.

Thin film transistors (TFT) in usual liquid crystal display panels use amorphous silicon material as their active layers, but such thin film transistors are difficult to meet driving requirements of self-luminous display devices that require high-mobility current driving. Therefore, active matrix organic light emitting diode display devices (AMOLEDs) generally need to adopt thin film transistors with high carrier mobility. Generally, small-size active matrix organic light emitting diode display devices can use thin film transistors that low-temperature polysilicon (LTPS) as their active layers, and large-size active matrix organic light emitting diode display devices can use thin film transistors that oxide as their active layers.

During a research, the inventor(s) of the present disclosure found: compared with a bottom-gate type thin film transistor, a top-gate type thin film transistor has the characteristics of short channel, its on-state current Ion can be effectively increased, so that a display effect of the top-gate type thin film transistor can be significantly improved and a power consumption of the top-gate type thin film transistor can be reduced. In addition, an overlapping area between a gate electrode and a source drain electrode of the top-gate type thin film transistor is small, thus a parasitic capacitance generated is also small; therefore, the top-gate thin film transistor is less likely to have defects such as short-circuiting of the gate electrode and the source drain electrode.

Figure 1:
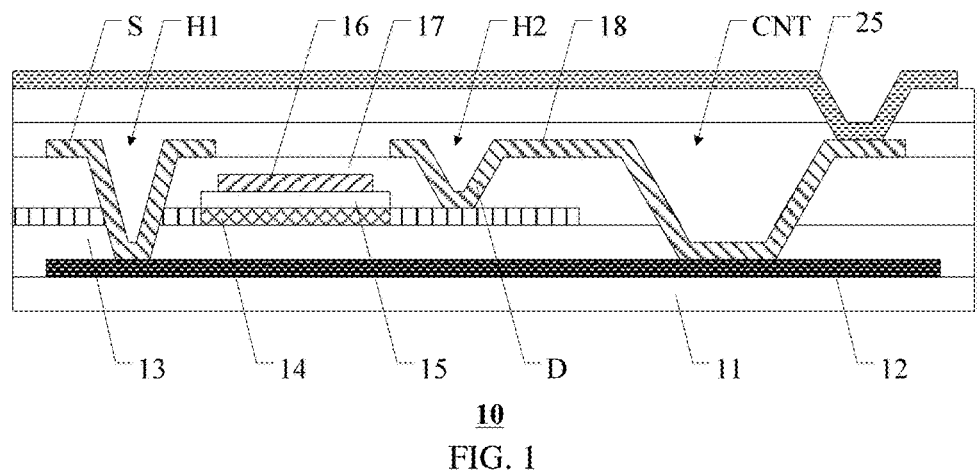
FIG. 1 is a cross-sectional schematic diagram of a display substrate using a top-gate type oxide thin film transistor.

FIG. 1 is a cross-sectional schematic diagram of a display substrate using a top-gate type oxide thin film transistor. As shown in FIG. 1, the display substrate 10 includes a base substrate 11, a light shielding layer 12, a buffer layer 13, an active layer 14, a gate insulating layer 15, a gate electrode 16, an interlayer insulating layer 17 and a conductive layer 18. A manufacturing process of the display substrate 10 may include: forming the light shielding layer 12 on the base substrate 11; forming the buffer layer 13 on a side of the light shielding layer 12 away from the base substrate 11; forming an oxide semiconductor layer on a side of the buffer layer 13 away from the base substrate 11; patterning the oxide semiconductor layer to form an active layer 14, and completing a conductive doping process in a non-channel region; forming the gate insulating layer 15 on a side of the active layer 14 away from the base substrate 11; forming the gate electrode 16 on a side of the gate insulating layer 15 away from the active layer 14; for example, the gate insulating layer 15 and the gate electrode 16 can be fabricated through a mask process by using a self-aligned process. The interlayer insulating layer 17 is formed on a side of the gate electrode 16 away from the base substrate 11; a display substrate formed with the interlayer insulating layer 17 is etched to simultaneously form a via hole H1 and a via hole H2 in the interlayer insulating layer 17; a contact hole CNT is formed in the interlayer insulating layer 17 and the buffer layer 13 at one time by simultaneous etching with H1 and H2; the buffer layer 13 and the interlayer insulating layer 17 may be etched in sequence in the manufacturing process of the array substrate, and a sleeve-type contact hole CNT is formed in the interlayer insulating layer 17 and the buffer layer 13; a conductive layer 18 is formed on a side of the interlayer insulating layer 17 away from the base substrate 11, the conductive layer 18 includes a source electrode S and a drain electrode D, the source electrode S is connected with an source electrode region of the active layer 14 through the first via hole H1, the drain electrode D is connected with a drain electrode region of the active layer 14 through the second via hole H2, and the drain electrode D is also connected to the light shielding layer 12 through the contact hole CNT.

Figure 2A:
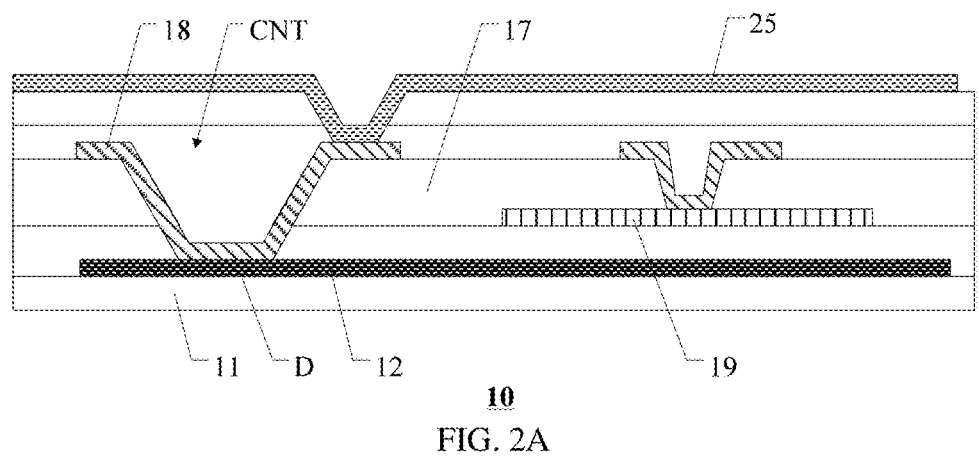
FIG. 2A is a cross-sectional schematic diagram of another display substrate.

As shown in FIG. 1, since the drain electrode D is connected with the drain electrode region of the active layer 14 through the second via hole H2, the drain electrode D is also connected with the light-shielding layer 12 through the contact hole CNT, and the light shielding layer 12 and the drain electrode D may have a same potential; in addition, the drain electrode D is also electrically connected with the anode 25. FIG. 2A is a cross-sectional schematic diagram of another display substrate. As shown in FIG. 2A, an anode 25, the drain electrode D, and the light shielding layer 12 have a same potential, thus the anode 25, the drain electrode D, and the light shielding layer 12 can form a sandwich capacitor with an electrode in the conductive layer 18 (the electrode is not necessarily the drain electrode D mentioned above, but can be a drain electrode of other thin film transistor in a pixel driving circuit) and a conductive block 19 of the active layer.

Figure 2B:
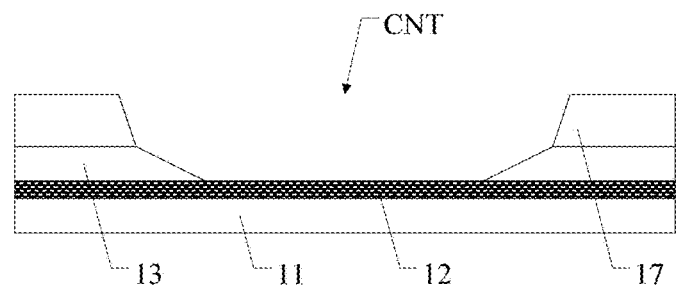
FIG. 2B is a cross-sectional schematic diagram of a contact hole in a display substrate.
Figure 3:
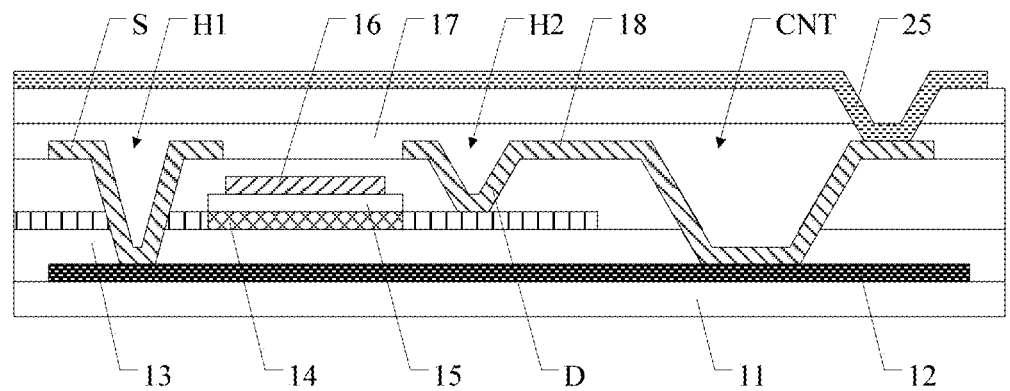
FIG. 3 is a cross-sectional schematic diagram of a via hole in a display substrate.

In the above manufacturing process, some via holes, for example, the via hole H1 and the via hole H2, only need to etch the interlayer insulating layer, while other via holes, for example, the contact hole CNT, need to etch at least two insulating layers, for example, the interlayer insulating layer and the buffer layer that are mentioned above, these two types of holes need to be etched at different depths, and the materials to be etched are also different, thus an actual process of forming these two types of holes at a same time is very difficult to control. FIG. 2B is a cross-sectional schematic diagram of a contact hole in a display substrate; As shown in FIG. 2B, the contact hole has different slope angles in different layers, as a result, a contact area between the drain electrode and the light shielding layer becomes smaller. In the case shown in FIG. 2B, the drain electrode and the light-shielding layer are prone to phenomena, such as large contact resistance and poor contact, so that an electrical connection effect is greatly affected. On the other hand, FIG. 3 is a cross-sectional schematic diagram of a via hole in a display substrate, as shown in FIG. 3, in some embodiments, the active layer itself is designed to be thinner, some parts of the active layer may be easily missing or etched away, so that the via hole directly penetrates the active layer and the buffer layer and is in contact with the light shielding layer. At this time, the source electrode and the drain electrode of the thin film transistor are electrically connected through the light shielding layer, so that a bright spot of the display substrate is defective in a case that the source electrode is supplies a voltage.

In this regard, embodiments of the present disclosure provide a display substrate, its manufacturing method, and a display device. The display substrate includes a base substrate and a plurality of sub-pixels located on the base substrate, each of the plurality of sub-pixel includes: a conductive light-shielding structure, located on the base substrate; a buffer layer, located on a side of the conductive light-shielding structure away from the base substrate; a semiconductor layer, located on a side of the buffer layer away from the conductive light-shielding structure; an interlayer insulating layer, located on a side of the semiconductor layer away from the buffer layer; and a conductive layer, located on a side of the interlayer insulating layer away from the semiconductor layer, and the conductive layer includes a conductive structure, the conductive light-shielding structure includes a first main body portion and a first recessed portion, an average thickness of the first recessed portion in a direction perpendicular to the base substrate is smaller than an average thickness of the first main body portion in the direction perpendicular to the base substrate, the display substrate further includes a first contact hole, the first contact hole penetrates the interlayer insulating layer and the buffer layer, the conductive structure is electrically connected with the first recessed portion through the first contact hole, an area of a surface of the first recessed portion close to the conductive layer is larger than an area of an orthographic projection of the first recessed portion on the base substrate. In this way, the display substrate is provided with the first recessed portion in the conductive light-shielding structure, thus a contact area between the first drain electrode and the conductive light-shielding structure is increased, and the contact is more sufficient, so that a contact resistance is reduced, and an electrical connection effect between a first drain electrode and the conductive light-shielding structure is improved.

In the following, the display substrate, its manufacturing method, and the display device provided by the embodiments of the present disclosure will be described in detail with reference to the accompanying drawings.

Figure 4:
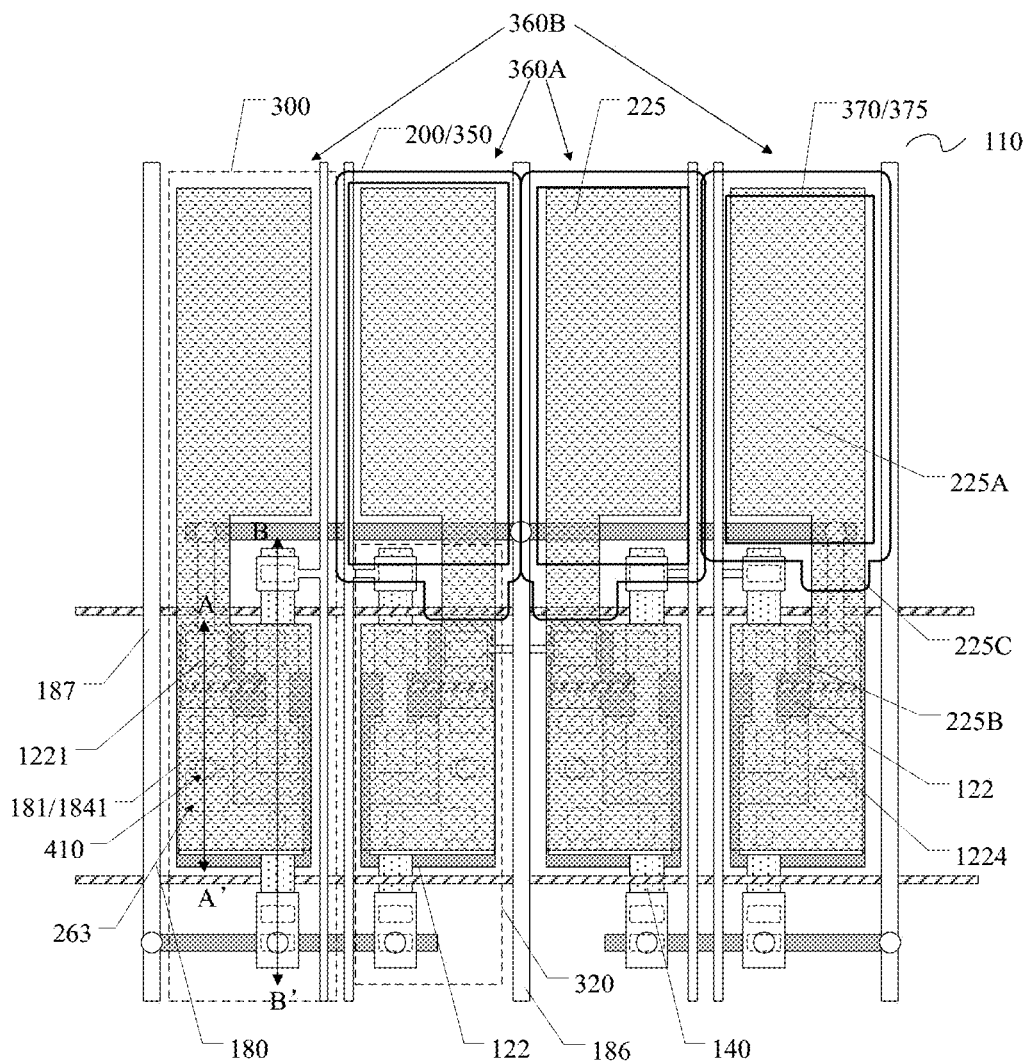
FIG. 4 is a planar schematic diagram of a display substrate provided by an embodiment of the present disclosure.
Figure 5A:
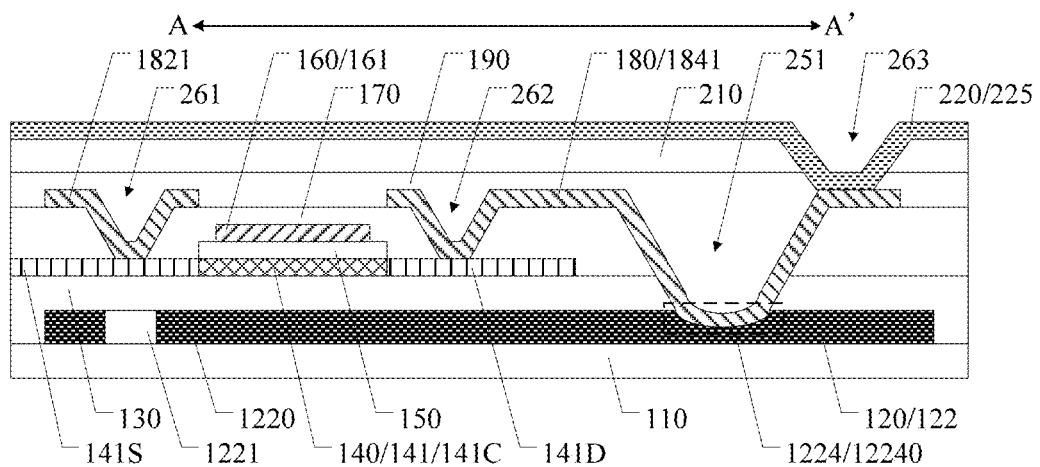
FIG. 5A is a cross-sectional schematic diagram of a display substrate along a line AA' in FIG. 4 provided by an embodiment of the present disclosure.
Figure 5B:
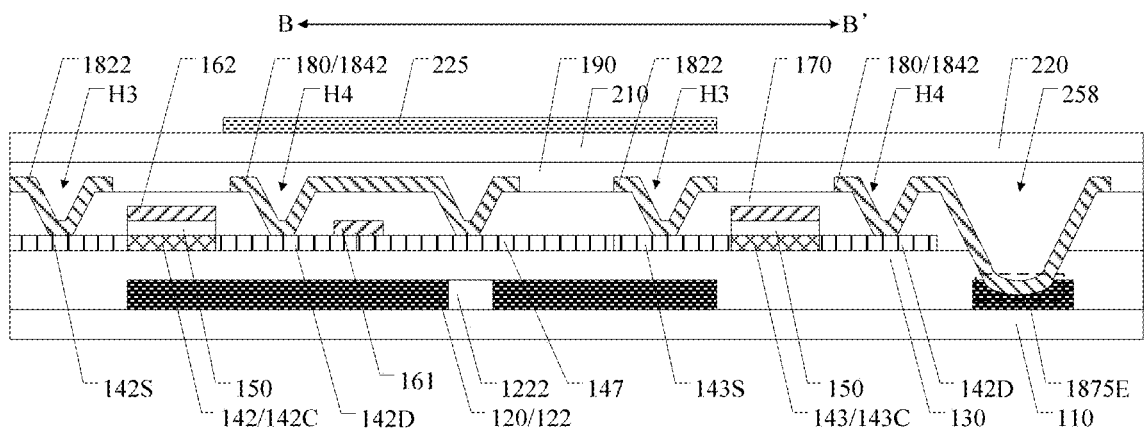
FIG. 5B is a cross-sectional schematic diagram of a display substrate along a line BB' in FIG. 4 provided by an embodiment of the present disclosure.
Figure 5C:
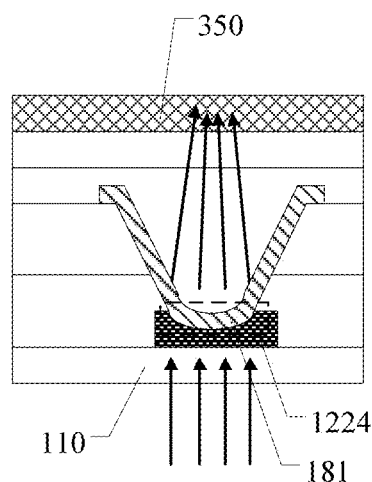
FIG. 5C is a schematic diagram of a light convergence effect of a recessed portion in a display substrate provided by an embodiment of the present disclosure.
Figure 5D:
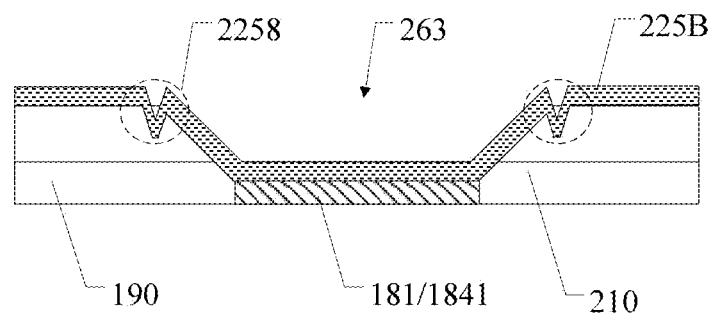
FIG. 5D is a schematic diagram of an anode hole in a display substrate provided by an embodiment of the present disclosure.

At least one embodiment of the present disclosure provides a display substrate. FIG. 4 is a planar schematic diagram of a display substrate provided by an embodiment of the present disclosure; FIG. 5A is a cross-sectional schematic diagram of a display substrate along a line AA' in FIG. 4 provided by an embodiment of the present disclosure; FIG. 5B is a cross-sectional schematic diagram of a display substrate along a line BB' in FIG. 4 provided by an embodiment of the present disclosure; FIG. 5C is a schematic diagram of a light convergence effect of a recessed portion in a display substrate provided by an embodiment of the present disclosure; FIG. 5D is a schematic diagram of an anode hole in a display substrate provided by an embodiment of the present disclosure. It should be noted that, FIG. 4 is a top view diagram from an anode layer of the display substrate to a base substrate of the display substrate.

As shown in FIGS. 4 and 5A, the display substrate 100 includes a base substrate 110 and a plurality of sub-pixels 300 located on the base substrate 110; each of the plurality of the sub-pixel 300 includes a conductive light-shielding structure 122, a buffer layer 130, a semiconductor layer 140, an interlayer insulating layer 170, and a conductive layer 180. The conductive light-shielding structure 122 is located on the base substrate 110; the buffer layer 130 is located on a side of the conductive light-shielding structure 122 away from the base substrate 110; the semiconductor layer 140 is located on a side of the buffer layer 130 away from the conductive light-shielding structure 122; the interlayer insulating layer 170 is located on a side of the semiconductor layer 140 away from the buffer layer 130; the conductive layer 180 is located on a side of the interlayer insulating layer 170 away from the semiconductor layer 140, the conductive layer 180 includes a conductive structure 181, for example, the conductive structure 181 may be a first drain electrode 1841. For example, the buffer layer 130 has an effect of insulating the conductive light-shielding structure 122 from the semiconductor layer 140; on the other hand, the buffer layer 130 can also cover defects or burrs on the base substrate 110, so that a quality of the semiconductor layer 120 formed on the buffer layer 130 is improved.

As shown in FIGS. 4 and 5A, the conductive light-shielding structure 122 includes a first main body portion 1220 and a first recessed portion 1224, an average thickness of the first recessed portion 1224 in the direction perpendicular to the base substrate 110 is smaller than an average thickness of the first main body portion 1220 in the direction perpendicular to the base substrate 110. The display substrate 100 further includes a first contact hole 251, the first contact hole 251 penetrates the interlayer insulating layer 170 and the buffer layer 130, the conductive structure 181 is connected with the first recessed portion 1224 through the first contact hole 251, and an area of a surface of the first recessed portion 1224 close to the conductive layer 180 is larger than an area of an orthographic projection of the first recessed portion 1224 on the base substrate 110.

In the display substrate provided by the embodiment of the present disclosure, the conductive light-shielding structure includes the first main body portion and the first recessed portion, and the conductive structure is connected with the first recessed portion through the first contact hole. Since the first recessed portion is recessed into the conductive light-shielding structure, the area of the surface of the first recessed portion close to the first drain is larger than the area of the orthographic projection of the first recessed portion on the base substrate. Thus, the display substrate can increase a contact area between the first drain electrode and the conductive light-shielding structure, and the contact between the first drain electrode and the conductive light-shielding structure is more sufficient, so that the contact resistance is reduced, an electrical connection effect between the first drain electrode and the conductive light-shielding structure is improved, and a charge and discharge efficiency of a capacitor formed by the conductive structure can be effectively improved.

In some examples, as shown in FIGS. 4 and 5A, each of the sub-pixels 300 further includes: a planarization layer 210, located on a side of the conductive layer 180 away from the semiconductor layer 140, and the planarization layer 210 includes an anode hole 263; and an anode 225, located on a side of the planarization layer 210 away from the semiconductor layer 140, and the anode 225 includes a light emitting portion 225A, a driving portion 225B, and an extension portion 225C connecting the light emitting portion 225A and the driving portion 225B, and at least a portion of the driving portion 225B is located within the anode hole 263. In each of the sub-pixels 300, an orthographic projection of the first contact hole 251 on the base substrate 110 at least partially overlaps with an orthographic projection of the driving portion 225B on the base substrate 110. Therefore, by arranging the driving portion 225B of the anode 225 above the first contact hole 251, the driving portion 225B is located above the first recessed portion 1224, so that in a case that a light shielding performance of the first recessed portion is reduced due to thinning of the first recessed portion 1224, the driving portion 225B of the anode 225 can block light passing through the first recessed portion 1224. In addition, an area of the anode 225 can be increased by arranging the driving portion 225B of the anode 225, so that a capacitance value of a sandwich capacitor formed by the anode is increased.

In some examples, as shown in FIGS. 4 and 5A, the display substrate 100 further includes: a power line 186, located on the conductive layer 180; and a sensing line 187, located in the conductive layer 180; and the plurality of sub-pixels 300 includes a first sub-pixel pair 360A and a second sub-pixel pair 360B, the first sub-pixel pair 360A includes two sub-pixels 300, which are located on two sides of the power line 186 respectively, and the second sub-pixel pair 360B includes two sub-pixels 300, which are located on two sides of the sensing line 187 respectively; the first sub-pixel pair 360A and the second sub-pixel pair 360B are alternately arranged, in the two sub-pixels 300 in the second sub-pixel pair 360B, the anode hole 263 and an orthographic projection of the first recessed portion 1224 on the base substrate 110 have a first overlapping region 410, and an area of the first overlapping region 410 is smaller than an area of an orthographic projection of the first contact hole 251 on the base substrate 110. The power line 186 and the sensing line 187 are arranged along the first direction, and both the power line 186 and the sensing line 187 extend in a second direction that intersects the first direction. In this way, in the two sub-pixels 300 in the second sub-pixel pair 360B, a first overlapping region 410 is provided between the anode hole 263 and the first recessed portion 1224, thus in a case that the light shielding performance of the first recessed portion is reduced due to thinning of the first recessed portion 1224, the anode 225 at a position of the anode hole 263 has a curved interface, so that the light can be focused, and thus light passing through the first recessed portion 1224 is prevented from affecting a normal display.

In some examples, as shown in FIG. 5D, the anode 225 further includes a concave structure 2258 at an edge position of the anode hole 263, a concave direction of the recessed structure 2258 faces the conductive light-shielding structure 122. Therefore, in a case that the light shielding performance of the first recessed portion is reduced due to the thinning of the first recessed portion 1224, the concave structure is provided with at least two inclined surfaces, so that light passing through the first recessed portion can be reflected. In addition, since the concave structure itself is a microstructure, the concave structure can also scatter the light passing through the first recessed portion, which further prevents the light passing through the first recessed portion 1224 from affecting the normal display. It should be noted that, the above-mentioned edge position of the anode hole refers to a boundary between the anode hole and a surface of the planarization layer away from the semiconductor layer.

For example, the above-mentioned conductive structure 181 may be a first drain electrode 1841 in the conductive layer 180, and the first drain electrode 1841 may be a drain electrode of a first thin film transistor in a pixel driving circuit of one the sub-pixels 300.

In some examples, a material of the conductive light-shielding structure 122 may be at least one selected from the group consisting of molybdenum and titanium; and a material of the conductive layer 180 may be at least one selected from the group consisting of copper, molybdenum, and titanium. For example, the conductive layer 180 can be a multilayer structure with a copper layer on top and a molybdenum-titanium mixture at the bottom, at this time, the molybdenum-titanium mixture at the lower layer can prevent a diffusion of the copper material in the upper layer, and the influence on the electrical connection properties of the signal line can be avoided. Of course, the embodiments of the present disclosure include but are not limited to this, and the conductive light-shielding structure and the first drain electrode can also be made of other materials.

In some examples, a thickness of the conductive light-shielding structure in the direction perpendicular to the base substrate ranges from 90 nanometers to 120 nanometers, and a thickness of the conductive layer in the direction perpendicular to the base substrate ranges from 200 nanometers to 600 nanometers.

In some examples, a material of the semiconductor layer may be an oxide semiconductor, such as indium gallium zinc oxide (IGZO). In this way, the thin film transistor in the pixel driving circuit of the array substrate has a high carrier mobility.

In some examples, the interlayer insulating layer can be made of one material or two different materials, which are deposited by processes at different temperatures. For example, the material of the interlayer insulating layer may be at least one selected from the group consisting of silicon oxide, silicon nitride, and silicon oxynitride.

In some examples, the material of the buffer layer may also be at least one selected from the group consisting of silicon oxide, silicon nitride, and silicon oxynitride. It should be noted that the buffer layer and the interlayer insulating layer usually use different materials, even if a composition of elements in the buffer layer and a composition of elements in the interlayer insulating layer are the same, ratios of these elements are also different.

For example, a total thickness of the interlayer insulating layer ranges from 350 nanometers to 600 nanometers. For example, the total thickness of the interlayer insulating layer is 400 nanometers.

In some examples, as shown in FIGS. 4 and 5A, the first recessed portion 1224 includes a first edge portion 12240, in a direction from an edge of the first recessed portion 1224 to a center of the first recessed portion 1224, a thickness of the first edge portion 12240 in the direction perpendicular to the base substrate 110 continuously and gradually decreases. Since the average thickness of the first recessed portion 1224 in the direction perpendicular to the base substrate is smaller than the average thickness of the first main body portion in the direction perpendicular to the base substrate, the light shielding performance of the first recessed portion may be affected. However, in the display substrate provided in the example, since a thickness of the first edge portion or an entire of the first recessed portion in the direction perpendicular to the base substrate continuously and gradually decreases, a surface of the conductive structure at a position of the first recessed portion away from the base substrate is a convex surface, the convex surface has a function of converging light; in a case that light penetrates the first recessed portion, the convex surface can converge light, so that part of ambient light inside the substrate is prevented from uncontrolled reflection, and the phenomenon that the ambient light affecting a normal display of the display substrate is avoided. It should be noted that "the center of the first recessed portion" mentioned above is a center of a planar shape of an orthographic projection of the first recessed portion on the base substrate; in a case that the orthographic projection of the first recessed portion on the base substrate is in a regular shape, the center may be a geometric center of the planar shape, in a case that the orthographic projection of the first recessed portion on the base substrate is in an irregular shape, the center may also be a center of a largest straight line between two points on the planar shape; in addition, "the edge of the first recessed portion" mentioned above may be an edge of the orthographic projection of the first recessed portion on the base substrate.

For example, as shown in FIG. 5C, the surface of the conductive structure 181 at the position of the first recessed portion 1224 away from the base substrate 110 is a convex surface. The convex surface has a function of converging light; in a case that light penetrates the first recessed portion, the convex surface can converge light, so that part of the ambient light inside the substrate is prevented from uncontrolled reflection, and the phenomenon that the ambient light affecting the normal display of the display substrate is avoided.

In some examples, as shown in FIGS. 4 and 5A, in the direction perpendicular to the base substrate 110, at least a part of the first recessed portion 1224 close to the edge is continuously changed, for example, a fourth slope angle of a surface of the first edge portion 12240 close to the conductive layer 180 is continuously changed. In this way, even if light can penetrate the first recessed portion, the first recessed portion can make a convex surface of the conductive structure located at the position of the first recessed portion away from the base substrate to play a role of light convergence, so that the light penetrating the entire display substrate to affect a display effect of the light emitting region is prevented.

In some examples, as shown in FIGS. 4 and 5A, the first recessed portion 1224 is close to the conductive structure, for example, a surface of a first drain electrode 1841, is a continuous arc surface, or a combined surface composed of at least one segment of a continuous arc surface and at least one segment of a plane. The continuous arc surface, or the combined surface composed of at least one segment of the continuous arc surface and at least one segment of the plane can play a role of converging light, in this way, even if light can penetrate the first recessed portion, the first recessed portion can also prevent light from penetrating the entire display substrate and being observed by the user. Of course, the embodiments of the present disclosure include but are not limited to this, the surface of the first recessed portion close to the first drain electrode may also be a bent surface.

In some examples, as shown in FIGS. 4 and 5A, an orthographic projection of the first contact hole 251 on the base substrate 110 at least partially overlaps with an orthographic projection of the first recessed portion 1224 on the base substrate 110. In this way, the conductive structure 181 in the conductive layer 180, for example, the first drain electrode 1841, can be connected with the first recessed portion 1224 through the first contact hole 251.

In some examples, as shown in FIG. 4, a shape of a projection of the whole first recessed portion 1224 on the base substrate 110 may be isotropic, such as a circle; and can also be anisotropic, such as a square, a rectangle, an ellipse, and a racetrack, which are not limited in the embodiments of the present disclosure.

Figure 6A:
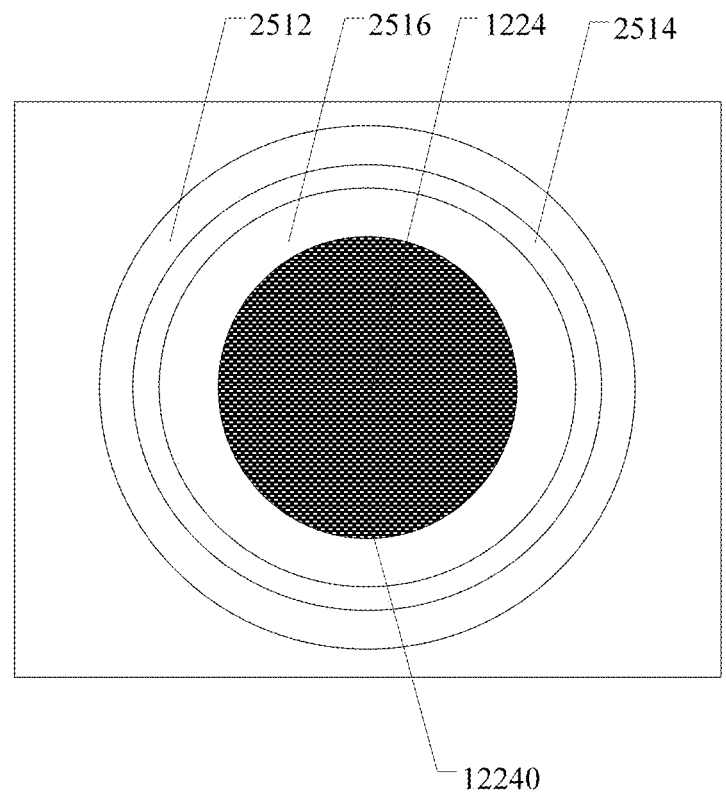
FIG. 6A is a cross-sectional schematic diagram of a first recessed portion in a display substrate provided by an embodiment of the present disclosure.
Figure 6B:
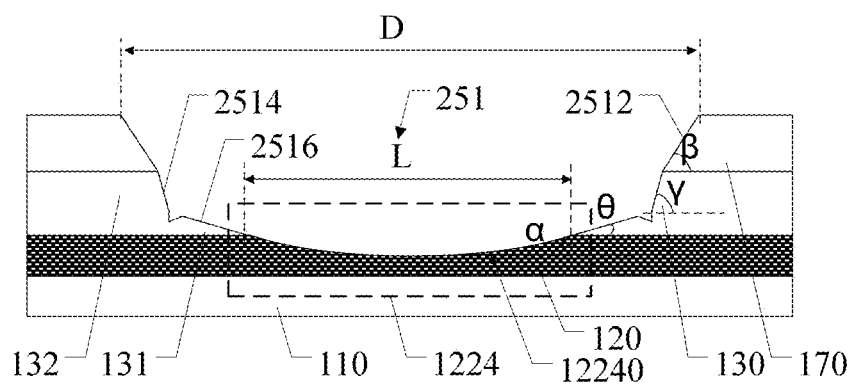
FIG. 6B is a cross-sectional schematic diagram of a first recessed portion in a display substrate provided by an embodiment of the present disclosure.

FIG. 6A is a cross-sectional schematic diagram of a first recessed portion in a display substrate provided by an embodiment of the present disclosure; and FIG. 6B is a cross-sectional schematic diagram of a first recessed portion in a display substrate provided by an embodiment of the present disclosure. As shown in FIGS. 6A and 6B, the first recessed portion 1224 includes a first edge portion 1224, and a fourth slope angle α of a surface of the first edge portion 12240 close to the conductive layer 180 satisfies the following formula:

$$0 < \alpha < k \cdot H/L_{max}$$

wherein Lmax is a maximum aperture of an orthographic projection of the first recessed portion on the base substrate, H is an average thickness of the first main body portion, and k is a constant greater than 1 and less than or equal to 2.

In some examples, a slope angle α of each position of a surface of the first recessed portion 1224 close to the first drain electrode 1841 ranges from 1 degree to π/18. For example, a slope angle α of each position of a surface of the first recessed portion 1224 close to the first drain electrode 1841 ranges from 1 degree to π/36.

In some examples, as shown in FIGS. 6A and 6B, a size range of an orthographic projection of the first recessed portion 1224 on the base substrate 110 in a direction parallel to the base substrate 110 is from 5 microns to 10 microns. In other words, a size range of a width of the first recessed portion 1224 is from 5 microns to 10 microns.

For example, as shown in FIGS. 6A and 6B, a size of an orthographic projection of the first recessed portion 1224 on the base substrate 110 in a direction parallel to the base substrate 110 is 7.8 micrometers.

In some examples, as shown in FIGS. 6A and 6B, the buffer layer 130 includes: a first buffer portion 131, in which a side of the first buffer portion 131 away from the base substrate 110 is arranged in contact with the conductive layer 180, and a side of the first buffer portion 131 close to the base substrate 110 is arranged in contact with the conductive light-shielding structure 122; and a second buffer portion 132, in which a side of the second buffer portion 132 away from the base substrate 110 is arranged in contact with an interlayer insulating layer 170, and a side of the second buffer portion 132 close to the base substrate 110 is arranged in contact with the conductive light-shielding structure 122. In this way, in a case that the conductive structure 181 mentioned above is deposited in the first contact hole 251, the first buffer portion 131 can play a role of supporting a portion of the conductive structure, the conductive structure is prevented from disconnecting caused by too large drop or too large slope angle. Therefore, the display substrate has a higher yield.

For example, the first buffer portion 131 is located in the first contact hole 251, and is arranged in contact with the conductive light-shielding structure 122; and the second buffer portion 132 is located on a side of the first buffer portion 131 away from a center of the first recessed portion 1224.

In some examples, as shown in FIGS. 6A and 6B, a side wall of the first contact hole 251 at least includes: a first sub side wall 2512, located in the interlayer insulating layer 170; and a second sub side wall 2514, located in the buffer layer 130, an included angle between the first sub side wall 2512 and the base substrate 110 constitutes a first slope angle β, an included angle between the second sub side wall 2514 and the base substrate 110 constitutes a second slope angle γ, and the first slope angle β is smaller than the second slope angle γ; a contact portion between the second sub side wall 2514 and the first buffer portion 131 is located between the first buffer portion 131 and the second buffer portion 132. In this display substrate, since a material of the buffer layer is different from a material of the interlayer insulating layer, etching efficiencies of etchants on the buffer layer and the interlayer insulating layer are also different, so that the formed slope angle of the first sub side wall is different from the formed slope angle of the second sub side wall. It should be noted that the above-mentioned sub side walls may not actually be smooth planes due to process conditions and other reasons, thus the above-mentioned slope angles formed by each of the sub side walls and the base substrate may be angles between connection lines of several points arranged at equal intervals on a cross section of each of the sub side walls and the base substrate.

In some examples, as shown in FIGS. 6A and 6B, the side wall of the first contact hole 251 further includes: a third sub side wall 2516, located in the first buffer portion 131, an angle between the third sub side wall 2516 and the base substrate 110 constitutes a third slope angle θ, and the first slope angle β, the second slope angle γ, and the third slope angle θ are different from each other.

For example, the second slope angle γ is greater than the third slope angle θ, and the first slope angle β is greater than the third slope angle θ.

In some examples, as shown in FIGS. 6A and 6B, along a radial direction of the first contact hole 251, a ratio of a length of the first buffer portion 131 to an average thickness of the first buffer portion 131 is greater than a ratio of a projected length of the first sub side wall 2512 on the base substrate 110 to an average thickness of the interlayer insulating layer 170.

In some examples, as shown in FIGS. 6A and 6B, along the radial direction of the first contact hole 251, the ratio of the projected length of the first sub side wall 2512 on the base substrate 110 to the average thickness of the interlayer insulating layer 170 is greater than a ratio of a projected length of the second sub side wall 2514 on the base substrate 110 to an average thickness of the buffer layer 130.

For example, as shown in FIGS. 6A and 6B, the side wall of the first contact hole 251 includes a first sub side wall 2512 located in the interlayer insulating layer 170, a second sub side wall 2514 located in the first buffer portion 131, and a third sub side wall 2516 located in the second buffer portion 132; the first sub side wall 2512 is connected with the second sub side wall 2514, and the first slope angle β of the first sub side wall 2512, the second slope angle γ of the second sub side wall 2514, and the third slope angle θ of the third sub side wall 2516 are different from each other. In this display substrate, since the material of the buffer layer is different from the material of the interlayer insulating layer, the etching efficiencies of the etchants on the buffer layer and the interlayer insulating layer are also different, so that the formed slope angle of the first sub side wall is different from the slope angle of the second sub side wall.

For example, the above-mentioned buffer layer can be deposited by processes with different temperatures, so that an inside of the buffer layer has different densities, and the above-mentioned first buffer portion and the second buffer portion can be formed. Of course, the embodiments of the present disclosure include but are not limited to this, and the first buffer portion and the second buffer portion mentioned above can be manufactured by other suitable methods.

In some examples, as shown in FIGS. 6A and 6B, the first slope angle β of the first sub side wall 2512 is smaller than the second slope angle γ of the second sub side wall 2514, the second slope angle γ of the second sub side wall 2514 is greater than the third slope angle θ of the third sub side wall 2516, and the first slope angle β of the first sub side wall 2512 is greater than the third slope angle θ of the third sub side wall 2516. That is, the second slope angle γ is greater than the first slope angle β, and the first slope angle β is greater than the third slope angle θ.

For example, the fourth slope angle α is smaller than the third slope angle θ of the third sub side wall.

For example, as shown in FIGS. 6A and 6B, a range of the first slope angle β of the first sub side wall 2512 is from 45 degrees to 75 degrees; a range of the second slope angle γ of the second sub side wall 2514 is from 75 degrees to 90 degrees; and a range of the third slope angle θ of the third sub side wall 2516 is from 3 degrees to 15 degrees.

For example, as shown in FIGS. 6A and 6B, a dimension range of an orthographic projection of the third sub side wall 2516 on the base substrate 110 in a direction parallel to the base substrate 110 is from 0.2 microns to 1 micron.

For example, a dimension of the orthographic projection of the third sub side wall 2516 on the base substrate 110 in the direction parallel to the base substrate 110 is 0.5 microns.

In some examples, as shown in FIGS. 6A and 6B, a dimension L of an orthographic projection of the first recessed portion 1224 on the base substrate 110 in the direction parallel to the base substrate 110 satisfies the following formula:

$$2(A\cot\beta + B\cot\gamma + C\cot\theta) < L < D,$$

in which A is a maximum thickness of the first buffer portion, B is a maximum thickness of the second buffer portion, C is a maximum thickness of the interlayer insulation layer, β is the first slope angle, γ is the second slope angle, θ is the third slope angle θ, D is a largest dimension of the orthographic projection of the first contact hole on the base substrate in the direction parallel to the base substrate.

For example, the dimension L of the orthographic projection of the first recessed portion 1224 on the base substrate 110 in the direction parallel to the base substrate 110 satisfies the formula: $8(A\cot\beta + B\cot\gamma + C\cot\theta) < L < D$.

In some examples, as shown in FIGS. 6A and 6B, the first recessed portion 1224 includes a first edge portion 12240, the fourth slope angle α of the surface of the first edge portion 12240 close to the conductive layer 180 is smaller than the third slope angle of the third sub side wall 2516, and the formula $(A\cot\beta + B\cot\gamma + C\cot\theta + L/2 \tan\alpha) \le D/2$ is satisfied, A is the maximum thickness of the first buffer portion, B is the maximum thickness of the second buffer portion, C is the maximum thickness of the interlayer insulation layer, β is the first slope angle, γ is the second slope angle, θ is the third slope angle, D is a largest dimension of an orthographic projection of the first contact hole on the base substrate in the direction parallel to the base substrate.

In some examples, as shown in FIGS. 4 and 5A, the display substrate 100 further includes a gate insulating layer 150 and a gate electrode layer 160; the gate insulating layer 150 is located on a side of the semiconductor layer 140 away from the base substrate 110; the gate electrode layer 160 is located between the gate insulating layer 150 and the interlayer insulating layer 170. In this way, a pixel driving circuit of the display substrate 100 uses top-gate thin film transistors, so that the pixel driving circuit has a characteristic of a short channel, and its on-state current Ion can be effectively increased, thus the display effect can be significantly improved and a power consumption can be reduced.

In some examples, as shown in FIGS. 4 and 5A, the display substrate 100 further includes a passivation layer 190, a color filter layer 200, a planarization layer 210 and an anode layer 220; the passivation layer 190 is located on a side of the conductive layer 180 away from the base substrate 110; the color filter layer 200 is located on a side of the passivation layer 190 away from the conductive layer 180, and the color filter layer 200 includes at least three color filters 350 having different colors; the planarization layer 210 is located on a side of the color filter layer 200 away from the passivation layer 190; and the anode layer 220 is located on a side of the planarization layer 210 away from the color filter layer 200.

Figure 7A:
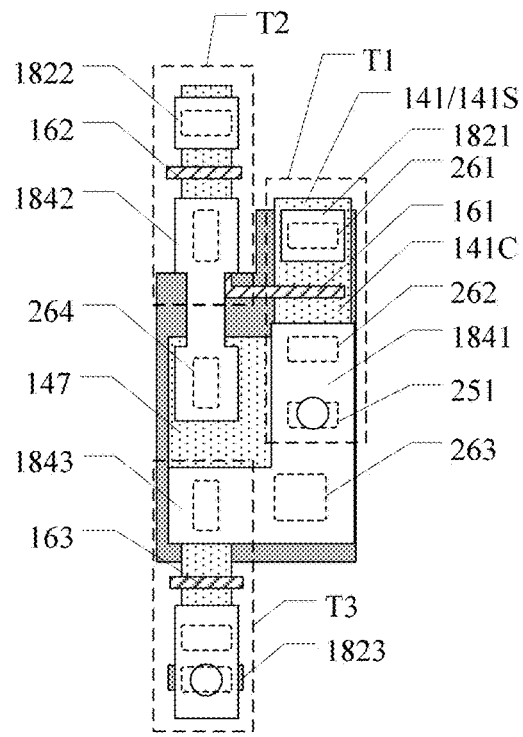
FIG. 7A is a planar schematic diagram of a pixel driving circuit in a display substrate provided by an embodiment of the present disclosure.
Figure 7B:
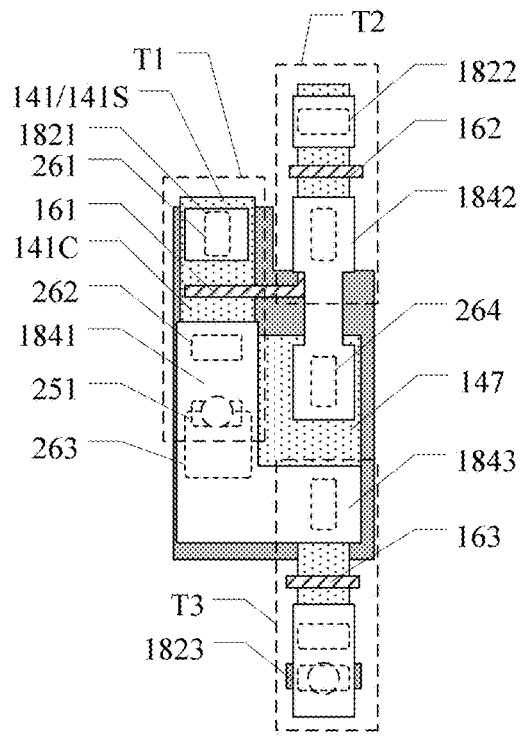
FIG. 7B is a planar schematic diagram of a pixel driving circuit in a display substrate provided by an embodiment of the present disclosure.

FIG. 7A is a planar schematic diagram of a pixel driving circuit in a display substrate provided by an embodiment of the present disclosure; and FIG. 7B is a planar schematic diagram of a pixel driving circuit in a display substrate provided by an embodiment of the present disclosure. As shown in FIGS. 4, 5A, 5B, 7A and 7B, each of the sub-pixels 300 includes the pixel driving circuit 320, the pixel driving circuit 320 includes a first thin film transistor T1, the first thin film transistor T1 further includes a first active layer 141, a first gate electrode 161, a first source electrode 1821, and the above-mentioned first drain electrode 1841; the first active layer 141 is located in the semiconductor layer 140, and includes a first channel region 141C and a first source electrode region 141S and a first drain electrode region 141D that are located on two sides of the first channel region 141C respectively; the first gate electrode 161 is located in the gate electrode layer 160, an orthographic projection of the first gate electrode 161 on the base substrate 110 at least partially overlaps with an orthographic projection of the first channel region 141C on the base substrate 110, both the first source electrode 1821 and the first drain electrode 1841 are located in the conductive layer 180.

In some examples, a material of the gate electrode layer 160 may be at least one selected from the group consisting of copper, molybdenum, and titanium. For example, the gate electrode layer 160 can also be a multilayer structure with a copper layer on top and a molybdenum-titanium mixture at the bottom, at this time, the molybdenum-titanium mixture at the lower layer can prevent a diffusion of the copper material in the upper layer, and the influence on the electrical connection properties of the signal line can be avoided. Of course, the embodiments of the present disclosure include but are not limited to this, and the first gate electrode and the second gate electrode can also be made of other materials.

For example, the gate electrode layer is a single-layer structure or a multi-layer structure, and the embodiments of the present disclosure are not limited herein.

In some examples, as shown in FIGS. 5A, 7A, and 7B, the display substrate 100 further includes a first via hole 261 and a second via hole 262; the first via hole 261 and the second via hole 262 are located in the interlayer insulating layer 170, the first source electrode 1821 is connected with the first source electrode region 141S through the first via hole 261, the first drain electrode 1841 is connected with the first drain electrode region 141D through the second via hole 262. In this way, the first gate electrode, the first active layer, the first source electrode, and the first drain electrode that are mentioned above can constitute the above-mentioned first thin film transistor. The first thin film transistor may be a top-gate type thin film transistor, which has a characteristic of a short channel, and its on-state current Ion can be effectively increased, thus the display effect can be significantly improved and the power consumption can be reduced.

In some examples, as shown in FIG. 5B, FIG. 7A, and FIG. 7B, a second thin film transistor T2 further includes a second active layer 142, a second gate electrode 162, a second source electrode 1822, and a second drain electrode 1842; the second active layer 142 is located in the semiconductor layer 140, and includes a second channel region 142C, and a second source electrode region 142S and a second drain electrode region 142D that are located on two sides of the second channel region 142C; the second gate electrode 162 is located in the gate electrode layer 160, an orthographic projection of the second gate electrode 162 on the base substrate 110 at least partially overlaps with an orthographic projection of the second channel region 142C on the base substrate 110, and the second source electrode 1822 and the second drain electrode 1842 are both located in the conductive layer 180. The second source electrode 1822 is connected with the second source electrode region 142S through the via hole H3 in the interlayer insulating layer 170, and the second drain electrode 1842 is connected with the second drain electrode region 142D through the via hole H4 in the interlayer insulating layer 170. Thus, the second gate electrode, the second active layer, the second source electrode, and the second drain electrode that are mentioned above can constitute the above-mentioned second thin film transistor. The second thin film transistor may be a top-gate type thin film transistor, which has a characteristic of a short channel, and its on-state current Ion can be effectively increased, thus the display effect can be significantly improved and the power consumption can be reduced.

In some examples, as shown in FIG. 5B, FIG. 7A, and FIG. 7B, the third thin film transistor T3 further includes a third active layer 143, a third gate electrode 163, a third source electrode 1823, and a third drain electrode 1843; the third active layer 143 is located in the semiconductor layer 140, and includes a third channel region 143C, and a third source electrode region 143S and a third drain electrode region 143D that are located on two sides of the third channel region 143C; the third gate electrode 163 is located in the gate electrode layer 160, an orthographic projection of the third gate electrode 163 on the base substrate 110 at least partially overlaps with an orthographic projection of the third channel region 143C on the base substrate 110, and the third source electrode 1823 and the third drain electrode 1843 are both located in the conductive layer 180. The third source electrode 1823 is connected with the third source electrode region 143S through the via hole H5 in the interlayer insulating layer 170, and the third drain electrode 1843 is connected with the third drain electrode region 143D through the via hole H6 in the interlayer insulating layer 170. Thus, the third gate electrode, the third active layer, the third source electrode, and the third drain electrode that are mentioned above can constitute the above-mentioned third thin film transistor. The third thin film transistor may be a top-gate type thin film transistor, and has a characteristic of a short channel, and its on-state current Ion can be effectively increased, thus the display effect can be significantly improved and the power consumption can be reduced.

In some examples, as shown in FIGS. 4, 5A, 5B, 7A, and 7B, an anode hole 263 can penetrate the passivation layer 190 and the above-mentioned planarization layer 210, an anode 225 is connected with the first drain electrode 1841 through the anode hole 263 in the passivation layer 190 and the planarization layer 210. In this way, the display substrate can apply a driving current to the anode through the first thin film transistor, and the light emitting layer corresponding to the anode is driven to perform light emitting display.

In some examples, as shown in FIGS. 7A and 7B, the first via hole 261, the second via hole 262, the first contact hole 251, and the anode hole 263 are sequentially arranged.

For example, a shape of an orthographic projection of the first via hole 261 on the base substrate 110, a shape of an orthographic projection of the second via hole 262 on the base substrate 110, a shape of an orthographic projection of the first contact hole 251 on the base substrate 110, and a shape of an orthographic projection of the anode hole 263 on the base substrate 110 may be isotropic shapes, for example, circles, or anisotropic shapes, for example, rectangles, ellipses, and racetracks; the embodiments of the present disclosure are not limited herein. In addition, the specific shapes of the orthographic projection of the first via hole on the base substrate, the orthographic projection of the second via hole on the base substrate, the orthographic projection of the first contact hole on the base substrate, and the orthographic projection of the third via hole on the base substrate can be adjusted according to local actual space constraints of a layout of the display substrate to adjust an extension direction of a long side or a short side of the hole at each position.

In some examples, as shown in FIGS. 4, 5A, 5B, 7A and 7B, the pixel driving circuit 320 further includes the second thin film transistor T2 and the third thin film transistor T3; the second thin film transistor T2 includes the second gate electrode 162, the second source electrode 1822, and the second drain electrode 1842, the third thin film transistor T3 includes the third gate electrode 163, the third source electrode 1823, and the third drain electrode 1843. The semiconductor layer 140 further includes a conductive block 147.

Figure 8:
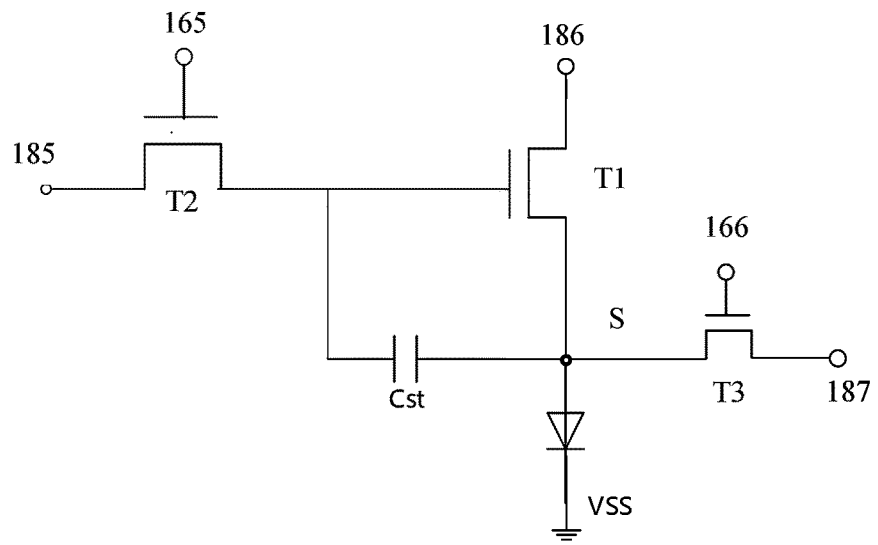
FIG. 8 is an equivalent circuit diagram of a pixel driving circuit in a display substrate provided by an embodiment of the present disclosure.

FIG. 8 is an equivalent circuit diagram of a pixel driving circuit in a display substrate provided by an embodiment of the present disclosure. As shown in FIGS. 7A, 7B and 8, the first source electrode 1821 of the first thin film transistor T1 can be connected with the power line 186, the second source electrode 1822 of the second thin film transistor T2 is connected with the data line 185, the second gate electrode 162 of the second thin film transistor T2 is connected with the first gate line 165; for example, an overlapping portion of the first gate line 165 and the second channel region 142C of the second active layer 142 of the second thin film transistor T2 is the second gate electrode 162; the second drain electrode 1842 of the second thin film transistor T2 is respectively connected with the first gate electrode 161 of the first thin film transistor T1 and the conductive block 147; the third gate electrode 163 of the third thin film transistor T3 is connected with the second gate line 166; the third source electrode 1823 of the third thin film transistor T3 is connected with the sensing line 187; the third drain electrode 1843 of the third thin film transistor T3 is connected with the first drain electrode 1841 of the first thin film transistor T1. At this time, the anode 225, the conductive light-shielding structure 122, the second drain electrode 1842 and the conductive block 147 that are located between the anode 225 and the conductive light-shielding structure 122 form a sandwich capacitor, that is, a storage capacitor Cst of the pixel driving circuit. The conductive light-shielding structure 122 and the anode 225 are at the same potential (in a case that the first thin film transistor is turned on, the conductive light-shielding structure is electrically connected with the anode through the third via hole) as one pole of the storage capacitor, and the conductive block 147 is the other pole of the storage capacitor.

For example, as shown in FIGS. 5B, 7A and 7B, the conductive block 147 is located in the semiconductor layer 140; the conductive block 147 may be disconnected from the active layer of the first thin film transistor T1, the active layer of the second thin film transistor T2, and the active layer of the third thin film transistor T3, that is, the conductive block 147 is a conductive semiconductor block that is independent of the active layer of the first thin film transistor T1, the active layer of the second thin film transistor T2, and the third thin film transistor T3. Of course, the embodiments of the present disclosure include but are not limited to this, the conductive block can also be connected with the active layer of the first thin film transistor, the active layer of the second thin film transistor and the active layer of the third thin film transistor, but an unconducted semiconductor space is provided between the conductive block and these active layers.

For example, as shown in FIGS. 7A and 7B, a part where the second gate line 166 overlaps with the third channel region 143C of the third active layer 143 of the third thin film transistor T3 is the third gate electrode 163. In this way, the display substrate can arrange a part of the third thin film transistor T3 outside a position where the first main body portion 1220 is located, that is, an orthographic projection of a part of the third thin film transistor T3 on the base substrate 110 is outside an orthographic projection of the first main body portion 1220 on the base substrate 110. In this way, the display substrate can utilize a space on two sides of the second gate line 166, so that the distribution of transistors is optimized, and the utilization of space is improved. For example, as shown in FIGS. 7A and 7B, since the overlapping portion of the second gate line 166 and the third channel region 143C of the third active layer 143 of the third thin film transistor T3 is the third gate electrode 163, a part of the third thin film transistor T3 may also be located on a side of the second gate line 166 away from the first main body portion 1220.

In some examples, as shown in FIGS. 7A and 7B, the second drain electrode 1842 and the first gate electrode 161 can be connected with the drain electrode region of the second active layer 142 through a same via hole, so that an area of the second drain electrode 1842 shielding the first gate electrode 161 can be reduced, and a risk of breakdown of an ILD layer and short circuit caused by an inheritance of a film formation morphology in an actual process is reduced. In addition, the second drain electrode 1842 and the first gate electrode 161 may be connected with the drain electrode region of the second active layer 142 through a same via hole, a number of the via holes on the second active layer 142 can also be reduced, and the product yield can be improved.

Figure 9:
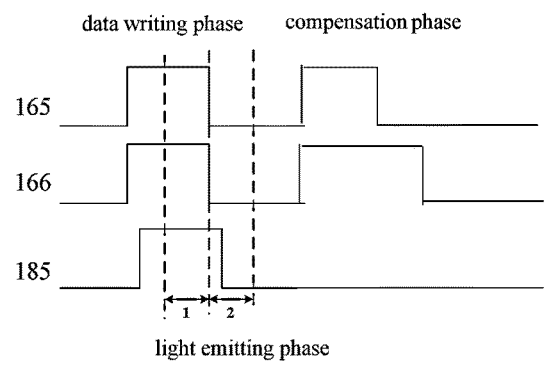
FIG. 9 is a timing diagram of signals on each of the signal lines in a pixel driving circuit in a display substrate provided by an embodiment of the present disclosure.

FIG. 9 is a timing diagram of signals on each of the signal lines in a pixel driving circuit in a display substrate provided by an embodiment of the present disclosure. In the following, a working flow of the pixel driving circuit of the present disclosure will be described with reference to the equivalent circuit diagram shown in FIG. 8 and the timing diagram shown in FIG. 9.

As shown in FIGS. 8 and 9, taking the first thin film transistor T1, the second thin film transistor T2, and the third thin film transistor T3 in FIG. 8 as P-type transistors as an example, in a data writing phase and a reset phase, both a signal on the first gate line 165 and a signal on the second gate line 166 are turn-on signals, the second thin film transistor T2 and the third thin film transistor T3 are turned on, a data signal DT is transmitted to the first gate electrode 161 of the first thin film transistor T1 and the first electrode of the storage capacitor Cst through the second thin film transistor T2, that is, the above-mentioned conductive block 147; at this time, the reset signal writes a reset signal to the anode 225 through the sensing line 187 and the third thin film transistor T3; the first thin film transistor T1 is turned on and the anode 225 is charged to a working voltage; in a light emitting phase, both a signal on the first gate line 165 and a signal on the second gate line 166 are turn-off signals, due to a bootstrap effect of the storage capacitor Cst, the voltages at two ends of the storage capacitor Cst remain unchanged, the first thin film transistor T1 works in a saturated state and the corresponding current remains unchanged; at this time, a driving current on the power line 186 flows to the anode 225 through the first thin film transistor T1, so that the corresponding light emitting layer is driven to emit light.

As shown in FIG. 8 and FIG. 9, the working process of the pixel driving circuit may further include an external compensation process; in the external compensation process, both the signal on the first gate line 165 and the signal the second gate line 166 are the turn-on signals, the second thin film transistor T2 and the third thin film transistor T3 are both turned on, the data signal DT is transmitted to the first gate electrode 161 of the first thin film transistor T1 through the second thin film transistor T2; at this time, an analog-to-digital converter can write a reset signal to a node S through the sensing line 187 and the third thin film transistor T3, the first transistor T1 is turned on and charges the node S until the first thin film transistor is turned off, the digital-to-analog converter samples voltages on the sensing line 187 to obtain a threshold voltage of the first thin film transistor T1. It should be noted that the external compensation process can be performed in a case that the display device is turned off.

In some examples, as shown in FIGS. 4, 5A, 7A, and 7B, an orthographic projection of the first channel region 141C on the base substrate 110 falls into an orthographic projection of the first main body portion 1220 on the base substrate 110. In this way, the first main body portion 1220 can block the light from the first channel region 141C, so that the first thin film transistor can be stabilized, and the display quality and a service life can be improved.

For example, as shown in FIGS. 4, 5A, 7A, and 7B, an orthographic projection of the pixel driving circuit 320 on the base substrate 110 at least partially overlaps with an orthographic projection of the conductive light-shielding structure 122 on the base substrate 110, so that various transistors or storage capacitors in the entire pixel driving circuit 320 can be protected from ambient light, and thus a stability of the pixel driving circuit 320 can be improved.

In some examples, as shown in FIGS. 4 and 5A, the above-mentioned conductive light-shielding structure 122 may further include a first insulating portion 1221; an orthographic projection of the first insulating portion 1221 on the base substrate 110 at least partially overlaps with an orthographic projection of the first via hole 261 on the base substrate 110, an orthographic projection of the first insulating portion 1221 on the base substrate 110 at least partially overlaps with an orthographic projection of the first source electrode region 141S on the base substrate 110. The above-mentioned first insulating portion is a part of the conductive light-shielding structure, and the first insulating portion is insulated from other parts with respect to other parts of the conductive light-shielding structure. In the display substrate, in a case that the semiconductor layer itself is thin and the first source electrode region is partially missing, and in a case that the etchant is etched from the first source electrode region down to the first insulating portion, since the first insulating portion is insulated from other parts of the conductive light-shielding structure, even if the first source electrode is connected with the first insulating portion through the first via hole, it will not cause the first source electrode to be electrically connected with other parts of the conductive light-shielding structure. In this way, the display substrate can reduce the process risk and improve the yield rate.

Figure 10A:
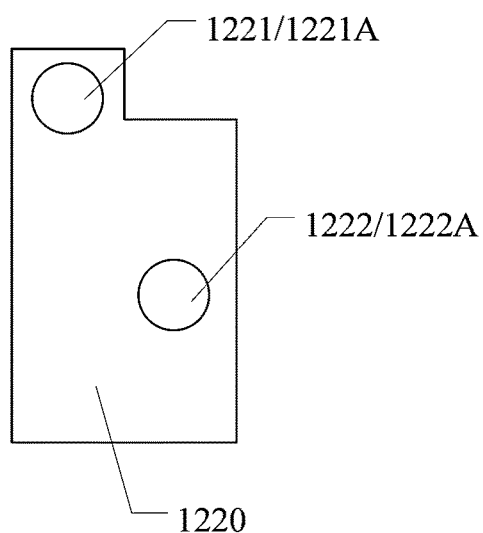
FIG. 10A is a planar schematic diagram of a conductive light-shielding structure in a display substrate provided by an embodiment of the present disclosure.

FIG. 10A is a planar schematic diagram of a conductive light-shielding structure in a display substrate provided by an embodiment of the present disclosure. As shown in FIG. 10A, the first insulating portion 1221 includes a first hollow portion 1221A, the first hollow portion 1221A is filled with a material of the buffer layer 130. In this way, the first insulating portion 1221 can be insulated from other parts of the conductive light-shielding structure 122 through the first hollow portion 1221A. It should be noted that, the first insulating portion 1221 itself may be a first hollow portion 1221A, that is, the first insulating portion 1221 may be a part that the conductive light-shielding structure 122 is removed.

Figure 10B:
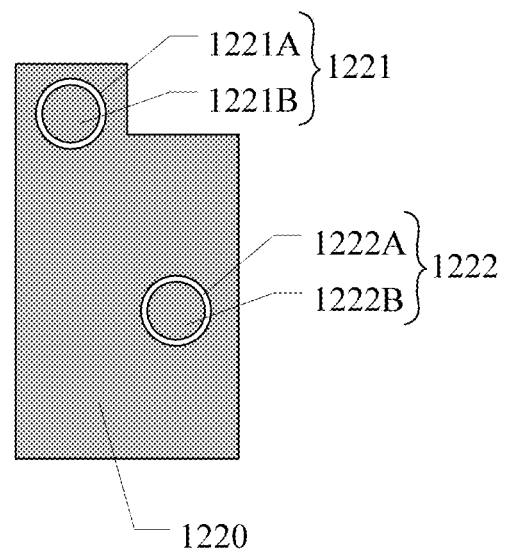
FIG. 10B is a planar schematic diagram of a conductive light-shielding structure in another display substrate provided by an embodiment of the present disclosure.

FIG. 10B is a planar schematic diagram of a conductive light-shielding structure in another display substrate provided by an embodiment of the present disclosure. As shown in FIG. 10B, the first hollow portion 1221A may be a first hollow ring, that is, the first hollow portion may be a ring-shaped hollow portion. Both an inner part 1221B of the first hollow ring 1221A and an outer side of the first hollow ring 1221A are the material of the conductive light-shielding structure 122. In this way, the first insulating portion 1221 can be insulated from other parts of the conductive light-shielding structure 122 by providing the first hollow ring 1221A.

Figure 10C:
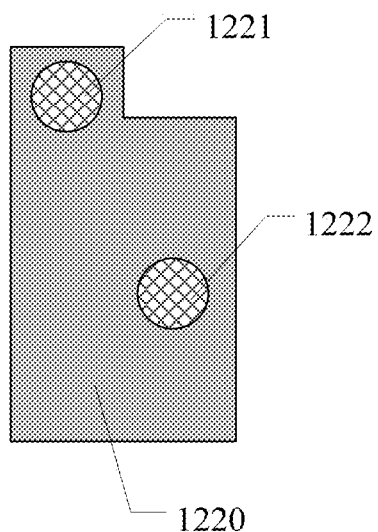
FIG. 10C is a planar schematic diagram of a conductive light-shielding structure in still another display substrate provided by an embodiment of the present disclosure.

FIG. 10C is a planar schematic diagram of a conductive light-shielding structure in still another display substrate provided by an embodiment of the present disclosure. As shown in FIG. 10C, the first insulating portion 1221 is an oxidation portion. That is, a part of the conductive light-shielding structure 122 can be oxidized through an oxidation process, to form the above-mentioned first insulating portion 1221.

Figure 11A:
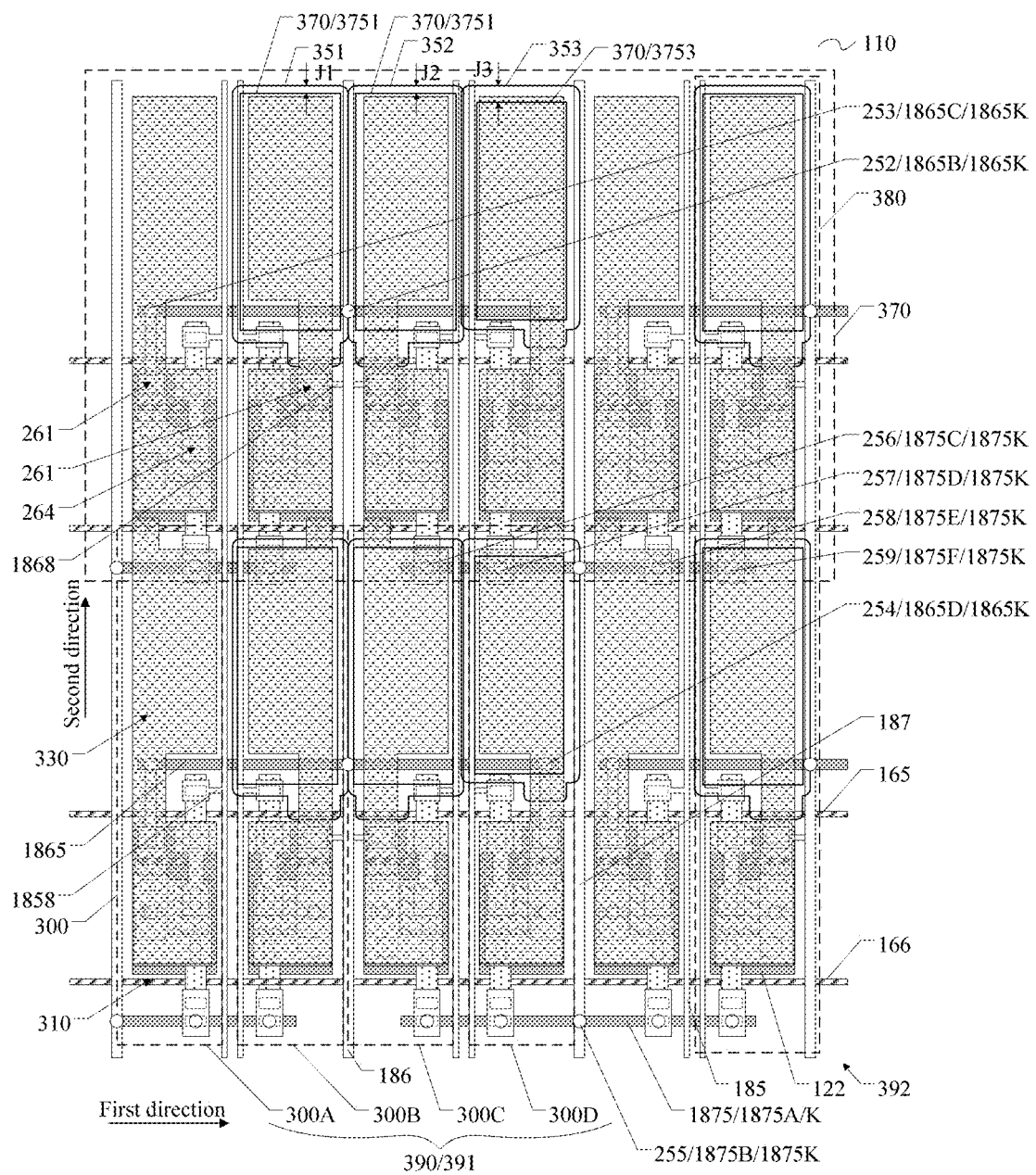
FIG. 11A is a planar schematic diagram of another display substrate provided by an embodiment of the present disclosure.

FIG. 11A is a planar schematic diagram of another display substrate provided by an embodiment of the present disclosure. As shown in FIG. 11A, each of the sub-pixels 300 includes a driving region 310 and a light emitting region 330; the conductive light-shielding structure 122 is located in the driving region 310. In the display substrate, since an orthographic projection of the pixel driving circuit 310 on the base substrate 110 overlaps with the driving region 310, by arranging the conductive light-shielding structure 122 in the driving region 310, on the one hand, the ambient light can be prevented from affecting the thin film transistors in the pixel driving circuit, and on the other hand, the ambient light can be prevented from passing through the driving region and affecting the normal display of the display substrate. It should be noted that a light emitting direction of the display substrate may be a direction from the anode layer to the base substrate, that is, the display substrate adopts a bottom emission mode, and the light emitting direction of the display substrate can also be a direction from the base substrate to the anode layer, that is, the display substrate adopts a top emission mode.

In some examples, as shown in FIG. 11A, the display substrate 100 further includes a first gate line 165, a second gate line 166, a data line 185, a power line 186, and a sensing line 187; the first gate line 165 and the second gate line 166 are both located in the gate electrode layer 160, and both of the first gate line 165 and the second gate line 166 extend along a first direction; the data line 185, the power line 186, and the sensing line 187 are all located in the conductive layer 180, and all extend along a second direction. The plurality of sub-pixels 300 are arranged in an array along the first direction and the second direction to form a plurality of sub-pixel rows 370 arranged in the second direction and a plurality of sub-pixel columns 380 arranged in the first direction. In each of the plurality of sub-pixel rows 370, the first gate line 165 is located between the driving region 310 and the light emitting region 330, the second gate line 166 is located between two adjacent sub-pixel rows 370; and the power line 186, the sensing line 187, and the data line 185 are all located between two adjacent sub-pixel columns 380. It should be noted that, the above-mentioned first direction may be a row direction of the sub-pixel array, and the above-mentioned second direction may be a column direction of the sub-pixel array.

In some examples, as shown in FIG. 11A, the first source electrode 1821 of the first thin film transistor T1 is connected with the power line 186 through a first connection portion 1868, the second source electrode 1822 of the second thin film transistor T2 is connected with the data line 185 through a second connection portion 1858, the first connection portion 1868A is arranged at a same layer as the power line 186, and the second connection portion 1858 is arranged at a same layer as the data line 185.

In some examples, as shown in FIG. 11A, a direction from the first source electrode 1821 to the first drain electrode 1841 (that is, an extension direction of the first channel region) intersects an extension direction of the first connection portion 1868, and a direction from the second source electrode 1822 to the second drain electrode 1842 (that is, an extension direction of the second channel region) intersects an extension direction of the second connection portion 1858.

For example, as shown in FIG. 11A, a direction from the third source electrode 1823 to the third drain electrode 1843 (that is, an extension direction of the second channel region) intersects an extension direction of the second gate line 166. In this way, on the one hand, an overlapping portion of the second gate line 166 and the third channel region 143C of the third active layer 143 of the third thin film transistor T3 can serve as a third gate electrode 163, so that a space on two sides of the second gate line 166 can be used, and a distribution of transistors is optimized and a space utilization rate is improved; on the other hand, the second gate line 166 does not need to be provided with a gate electrode portion protruding or bent from the second gate line 166, so that a voltage drop on the second gate line 166 can be reduced, and an electrical performance of the second gate line 166 can be improved.

For example, as shown in FIG. 11A, a direction from the first source electrode 1821 to the first drain electrode 1841 (that is, an extension direction of the first channel region) is substantially parallel to an extension direction of the power line 186, and a direction from the second source electrode 1822 to the second drain electrode 1842 (that is, an extension direction of the second channel region) is substantially parallel to an extension direction of the data line 185. It should be noted that, the above-mentioned "substantially parallel" includes a case of completely parallel, and includes a case that an included angle between the two directions is less than 10 degrees.

For example, as shown in FIG. 11A, a direction from the third source electrode 1823 to the third drain electrode 1843 (that is, an extension direction of the second channel region) is substantially parallel to an extension direction of the sensing line 187.

In some examples, as shown in FIG. 11A, the display substrate 100 includes the above-mentioned power line 186 and a power connection line 1865; the power line 186 is located in the conductive layer 180; the power connection line 1865 and the conductive light-shielding structure 122 are arranged at a same layer, that is, the power connection line 1865 and the conductive light-shielding structure 122 can be formed by using a same film layer through a same patterning process.

In some examples, as shown in FIG. 11A, the power connection line 1865 includes a second main body portion 1865A and a plurality of power recessed portions 1865K, an average thickness of the power supply recessed portions 1865K in the direction perpendicular to the base substrate 110 is smaller than an average thickness of the second main body portion 1865A in the direction perpendicular to the base substrate 110, and an area of a surface of the power recessed portion 1865K close to the conductive layer 180 is larger than an area of an orthographic projection of the power recessed portion 1865K on the base substrate 110.

In some examples, as shown in FIG. 11A, the power connection line 1865 includes the second main body portion 1865A and a plurality of power recessed portions 1865K, the plurality of power recessed portions 1865K can be used to electrically connect the power line 186 with the pixel driving circuits 320 of the plurality of sub-pixels 300. Since the power supply recessed portions 1865K are recessed into the power connection line 1865, an area of a surface of each of the power recessed portions 1865K close to the conductive layer 180 is larger than an area of an orthographic projection of the corresponding power recessed portion 1865K on the base substrate 110, so that a contact area of electrical connection can be increased, and the contact can be more sufficient, and a contact resistance is reduced, an electrical connection effect is improved and problems such as IR drop are effectively avoided.

Figure 11B:
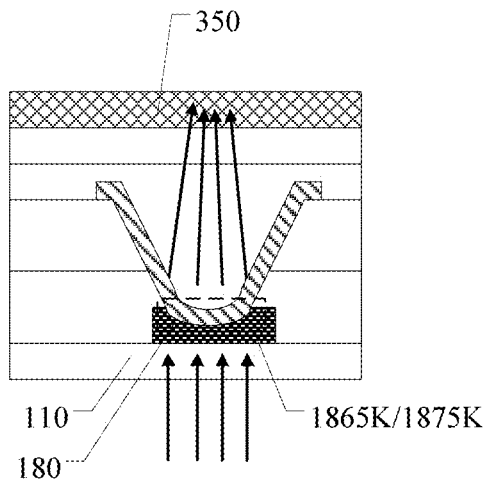
FIG. 11B is a schematic diagram of a light convergence effect of a power recessed portion or a sensing recessed portion in a display substrate provided by an embodiment of the present disclosure.

FIG. 11B is a schematic diagram of a light convergence effect of a power recessed portion or a sensing recessed portion in a display substrate provided by an embodiment of the present disclosure. As shown in FIG. 11A and FIG. 11B, an orthographic projection of at least one of the plurality of power recessed portions 1865K on the base substrate 110 at least partially overlaps with an orthographic projection of a color filter 350 in a color filter layer 200 on the base substrate 110. Similar to the first recessed portions, the power recessed portions also have a function of converging light, and since the power recessed portions can at least partially overlap with the color filters, so that the ambient light can be focused to the corresponding color filters, it can effectively prevent the uneven display caused by ambient light and avoid affecting the appearance.

Figure 11C:
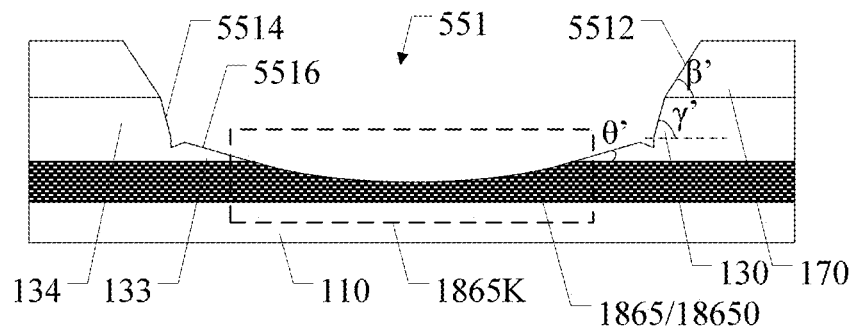
FIG. 11C is a cross-sectional schematic diagram of a power recessed portion in a display substrate in a direction perpendicular to a base substrate provided by an embodiment of the present disclosure.

FIG. 11C is a cross-sectional schematic diagram of a power recessed portion in a display substrate in a direction perpendicular to a base substrate provided by an embodiment of the present disclosure. As shown in FIG. 11C, a slope angle of a surface of the power supply recessed portion 1865K close to the conductive layer 180 may be the same as a slope angle of a surface of the first recessed portion close to the conductive layer. Of course, the embodiments of the present disclosure include but are not limited to this, the slope angle of the surface of the power recessed portion close to the conductive layer may be different from the slope angle of the surface of the first recessed portion close to the conductive layer.

In some examples, as shown in FIG. 11C, similar to the first recessed portion 1224, the power recessed portion 1865K includes a second edge portion 18650; in a direction from an edge of the power recessed portion 1865K to a center of the power recessed portion 1865K, a thickness of the second edge portion 18650 in the direction perpendicular to the base substrate 110 continuously and gradually decreases. Since an average thickness of a part of the power recessed portion close to an edge in the direction perpendicular to the base substrate is smaller than an average thickness of the first main body portion in the direction perpendicular to the base substrate, a light shielding performance of the power recessed portion may be affected. However, in the display substrate provided in the example, since at least the part of the power recessed portion close to the edge, that is, the thickness of the second edge portion 18650 in the direction perpendicular to the base substrate continuously and gradually decreases, so that a surface of the conductive portion (for example, a part of the power line) at a position of the power supply recessed portion away from the base substrate is a convex surface, the convex surface has a function of converging light; in a case that light penetrates the power recessed portion, the convex surface can converge the light, so that a part of the ambient light is prevented from uncontrolled reflection inside the display substrate, thereby avoiding the influence of the ambient light on the normal display of the display substrate.

For example, as shown in FIG. 11C, the surface of the conductive portion (for example, a part of the power line) at a position of the power recessed portion 1865K away from the base substrate 110 is a convex surface, the convex surface has a function of converging light; in a case that light can penetrate the power recessed portion, the convex surface can converge the light, so that a part of the ambient light is prevented from uncontrolled reflection inside the substrate, thereby avoiding the influence of the ambient light on the normal display of the display substrate.

In some examples, as shown in FIG. 11C, similar to the first recessed portion 1224, in the direction perpendicular to the base substrate 110, at least a part of the power recessed portion 1865K close to the edge, for example, a fifth slope angle of a surface of the conductive layer 180 of the conductive layer of the second edge portion 18650 mentioned above is continuously changed. In this way, even if light can penetrate the power recessed portion, the power recessed portion can make the convex surface of the conductive portion located at a position of the power recessed portion away from the base substrate play a role of converging light, so that the light is prevented from penetrating the entire display substrate, thereby avoiding the influence of the light on the display effect of the light emitting region.

In some examples, as shown in FIG. 11C, the display substrate 100 further includes a power contact hole 551, the power contact hole 551 is located in the interlayer insulating layer 170 and the buffer layer 130, for example, the power contact hole 551 penetrates the interlayer insulating layer 170 and the buffer layer 130. An orthographic projection of the power contact hole 551 on the base substrate 110 at least partially overlaps with an orthographic projection of the power recessed portion 1865K on the base substrate 110.

In some examples, as shown in FIG. 11C, the buffer layer 130 includes: a third buffer portion 133, located in the power contact hole 551, in which a side of the third buffer portion 133 away from the base substrate 110 is arranged in contact with the power connection line, and a side of the third buffer portion close to the base substrate is arranged in contact with the conductive light-shielding structure; and a fourth buffer 134, located on a side of the third buffer portion 133 away from a center of the power recessed portion 1865K. In this way, in a case that the above-mentioned conductive layer (for example, a part corresponding to the power line) is deposited in the power contact hole 551, the third buffer portion 133 can play a role of supporting a portion of the conductive structure, the conductive structure is prevented from disconnecting caused by too large drop or too large slope angle. Therefore, the display substrate has a higher yield.

In some examples, as shown in FIG. 11C, a side wall of the power contact hole 551 includes a fourth sub side wall 5512 in the interlayer insulating layer 170, a fifth sub side wall 5514 in the fourth buffer layer 134, and a sixth sub side wall 5516 in the third buffer portion 133; the fourth sub side wall 5512 is connected with the fifth sub side wall 5514, the fifth sub side wall 5514 is connected with the sixth sub side wall 5516, and an included angle between the fourth sub side wall 5512 and the base substrate 110 constitutes a sixth slope angle β', an included angle between the fifth sub side wall 5514 and the base substrate 110 constitutes a seventh slope angle γ', and an included angle between the sixth sub side wall 5516 and the base substrate 110 constitutes an eighth slope angle θ'. The sixth slope angle, the seventh slope angle, and the eighth slope angle are different from each other. A contact portion between the fifth sub side wall 5514 and the third buffer portion 133 is located between the third buffer portion 133 and the fourth buffer portion 134.

In the display substrate, due to a material of the buffer layer is different from a material of the interlayer insulating layer, etching efficiencies of the etchants on the buffer layer and the interlayer insulating layer are also different, so that the slope angle of the fourth sub side wall, the slope angle of the fifth sub side wall, and the slope angle of the sixth sub side wall are different.

For example, the above-mentioned buffer layer can be deposited by processes at different temperatures, so that the inside of the buffer layer has different densities, and the third buffer portion and the fourth buffer portion mentioned above can be formed. Of course, the embodiments of the present disclosure include but are not limited to this, and the third buffer portion and the fourth buffer portion mentioned above can be manufactured by other suitable methods.

In some examples, as shown in FIG. 11C, the sixth slope angle β' is smaller than the seventh slope angle γ', the seventh slope angle γ' is greater than the eighth slope angle θ', and the sixth slope angle β' is greater than the eighth slope angle θ'. That is, the seventh slope angle γ' is greater than the sixth slope angle β', and the sixth slope angle β' is greater than the eighth slope angle θ'.

For example, the fourth slope angle α is smaller than the eighth slope angle θ'.

In some examples, since each of the power recessed portions is formed on a linear power connection line or a strip-shaped power connection line, the angle of the side wall in the power contact hole corresponding to the power recessed portion and the angle of the side wall in the first contact hole corresponding to the first recessed portion may be different. For example, the seventh slope angle γ' in the power contact hole may be smaller than the third slope angle γ of the first contact hole. In this way, since the sixth slope angle in the power contact hole is small, the fifth sub side wall is made smoother, so that defects such as disconnection can be better prevented. Of course, the embodiments of the present disclosure include but are not limited to this, and the seventh slope angle γ' in the power contact hole may also be greater than or equal to the second slope angle γ of the first contact hole.

In some examples, the eighth slope angle θ' in the power contact hole is greater than the third slope angle θ of the first contact hole, so that a size of the third buffer portion can be reduced, and an effect of electrical connection with the power recessed portion is increased. Of course, the embodiments of the present disclosure include but are not limited to this, and the eighth slope angle of the power contact hole may also be smaller than the fourth slope angle of the first contact hole.

In some examples, as shown in FIG. 11A, the display substrate 100 includes the above-mentioned sensing line 187 and a sensing connection line 1875; the sensing line 187 is located in the conductive layer 180, the sensing connection line 1875 and the conductive light-shielding structure 122 are arranged at a same layer, that is, the power connection line 1865 and the conductive light-shielding structure 122 can be formed using a same film layer through a same patterning process.

In some examples, as shown in FIG. 11A, the sensing connection line 1875 includes a third main body portion 1875A and a plurality of sensing recessed portions 1875K, an average thickness of the sensing recessed portions 1875K in the direction perpendicular to the base substrate 110 is smaller than an average thickness of the third main body portion 1875A in the direction perpendicular to the base substrate 110, and an area of a surface of one of the sensing recessed portions 1875K close to the conductive layer 180 is larger than an area of an orthographic projection of the one of the sensing recessed portions 1875K on the base substrate 110.

In the example, the sensing connection line 1875 includes a third main body portion 1875A and a plurality of sensing recessed portions 1875K, the plurality of sensing recessed portions 1875K can be used to electrically connect the sensing line 187 with the pixel driving circuits 320 of the plurality of sub-pixels 300. Since the sensing recessed portions 1875K are recessed into the sensing connection line 1875, an area of each of the sensing recessed portions 1875K close to a surface of the conductive layer 180 is larger than an area of an orthographic projection of the corresponding sensing recessed portion 1875K on the base substrate 110, so that a contact area of electrical connection can be increased, and the contact can be more sufficient, thus a contact resistance is reduced, the electrical connection effect is improved and problems such as IR drop are effectively avoided.

In some examples, as shown in FIGS. 11A and 11B, an orthographic projection of at least one of the plurality of sensing recessed portions 1875K on the base substrate 110 at least partially overlaps with an orthographic projection of the color filter 350 in the color filter layer 200 on the base substrate 110. Similar to the first recessed portions, the power recessed portions also have a function of converging light, and since the power recessed portions can at least partially overlaps with the color filters, the ambient light can be focused to the corresponding color filters, it can effectively prevent the uneven display caused by ambient light and avoid affecting the appearance.

Figure 11D:
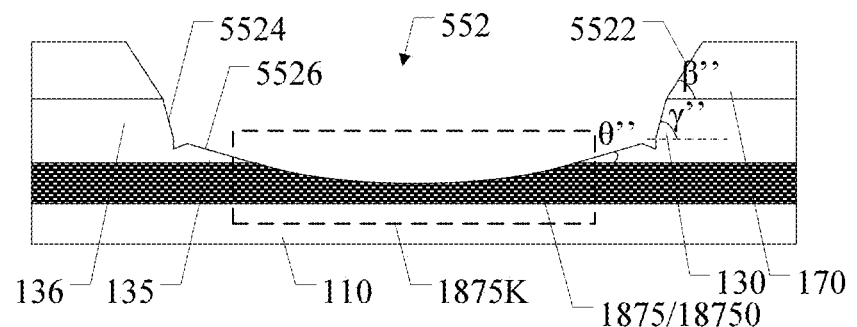
FIG. 11D is a cross-sectional schematic diagram of a sensing recessed portion in a display substrate in a direction perpendicular to a base substrate provided by an embodiment of the present disclosure.

FIG. 11D is a cross-sectional schematic diagram of a sensing recessed portion in a display substrate in a direction perpendicular to a base substrate provided by an embodiment of the present disclosure. As shown in FIG. 11D, a slope angle of a surface of the sensing recessed portion 1875K close to the conductive layer 180 may be the same as a slope angle of a surface of the first recessed portion close to the conductive layer. Of course, the embodiments of the present disclosure include but are not limited to this, the slope angle of the surface of the sensing recessed portion close to the conductive layer may be different from the slope angle of the surface of the first recessed portion close to the conductive layer.

In some examples, as shown in FIG. 11D, similar to the first recessed portion 1224, the sensing recessed portion 1875K includes a third edge portion 18750; in a direction from an edge of the sensing recessed portion 1875K to a center of the sensing recessed portion 1875K, a thickness of the third edge portion 18750 in the direction perpendicular to the base substrate 110 continuously and gradually decreases. Since an average thickness of a part of the sensing recessed portion close to the edge in the direction perpendicular to the base substrate is smaller than an average thickness of the first main body portion in the direction perpendicular to the base substrate, a light shielding performance of the sensing recessed portion may be affected. However, in the display substrate provided in the example, since a thickness of at least a part of the sensing recessed portion close to an edge in the direction perpendicular to the base substrate is continuously and gradually reduced, so that a surface of a conductive portion (for example, a part of the sensing line) at a position of the sensing recessed portion away from the base substrate is a convex surface, the convex surface has a function of converging light; in a case that light can penetrate the sensing recessed portion, the convex surface can converge light, so that a part of the ambient light is prevented from uncontrolled reflection inside the substrate, thereby avoiding the influence of the ambient light on the normal display of the display substrate.

For example, as shown in FIG. 11D, the surface of the conductive portion (for example, a part of the sensing line) at a position of the sensing recessed portion 1875K away from the base substrate 110 is a convex surface, and the convex surface has a function of converging light; in a case that light can penetrate the sensing recessed portion, the convex surface can converge light, so that a part of the ambient light is prevented from uncontrolled reflection inside the substrate, thereby avoiding the influence of the ambient light on the normal display of the display substrate.

In some examples, as shown in FIG. 11D, similar to the first recessed portion 1224, in the direction perpendicular to the base substrate 110, a ninth slope angle of a surface of the third edge portion 18750 close to the conductive layer 180 is continuously changed. In this way, even if light can penetrate the sensing recessed portion, the sensing recessed portion can make the convex surface of the conductive portion located at the position of the sensing recessed portion away from the base substrate play a role of converging light, so that light is prevented from penetrating the entire display substrate to affect a display effect of the light emitting region.

In some examples, as shown in FIG. 11D, the display substrate 100 further includes a sensing contact hole 552, the sensing contact hole 552 is located in the interlayer insulating layer 170 and the buffer layer 130, for example, the sensing contact hole 552 penetrates the interlayer insulating layer 170 and the buffer layer 130. An orthographic projection of the sensing contact hole 552 on the base substrate 110 at least partially overlaps with an orthographic projection of the sensing recessed portion 1875K on the base substrate 110.

In some examples, as shown in FIG. 11D, the buffer layer 130 includes: a fifth buffer portion 135, which is located in the sensing contact hole 552, and is arranged in contact with the sensing connection line 1875; and a sixth buffer portion 136, which is located on a side of the fifth buffer portion 135 away from a center of the sensing recessed portion 1875K. In this way, in a case that the above-mentioned conductive layer (for example, a part corresponding to the sensing line) is deposited in the sensing contact hole 552, the fifth buffer portion 135 can play a role of supporting a part of the conductive structure, the conductive structure is prevented from disconnecting caused by too large drop or too large slope angle. Therefore, the display substrate has a higher yield.

In some examples, as shown in FIG. 11D, a side of the fifth buffer portion 135 away from the base substrate 110 is arranged in contact with the sensing connection line 1875, and a side of the fifth buffer portion 135 close to the base substrate 110 is arranged in contact with the conductive light-shielding structure 122.

In some examples, as shown in FIG. 11D, side walls of the sensing contact hole 552 include a seventh sub side wall 5522 in the interlayer insulating layer 170, an eighth sub side wall 5524 in the sixth buffer layer 136, and a ninth sub side wall 5526 in the fifth buffer portion 135; the seventh sub side wall 5522 is connected with the eighth sub side wall 5524, the eighth sub side wall 5524 is connected with the ninth sub side wall 5526, and an included angle between the seventh sub side wall 5522 and the base substrate 110 constitutes a tenth slope angle $\beta''$, an included angle between the eighth sub side wall 5524 and the base substrate 110 constitutes an eleventh slope angle $\gamma''$, an included angle between the ninth sub side wall 5526 and the base substrate 110 constitutes a twelfth slope angle $\theta''$; the tenth slope angle, the eleventh slope angle, and the twelfth slope angle are different. In the display substrate, due to the material of the buffer layer is different from the material of the interlayer insulating layer, the etching efficiencies of the etchants on the buffer layer and the interlayer insulating layer are also different, so that the slope angle of the seventh sub side wall, the slope angle of the eighth sub side wall, and the slope angle of the ninth sub side wall are likely to be different.

For example, the above-mentioned buffer layer can be deposited by processes at different temperatures, so that an inside of the buffer layer has different densities, so that the fifth buffer portion and the sixth buffer portion that are mentioned above can be formed. Of course, the embodiments of the present disclosure include but are not limited to this, the fifth buffer portion and sixth buffer portion that are mentioned above can be manufactured by other suitable methods.

In some examples, as shown in FIG. 11D, the tenth slope angle $\beta''$ is smaller than the eleventh slope angle $\gamma''$, the eleventh slope angle $\gamma''$ is greater than the twelfth slope angle $\theta''$, and the tenth slope angle $\beta''$ is greater than the twelfth slope angle $\theta''$. That is, the eleventh slope angle $\gamma''$ is greater than the tenth slope angle $\beta''$, and the tenth slope angle $\beta''$ is greater than the twelfth slope angle $\theta''$. Of course, the embodiments of the present disclosure include but are not limited to this.

For example, the fourth slope angle $\alpha$ is smaller than the twelfth slope angle $\theta''$.

In some examples, since each of the sensing recessed portions is formed on a linear power connection line or a strip-shaped power connection line, an angle of a side wall in the first contact hole corresponding to the sensing recessed portion and an angle of a side wall in the first contact hole corresponding to the first recessed portion may be different. For example, the eleventh slope angle $\gamma''$ in the sensing contact hole is smaller than the third slope angle $\gamma$ of the first contact hole. In this way, since the eleventh slope angle in the sensing contact hole is small, thus the eighth side wall is more smooth, so that defects such as disconnection can be better prevented. Of course, the embodiments of the present disclosure include but are not limited to this, and the eleventh slope angle $\gamma''$ in the sensing contact hole may also be greater than or equal to the third slope angle $\gamma$ of the first contact hole.

In some examples, the twelfth slope angle $\theta''$ in the sensing contact hole is greater than the third slope angle $\theta$ of the first contact hole, so that a size of the fifth buffer portion can be reduced, and an effect of electrical connection with the sensing recessed portion is increased. Of course, the embodiments of the present disclosure include but are not limited to this, and the twelfth slope angle in the sensing contact hole may also be smaller than the third slope angle of the first contact hole.

It should be noted that other specific shapes and sizes of each of the power recessed portions and each of the sensing recessed portions can be referred to the related descriptions of the first recessed portions shown in FIGS. 6A and 6B, which are omitted herein.

In some examples, as shown in FIG. 11A, the plurality of sub-pixels 300 include a first color sub-pixel 300A, a second color sub-pixel 300B, a third color sub-pixel 300C, and a fourth color sub-pixel 300D; in each of the sub-pixel rows 370, the first color sub-pixel 300A, the second color sub-pixel 300B, the third color sub-pixel 300C, and the fourth color sub-pixel 300D are sequentially arranged along the first direction to form a sub-pixel group 390, and the power line 186 is located between the second color sub-pixel 300B and the third color sub-pixel 300C in the sub-pixel group 390.

In some examples, as shown in FIG. 11A, the display substrate 100 further includes a power connection line 1865, and the power connection line 1865 and the conductive light-shielding structure 122 are arranged at a same layer; and the power line 186 may be connected with the power connection line 1865 through a contact hole penetrating the interlayer insulating layer and the buffer layer.

In some examples, as shown in FIG. 11A, the display substrate 100 further includes a second contact hole 252, a third contact hole 253, and a fourth contact hole 254, and the second contact hole 252, the third contact hole 253 and the fourth contact hole 254 are located in the interlayer insulating layer 170 and the buffer layer 130; in the sub-pixel group 390, the power line 186 is connected with the power connection line 1865 through the second contact hole 252, the first source electrode 1821 of the second color sub-pixel 300B is connected with the power line 186 at a same layer, and the first source electrode 1821 of the third color sub-pixel 300C is connected with the power line 186 at a same layer. It should be noted that the above-mentioned same layer connection means that the first source electrode and the power supply line are directly connected through a connection line arranged at a same layer.

In some examples, as shown in FIG. 11A, the first source electrode 1821 of the first color sub-pixel 300A is connected with the power connection line 1865 through the third contact hole 253, and the first source electrode 1821 of the fourth color sub-pixel 300D is connected with the power connection line 1865 through the fourth contact hole 254. In this way, in each of the pixel rows, one power line can drive four sub-pixels at the same time, so that a wiring density can be reduced.

In some examples, as shown in FIG. 11A, the power connection line 1865 includes a second main body portion 1865A, a second recessed portion 1865B, a third recessed portion 1865C, and a fourth recessed portion 1865D; an orthographic projection of the second recessed portion 1865B on the base substrate 110 at least partially overlaps with an orthographic projection of the second contact hole 252 on the base substrate 110, each thickness of the second recessed portion 1865B in the direction perpendicular to the base substrate 110 is smaller than a thickness of the second main body portion 1865A in the direction perpendicular to the base substrate 110, and an area of a surface of the second recessed portion 1865B close to the power line 186 is larger than an area of the orthographic projection of the second recessed portion 1865B on the base substrate 110. In the display substrate, the power line 186 can be connected with the second recessed portion 1865B of the power connection line 1865 through the second contact hole 252. Since the second recessed portion 1865B is a recessed structure, an area of a surface of the second recessed portion close to the power line is larger than an area of an orthographic projection of the second recessed portion on the base substrate. In this way, a contact area between the power line and the power connection line of the display substrate can be increased, and the contact is more sufficient, so that the contact resistance is reduced, and the electrical connection effect between the power line and the power connection line is improved.

Similar to the first recessed portion, from an edge of the second recessed portion to a center of the second recessed portion, a thickness of at least a part of the second recessed portion close to an edge in a direction perpendicular to the base substrate continuously and gradually decreases. Since an average thickness of the second recessed portion in the direction perpendicular to the base substrate is smaller than a thickness of the second main body portion in the direction perpendicular to the base substrate, a light shielding performance of the second recessed portion may be affected. In the display substrate provided in this example, since the thickness of the second recessed portion in the direction perpendicular to the base substrate continuously and gradually decreases, even if light can penetrate the second recessed portion, the second recessed portion can also play a role of converging light, so that the ambient light is prevented from penetrating the entire display substrate, and the ambient light is prevented from affecting the normal display of the display substrate. Similarly, the surface of the second recessed portion close to the power line is a curved surface or a bent surface.

In some examples, as shown in FIG. 11A, an orthographic projection of the third recessed portion 1865C on the base substrate 110 at least partially overlaps with an orthographic projection of the third contact hole 253 on the base substrate 110, each thickness of the third recessed portion 1865C in the direction perpendicular to the base substrate 110 is smaller than a thickness of the second main body portion 1865A in the direction perpendicular to the base substrate 110, and an area of a surface of the third recessed portion 1865C away from the base substrate 110 is larger than an area of an orthographic projection of the third recessed portion 1865C on the base substrate 110. In the display substrate, the first source electrode 1821 of the first color sub-pixel 300A can be connected with the third recessed portion 1865C of the power connection line 1865 through the third contact hole 253; for example, the first source electrode of the first color sub-pixel can be connected with the third recessed portion through a connecting line arranged in the conductive layer. Since the third recessed portion is a recessed structure, an area of a surface of the third recessed portion away from the base substrate is larger than an area of an orthographic projection of the third recessed portion on the base substrate. In this way, the display substrate can increase the contact area between the first source electrode of the first color sub-pixel and the power connection line, and the contact is more sufficient, so that the contact resistance is reduced, and the electrical connection effect between the first source electrode of the first color sub-pixel and the power connection line is improved.

Similar to the first recessed portion, from an edge of the third recessed portion to a center of the third recessed portion, a thickness of at least the part of the third recessed portion close to the edge in the direction perpendicular to the base substrate continuously and gradually decreases. Since the average thickness of the third recessed portion in the direction perpendicular to the base substrate is smaller than the thickness of the second main body portion in the direction perpendicular to the base substrate, a light shielding performance of the third recessed portion may be affected. In the display substrate provided in the example, since the thickness of the third recessed portion in the direction perpendicular to the base substrate continuously and gradually decreases, even if light can penetrate the third recessed portion, the third recessed portion can also play a role of converging light, so that the ambient light is prevented from penetrating the entire display substrate, and the ambient light is prevented from affecting the normal display of the display substrate. Similarly, the surface of the third recessed portion close to the power line may also be a curved surface or a bent surface.

In some examples, as shown in FIG. 11A, an orthographic projection of the fourth recessed portion 1865D on the base substrate 110 at least partially overlaps with an orthographic projection of the fourth contact hole 254 on the base substrate 110, a thickness of the fourth recessed portion 1865D in the direction perpendicular to the base substrate 110 is smaller than a thickness of the second main body portion 1865A in the direction perpendicular to the base substrate 110, an area of a surface of the fourth recessed portion 1865D away from the base substrate 110 is larger than an area of an orthographic projection of the fourth recessed portion 1865D on the base substrate 110. In the display substrate, the first source electrode 1821 of the fourth color sub-pixel 300D can be connected with the fourth recessed portion 1865D of the power connection line 1865 through the fourth contact hole 254; for example, the first source electrode of the fourth color sub-pixel can be connected with the fourth recessed portion through a connecting line arranged in the conductive layer. Since the fourth recessed portion is a recessed structure, an area of a surface of the fourth recessed portion away from the base substrate is larger than an area of an orthographic projection of the fourth recessed portion on the base substrate. In this way, the display substrate can increase a contact area between the first source electrode of the fourth color sub-pixel and the power connection line, and the contact is more sufficient, so that the contact resistance is reduced, and the electrical connection effect between the first source electrode of the fourth color sub-pixel and the power connection line is improved.

Similar to the first recessed portion, from an edge of the fourth recessed portion to a center of the fourth recessed portion, a thickness of at least a part of the fourth recessed portion close to the edge in the direction perpendicular to the base substrate continuously and gradually decreases. Since the average thickness of the fourth recessed portion in the direction perpendicular to the base substrate is smaller than the thickness of the second main body portion in the direction perpendicular to the base substrate, a light shielding performance of the fourth recessed portion may be affected. In the display substrate provided in the example, since the thickness of the fourth recessed portion in the direction perpendicular to the base substrate continuously and gradually decreases, even if light can penetrate the fourth recessed portion, the fourth recessed portion can also play a role of converging light, so that the ambient light is prevented from penetrating the entire display substrate, and the ambient light is prevented from affecting the normal display of the display substrate. Similarly, a surface of the fourth recessed portion close to the power line may also be a curved surface or a bent surface.

In some examples, as shown in FIG. 11A, an orthographic projection of at least one of the second recessed portion 1865B, the third recessed portion 1865C, and the fourth recessed portion 1865D on the base substrate 110 at least partially overlaps with an orthographic projection of the color filter 350 in the color filter layer 200 on the base substrate 110, it can effectively prevent the uneven display caused by ambient light and avoid affecting the appearance.

In some examples, as shown in FIG. 11A, the second color sub-pixel 300B includes a first color filter 351, so that light with a first color can be emitted; the third color sub-pixel 300C includes a second color filter 352, so that light with a second color can be emitted; the fourth color sub-pixel 300D includes a third color filter 353, so that light with a third color can be emitted. For example, the first color sub-pixel 300D may not be arranged with a color filter, so that white light is emitted. In this way, the display substrate can realize full-color display, since white light sub-pixels are used, a brightness of the display substrate and a contrast of the display substrate are increased.

For example, the first color can be red (R), the second color can be green (G), and the third color may be blue (B). Of course, the embodiments of the present disclosure include but are not limited to this, and the above three colors can also be other colors.

In some examples, as shown in FIG. 11A, the display substrate 100 may further include a pixel definition layer 370, the pixel definition layer 370 includes a plurality of openings 375, and color filters 350 may be arranged in the plurality of openings 375.

For example, as shown in FIG. 11A, the plurality of openings 375 include a first opening 3751, a second opening 3752, and a third opening 3753; the first color filter 351 is at least partially arranged in the first opening 3751; the second color filter 352 is at least partially arranged in the second opening 3752; the third color filter 353 is at least partially arranged in the third opening 3753. A shortest distance J3 between an outer edge of the third color filter 353 and the third opening 3753 is greater than a shortest distance J2 between an outer edge of the first color filter 351 and the first opening 3751, and a shortest distance J3 between an outer edge of the third color filter 353 and the third opening 3753 is also greater than a shortest distance J1 between an outer edge of the second color filter 352 and the second opening 3752. Of course, the embodiments of the present disclosure include but are not limited to this, according to different product requirements, a shortest distance between an outer edge of the second color filter and the second opening may also be greater than a shortest distance between an outer edge of the first color filter and the first opening, and a shortest distance between an outer edge of the third color filter and the third opening, or a shortest distance between an outer edge of the first color filter and the first opening may also be greater than a shortest distance between the outer edge of the second color filter and the second opening, and a shortest distance between an outer edge of the third color filter and the third opening.

In some examples, as shown in FIG. 11A, most of the first color filter 351 is arranged in a light emitting region 330 of the first color sub-pixel 300A; most of the second color filter 352 is arranged in a light emitting region 330 of the second color sub-pixel 300B; and most of the third color filter 353 is arranged in a light emitting region 330 of the third color sub-pixel 300C.

In some examples, as shown in FIG. 11A, in the sub-pixel group 390, at least one of an orthographic projection of the first color filter 351 on the base substrate 110 and an orthographic projection of the second color filter 352 on the base substrate 110 at least partially overlaps with an orthographic projection of the second recessed portion 1865B on the base substrate 110, and an orthographic projection of the third color filter 351 on the base substrate 110 at least partially overlaps with an orthographic projection of the fourth recessed portion 1865D on the base substrate 110. In this way, even if a light shielding performance of the second recessed portion or the fourth recessed portion is affected due to its thin thickness, the first color filter and the second color filter can further shield the second recessed portion, and the third color filter can further shield the fourth recessed portion, so that the ambient light is prevented from penetrating the entire display substrate, thereby avoiding the influence of the ambient light on the normal display of the display substrate.

In addition, in a case that a thickness of the second recessed portion in the direction perpendicular to the base substrate gradually decreases from an edge of the second recessed portion to a center of the second recessed portion, even if light passes through the second recessed portion, the second recessed portion can focus the light on at least one of the first color filter and the second color filter, so that the ambient light can be effectively prevented from penetrating the entire display substrate. In a case that a thickness of the fourth recessed portion in the direction perpendicular to the base substrate continuously and gradually decreases from an edge of the fourth recessed portion to a center of the fourth recessed portion, even if light passes through the fourth recessed portion, the fourth recessed portion can focus the light on the third color filter, it can effectively prevent the uneven display caused by ambient light and avoid affecting the appearance.

For example, as shown in FIG. 11A, an overlapping area between the orthographic projection of the third color filter 351 on the base substrate 110 and the orthographic projection of the fourth recessed portion 1865D on the base substrate 110 is larger than an overlapping area between the orthographic projection of the first color filter 351 on the base substrate 110 and the orthographic projection of the second recessed portion 1865B on the base substrate 110, or an overlapping area between the orthographic projection of the second color filter 352 on the base substrate 110 and the orthographic projection of the second recessed portion 1865B on the base substrate 110.

In some examples, as shown in FIG. 11A, the sensing line 187 is located between adjacent two sub-pixel groups 390 in the first direction, and the adjacent two sub-pixel groups 390 in the first direction include a first sub-pixel group 391 and a second sub-pixel group 392. The display substrate 100 further includes a sensing connection line 1875, a fifth contact hole 255, a sixth contact hole 256, a seventh contact hole 257, an eighth contact hole 258, and a ninth contact hole 259; the sensing connection line 1875 and the conductive light-shielding structure 122 are arranged at a same layer, and the fifth contact hole 255, the sixth contact hole 256, the seventh contact hole 257, the eighth contact hole 258, and the ninth contact hole 259 are located in the interlayer insulating layer 170 and the buffer layer 130. In the adjacent two sub-pixel groups 390, the sensing line 187 is connected with the sensing connection line 1875 through the fifth contact hole 255. It should be noted that, for clarity, FIG. 11A does not completely show the entire second sub-pixel group, and a composition of the second sub-pixel group can be referred to a composition of the first sub-pixel group.

In some examples, as shown in FIG. 11A, a third source electrode 1843 of the third color sub-pixel 300C in the first sub-pixel group 391 is connected with the sensing connection line 1875 through the sixth contact hole 256, and a third source electrode 1843 of the fourth color sub-pixel 300D in the first sub-pixel group 391 is connected with the sensing connection line 1875 through the seventh contact hole 257. A third source electrode 1843 of the first color sub-pixel 300A in the second sub-pixel group 392 is connected with the sensing connection line 1875 through the eighth contact hole 358, and a third source electrode 1843 of the second color sub-pixel 300B in the second sub-pixel group 392 is connected with the sensing connection line 1875 through the ninth contact hole 359. In this way, in each of the pixel rows, one sensing line can drive four sub-pixels at the same time, so that a wiring density can be reduced. In addition, since the third source electrodes of the above four sub-pixels are all connected with the sensing connection line through the contact hole, thus a layout space of the pixel driving circuits of each of sub-pixels is approximately the same, so that the arrangement of the pixel driving circuits of each sub-pixel can be simplified.

In some examples, as shown in FIG. 11A, the sensing connection line 1875 includes a third main body portion 1875A, a fifth recessed portion 1875B, a sixth recessed portion 1875C, a seventh recessed portion 1875D, an eighth recessed portion 1875E, and a ninth recessed portion 1875F; an orthographic projection of the fifth recessed portion 1875B on the base substrate 110 at least partially overlaps with an orthographic projection of the fifth contact hole 255 on the base substrate 110, an orthographic projection of the sixth recessed portion 1875C on the base substrate 110 at least partially overlaps with an orthographic projection of the sixth contact hole 266 on the base substrate 110, an orthographic projection of the seventh recessed portion 1875D on the base substrate 110 at least partially overlaps with an orthographic projection of the seventh contact hole 257 on the base substrate 110, an orthographic projection of the eighth recessed portion 1875E on the base substrate 110 at least partially overlaps with an orthographic projection of the eighth contact hole 258 on the base substrate 110, and an orthographic projection of the ninth recessed portion 1875F on the base substrate 110 at least partially overlaps with an orthographic projection of the ninth contact hole 259 on the base substrate 110.

In some examples, as shown in FIG. 11A, each thickness of the fifth recessed portion 1875B in the direction perpendicular to the base substrate 110 is smaller than a thickness of the third main body portion 1875A in the direction perpendicular to the base substrate 110; an area of a surface of the fifth recessed portion 155 close to the sensing line 187 is larger than an area of the orthographic projection of the fifth recessed portion 1875B on the base substrate 110. In the display substrate, the sensing line 187 can be connected with the fifth recessed portion 1875B of the sensing connection line 1875 through the fifth contact hole 255. Since the fifth recessed portion 1865B is a recessed structure, the area of the surface of the fifth recessed portion close to the sensing line is larger than the area of the orthographic projection of the fifth recessed portion on the base substrate. In this way, the display substrate can increase the contact area between the sensing line and the sensing connection line, and the contact is more sufficient, so that the contact resistance is reduced, and an electrical connection effect between the sensing line and the sensing connection line is improved.

Similar to the first recessed portion, from an edge of the fifth recessed portion to a center of the fifth recessed portion, a thickness of the fifth recessed portion in a direction perpendicular to the base substrate continuously and gradually decreases. Since an average thickness of the fifth recessed portion in the direction perpendicular to the base substrate is smaller than a thickness of the third main body portion in the direction perpendicular to the base substrate, a light shielding performance of the fifth recessed portion may be affected. In the display substrate provided in the example, since the thickness of the fifth recessed portion in the direction perpendicular to the base substrate continuously decreases, even if light can penetrate the fifth recessed portion, the fifth recessed portion can also play a role of converging light, so that the ambient light is prevented from penetrating the entire display substrate, and the ambient light is prevented from affecting the normal display of the display substrate. Similarly, a surface of the fifth recessed portion close to the power line is a curved surface or a bent surface.

In some examples, as shown in FIG. 11A, each thickness of the sixth recessed portion 1875C in the direction perpendicular to the base substrate 110 is smaller than the thickness of the third main body portion 1875A in the direction perpendicular to the base substrate 110, an area of a surface of the sixth recessed portion 1875C away from the base substrate 110 is larger than an area of an orthographic projection of the sixth recessed portion 1875C on the base substrate 110. In the display substrate, the third source electrode 1843 of the third color sub-pixel 300C in the first sub-pixel group 391 is connected with the sixth recessed portion 1875C of the sensing connection line 1875 through the sixth contact hole 356. Since the sixth recessed portion 1865C is a recessed structure, an area of the surface of the sixth recessed portion 1865C away from the base substrate 110 is larger than an area of the orthographic projection of the sixth recessed portion 1865C on the base substrate 110. In this way, the display substrate can increase the contact area between the third source electrode of the third color sub-pixel in the first sub-pixel group and the sensing connection line, and the contact is more sufficient, so that the contact resistance is reduced, and an electrical connection effect between the third source electrode of the third color sub-pixel in the first sub-pixel group and the sensing connection line is improved.

Similar to the first recessed portion, from an edge of the sixth recessed portion to a center of the sixth recessed portion, a thickness of the sixth recessed portion in a direction perpendicular to the base substrate continuously and gradually decreases. Since the average thickness of the sixth recessed portion in the direction perpendicular to the base substrate is smaller than the thickness of the third main body portion in the direction perpendicular to the base substrate, thus a light shielding performance of the sixth recessed portion may be affected. In the display substrate provided in the example, since the thickness of the sixth recessed portion in the direction perpendicular to the base substrate continuously decreases, even if light can penetrate the sixth recessed portion, the sixth recessed portion can also play a role of converging light, so that the ambient light is prevented from penetrating the entire display substrate, and the ambient light is prevented from affecting the normal display of the display substrate. Similarly, a surface of the sixth recessed portion close to the power line is a curved surface or a bent surface.

In some examples, as shown in FIG. 11A, each thickness of the seventh recessed portion 1875D in the direction perpendicular to the base substrate 110 is smaller than the thickness of the third main body portion 1875A in the direction perpendicular to the base substrate 110, an area of the surface of the seventh recessed portion 1875D away from the base substrate 110 is larger than an area of an orthographic projection of the seventh recessed portion 1875D on the base substrate 110. In the display substrate, the third source electrode 1843 of the fourth color sub-pixel 300D in the first sub-pixel group 391 is connected with the seventh recessed portion 1875D of the sensing connection line 1875 through the seventh contact hole 357. Since the seventh recessed portion 1875D is a recessed structure, an area of a surface of the seventh recessed portion 1875D away from the base substrate 110 is larger than an area of an orthographic projection of the seventh recessed portion 1875D on the base substrate 110. In this way, the display substrate can increase the contact area between the third source electrode of the fourth color sub-pixel in the first sub-pixel group and the sensing connection line, and the contact is more sufficient, so that the contact resistance is reduced, and an electrical connection effect between the third source electrode of the fourth color sub-pixel in the first sub-pixel group and the sensing connection line is improved.

Similar to the first recessed portion, from an edge of the seventh recessed portion to a center of the seventh recessed portion, a thickness of the seventh recessed portion in the direction perpendicular to the base substrate continuously and gradually decreases. Since an average thickness of the seventh recessed portion in the direction perpendicular to the base substrate is smaller than the thickness of the third main body portion in the direction perpendicular to the base substrate, a light shielding performance of the seventh recessed portion may be affected. In the display substrate provided in the example, since the thickness of the seventh recessed portion in the direction perpendicular to the base substrate continuously decreases, even if light can penetrate the seventh recessed portion, the seventh recessed portion can also play a role of converging light, so that the ambient light is prevented from penetrating the entire display substrate, and the ambient light is prevented from affecting the normal display of the display substrate. Similarly, a surface of the seventh recessed portion close to the power line is a curved surface or a bent surface.

In some examples, as shown in FIG. 11A, each thickness of the eighth recessed portion 1875E in the direction perpendicular to the base substrate 110 is smaller than the thickness of the third main body portion 1875A in the direction perpendicular to the base substrate 110, and an area of a surface of the eighth recessed portion 1875E away from the base substrate 110 is larger than an area of an orthographic projection of the eighth recessed portion 1875E on the base substrate 110. In the display substrate, the third source electrode 1843 of the first color sub-pixel 300A in the second sub-pixel group 392 is connected with the eighth recessed portion 1875E of the sensing connection line 1875 through the eighth contact hole 358. Since the eighth recessed portion 1875E is a recessed structure, the area of the surface of the eighth recessed portion 1865E away from the base substrate 110 is larger than the area of the orthographic projection of the eighth recessed portion 1865E on the base substrate 110. In this way, the display substrate can increase the contact area between the third source electrode of the first color sub-pixel in the second sub-pixel group and the sensing connection line, and the contact is more sufficient, so that the contact resistance is reduced, and an electrical connection effect between the third source electrode of the first color sub-pixel in the second sub-pixel group and the sensing connection line is improved.

Similar to the first recessed portion, from an edge of the eighth recessed portion to a center of the eighth recessed portion, a thickness of the eighth recessed portion in the direction perpendicular to the base substrate continuously and gradually decreases. Since an average thickness of the eighth recessed portion in the direction perpendicular to the base substrate is smaller than the thickness of the third main body portion in the direction perpendicular to the base substrate, a light shielding performance of the eighth recessed portion may be affected. In the display substrate provided in the example, since the thickness of the eighth recessed portion in the direction perpendicular to the base substrate continuously decreases, even if light can penetrate the eighth recessed portion, the eighth recessed portion can also play a role of converging light, so that the ambient light is prevented from penetrating the entire display substrate, and the ambient light is prevented from affecting the normal display of the display substrate. Similarly, a surface of the eighth recessed portion close to the power line is a curved surface or a bent surface.

In some examples, as shown in FIG. 11A, each thickness of the ninth recessed portion 1875F in a direction perpendicular to the base substrate 110 is smaller than the thickness of the third main body portion 1875A in the direction perpendicular to the base substrate 110, an area of a surface of the ninth recessed portion 1875F away from the base substrate 110 is larger than an area of an orthographic projection of the ninth recessed portion 1875F on the base substrate 110. In the display substrate, the third source electrode 1843 of the second color sub-pixel 300B in the second sub-pixel group 392 is connected with the ninth recessed portion 1875F of the sensing connection line 1875 through the ninth contact hole 359. Since the ninth recessed portion 1875F is a recessed structure, the area of the surface of the ninth recessed portion 1865F away from the base substrate 110 is larger than the area of the orthographic projection of the ninth recessed portion 1865F on the base substrate 110. In this way, the display substrate can increase the contact area between the third source electrode of the second color sub-pixel in the second sub-pixel group and the sensing connection line, and the contact is more sufficient, so that the contact resistance is reduced, and the electrical connection effect between the third source electrode of the second color sub-pixel and the sensing connection line in the second sub-pixel group is improved.

Similar to the first recessed portion, from an edge of the ninth recessed portion to a center of the ninth recessed portion, a thickness of the ninth recessed portion in the direction perpendicular to the base substrate continuously and gradually decreases. Since an average thickness of the ninth recessed portion in the direction perpendicular to the base substrate is smaller than the thickness of the third main body portion in the direction perpendicular to the base substrate, a light shielding performance of the ninth recessed portion may be affected. In the display substrate provided in the example, since the thickness of the ninth recessed portion in the direction perpendicular to the base substrate continuously decreases, even if light can penetrate the ninth recessed portion, the ninth recessed portion can also play a role of converging light. So that the ambient light is prevented from penetrating the entire display substrate, and the ambient light is prevented from affecting the normal display of the display substrate. Similarly, a surface of the ninth recessed portion close to the power line is a curved surface or a bent surface.

In some examples, as shown in FIG. 11A, an orthographic projection of at least one of the fifth recessed portion 1875B, the sixth recessed portion 1875C, the seventh recessed portion 1875D, the eighth recessed portion 1875E, and the ninth recessed portion 1875F on the base substrate 110 at least partially overlaps with an orthographic projection of the color filter 350 in the color filter layer 200 on the base substrate 110, it can effectively prevent the uneven display caused by ambient light and avoid affecting the appearance.

In some examples, as shown in FIG. 11A, in the second direction, the sensing connection line 1875 is located on a side of the second gate line 162 away from the first gate line 161, an orthographic projection of the second color filter 352 in the first sub-pixel group 391 on the base substrate 110 at least partially overlaps with an orthographic projection of the sixth recessed portion 1875C of the first sub-pixel group 391 adjacent in the second direction on the base substrate 110. In this way, even if the light shielding performance of the sixth recessed portion is affected due to its thin thickness, the second color filter in the first sub-pixel group can also further shield the sixth recessed portion, so that the ambient light can be prevented from penetrating the entire display substrate, and the ambient light can be prevented from affecting the normal display of the display substrate.

In addition, in a case that the thickness of the sixth recessed portion in the direction perpendicular to the base substrate continuously decreases from the edge of the sixth recessed portion to the center of the sixth recessed portion, even if light passes through the sixth recessed portion, the sixth recessed portion can focus the light on the second color filter mentioned above, so that the ambient light can be effectively prevented from penetrating the entire display substrate.

In some examples, as shown in FIG. 11A, an orthographic projection of the third color filter 353 in the first sub-pixel group 391 on the base substrate 110 at least partially overlaps with an orthographic projection of the seventh recessed portion 1875D of the first sub-pixel group 391 adjacent in the second direction on the base substrate 110. In this way, even if the light shielding performance of the seventh recessed portion is affected due to its thin thickness, the third color filter in the first sub-pixel group can further shield the seventh recessed portion, so that the ambient light can be prevented from penetrating the entire display substrate, and the ambient light can be prevented from affecting the normal display of the display substrate.

In addition, in a case that the thickness of the seventh recessed portion in the direction perpendicular to the base substrate continuously decreases from the edge of the seventh recessed portion to the center of the seventh recessed portion, even if light passes through the seventh recessed portion, the seventh recessed portion can focus the light on the third color filter mentioned above, so that the ambient light can be effectively prevented from penetrating the entire display substrate.

In some examples, as shown in FIG. 11A, an orthographic projection of the first color filter 351 in the second sub-pixel group 392 on the base substrate 110 at least partially overlaps with an orthographic projection of the ninth recessed portion 1875F adjacent in the second direction on the base substrate 110. In this way, even if the light shielding performance of the ninth recessed portion is affected due to its thin thickness, the first color filter in the second sub-pixel group can further shield the ninth recessed portion, so that the ambient light can be prevented from penetrating the entire display substrate, and the ambient light can be prevented from affecting the normal display of the display substrate.

In addition, in a case that the thickness of the ninth recessed portion in the direction perpendicular to the base substrate continuously decreases from the edge of the ninth recessed portion to the center of the ninth recessed portion, even if light passes through the ninth recessed portion, the ninth recessed portion can focus the light on the first color filter mentioned above, so that the ambient light can be effectively prevented from penetrating the entire display substrate.

For example, as shown in FIG. 11A, an overlapping area between the orthographic projection of the third color filter 351 on the base substrate 110 and the orthographic projection of the sensing recessed portion 1875K on the base substrate 110 is larger than an overlapping area between the orthographic projection of the first color filter 351 on the base substrate 110 and the orthographic projection of the sensing recessed portion 1875K on the base substrate 110, or an overlapping area between the orthographic projection of the second color filter 352 on the base substrate 110 and the orthographic projection of the sensing recessed portion 1875K on the base substrate 110.

In some examples, as shown in FIG. 11A, in the sub-pixel group 390, an orthographic projection of the first color filter 351 on the base substrate 110 at least partially overlaps with an orthographic projection of the power connection line 1865 on the base substrate 110, so that capacitance values of various capacitors in the pixel driving circuits can be adjusted, to achieve a better electrical performance. An orthographic projection of the second color filter 352 on the base substrate 110 is at least partially overlaps with an orthographic projection of the power connection line 1865 on the base substrate 110 and an orthographic projection of the first gate line 161 on the base substrate 110, respectively, so that capacitance values of various capacitors in the pixel driving circuits can also be adjusted, to achieve a better electrical performance. An orthographic projection of the third color filter 353 on the base substrate 110 at least partially overlaps with an orthographic projection of the power connection line 1865 on the base substrate 110, so that capacitance values of various capacitors in the pixel driving circuits can also be adjusted, to achieve a better electrical performance.

In some examples, as shown in FIG. 11A, in the sub-pixel group 390, an orthographic projection of the first color filter 351 on the base substrate 110 at least partially overlaps with an orthographic projection of the sensing connection line 1875 on the base substrate 110, an orthographic projection of the second color filter 352 on the base substrate 110 at least partially overlaps with an orthographic projection of the sensing connection line 1875 on the base substrate 110, respectively, and an orthographic projection of the third color filter 353 on the base substrate 110 at least partially overlaps with an orthographic projection of the sensing connection line 1875 on the base substrate 110. Therefore, the display substrate can adjust the capacitance values of various capacitors in the pixel driving circuits by adjusting an overlapping relationship between the color filter and the sensing connection line, and then a better electrical performance is achieved. In some examples, as shown in FIG. 11A, the data line 185 includes a first data line 185A, a second data line 185B, a third data line 185C, and a fourth data line 185D; in the sub-pixel group 390, the first data line 185A and the second data line 185B are located between the first color sub-pixel 300A and the second color sub-pixel 300B, the first data line 185A is located on a side of the second data line 185B away from the second color sub-pixel 300B; the first data line 185A is connected with the second source electrode 1842 of the first color sub-pixel 300A, the second data line 185B is connected with the second source electrode 1842 of the second color sub-pixel 300B, the third data line 185C and the fourth data line 185D are located between the third color sub-pixel 300C and the fourth color sub-pixel 300D, the third data line 185 is located on a side of the fourth data line 185D away from the fourth color sub-pixel 300D; the third data line 185C is connected with the second source electrode 1842 of the third color sub-pixel 300C, and the fourth data line 185D is connected with the second source electrode 1842 of the fourth color sub-pixel 300D. In this way, the display substrate drives one sub-pixel column through one data line.

In some examples, as shown in FIG. 11A, in the sub-pixel group 390, an orthographic projection of the first color filter 351 on the base substrate 110 at least partially overlaps with an orthographic projection of the second data line 185A on the base substrate 110, an orthographic projection of the second color filter 352 on the base substrate 110 at least partially overlaps with an orthographic projection of the third data line 185C on the base substrate 110, and an orthographic projection of the third color filter 353 on the base substrate 110 at least partially overlaps with an orthographic projection of the fourth data line 185D on the base substrate 110.

In some examples, as shown in FIG. 11A, the display substrate 100 further includes: a fourth via hole 264, which is located in the interlayer insulating layer 170, and the second drain electrode 1842 is connected with the conductive block 147 through the fourth via hole 264. The conductive light-shielding structure 122 further includes: a second insulating portion 1222, and an orthographic projection of the second insulating portion 1222 on the base substrate 110 at least partially overlaps with an orthographic projection of the fourth via hole 264 on the base substrate 110. The above-mentioned second insulating portion is a part of the conductive light-shielding structure, and with respect to other parts of the conductive light-shielding structure, the second insulating portion is insulated from other parts. In the display substrate, in a case that a part of the second drain electrode region is missing due to the semiconductor layer itself is thin, and in a case that the etchant is etched from the second drain electrode region down to the second insulating portion, since the second insulating portion is insulated from other parts of the conductive light-shielding structure, even if the second drain electrode is connected with the second insulating portion through the third via hole, it will not cause the second drain electrode to be electrically connected with other parts of the conductive light shielding structure. In this way, the display substrate can reduce a process risk, and the yield of the display substrate is improved.

In some examples, as shown in FIG. 10A, the second insulating portion 1222 includes a second hollow portion 1222A, and the second hollow portion 1222A is filled with a material of the buffer layer 130. Thus, the second insulating portion 1222 can be insulated from other parts of the conductive light-shielding structure 122 through the second hollow portion 1222A. It should be noted that, the second insulating portion 1222 itself can be the second hollow portion 1222A, that is, the second insulating portion 1222 can be a part where the conductive light shielding structure 122 is removed.

In some examples, as shown in FIG. 10B, the second hollow portion 1222A may be a second hollow ring, that is, the second hollow portion may be a ring-shaped hollow portion. Both an inner part of the second hollow ring 1222A and an outer side of the second hollow ring 1222A are made of a material of the conductive light-shielding structure 122. In this way, the second insulating portion 1222 can be insulated from other parts of the conductive light-shielding structure 122 by arranging the second hollow ring 1222A.

In some examples, as shown in FIG. 10C, the second insulating portion 1222 is an oxidation portion. That is, a part of the conductive light-shielding structure 122 can be oxidized through an oxidation process, to form the above-mentioned second insulating portion 1222.

In some examples, as shown in FIG. 11A, shapes of orthographic projections of the first via hole 261 and the fourth via hole 264 on the base substrate 110 are both anisotropic patterns, and both include long sides.

In some examples, as shown in FIG. 11A, in the sub-pixel group 390, a long side or an extension direction of the first via hole 261 of the second color sub-pixel 300B and a long side of the first via hole 261 of the third color sub-pixel 300C both extend along the first direction; and both a long side of the first via hole 261 of the first color sub-pixel 300A and a long side of the first via hole 261 of the fourth color sub-pixel 300D extend along the second direction. In the pixel driving circuits of the second color sub-pixel 300B and the pixel driving circuits of the third color sub-pixel 300C, since the power signals flow from the first source electrodes 1821 of the first thin film transistors T1 to the first drain electrodes 1841, and the direction from the first source electrodes 1821 to the first drain electrodes 1841 is the second direction, by extending the long side or the extending direction of the first via hole 261 of the second color sub-pixel 300B and the long side of the first via hole 261 of the third color sub-pixel 300C in the first direction, a size of the first via hole 261 of the second color sub-pixel 300B and a size of the first via hole 261 of the third color sub-pixel 300C in the first direction can be made larger, and thus a current flowing through has a larger cross-sectional area, so that a contact resistance can be reduced.

In some examples, as shown in FIG. 11A, in the sub-pixel group 390, a long side of the fourth via hole 264 of the second color sub-pixel 300B and a long side of the fourth via hole 264 of the third color sub-pixel 300C both extend along the second direction, and the long side of the fourth via hole 264 of the first color sub-pixel 300A and the long side of the fourth via hole 264 of the fourth color sub-pixel 300D both extend along the first direction.

Figure 12:
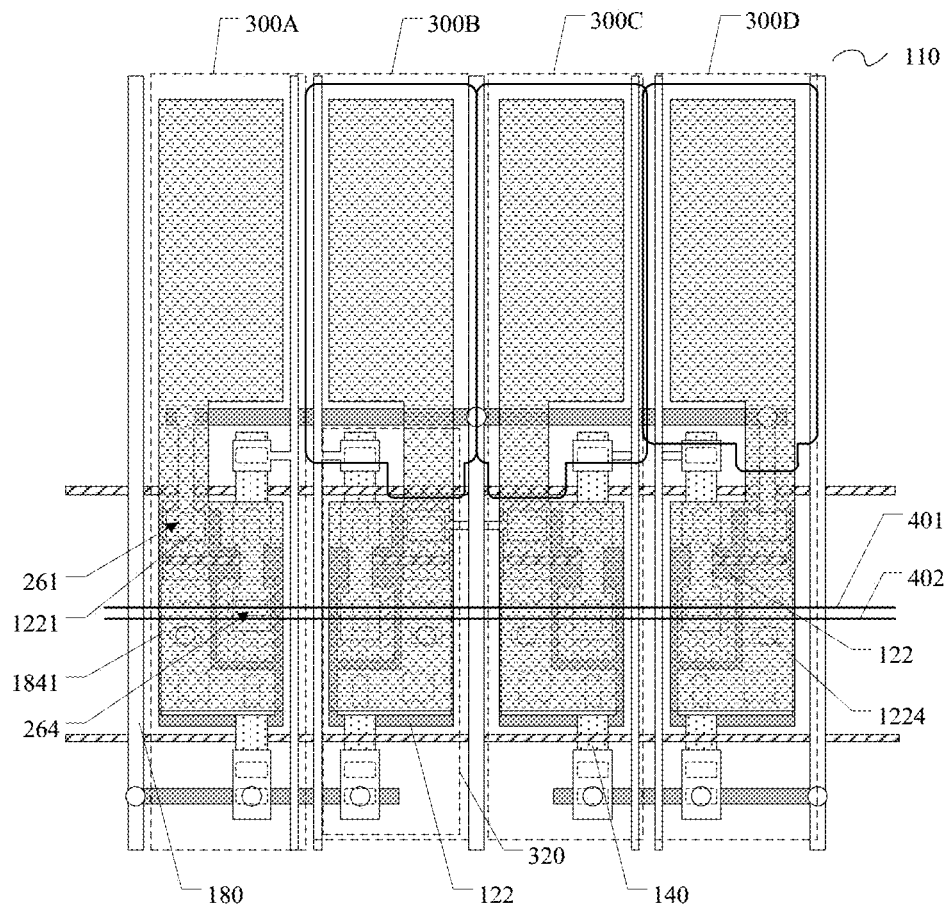
FIG. 12 is a planar schematic diagram of another display substrate provided by an embodiment of the present disclosure.

FIG. 12 is a planar schematic diagram of another display substrate provided by an embodiment of the present disclosure. As shown in FIG. 12, since the sub-pixels of different colors can use the thin film transistors with different aspect ratios, positions of the fourth via holes of the sub-pixels of different colors may be different. For example, as shown in FIG. 12, in the sub-pixel group 390, a center of the fourth via hole 264 of the first color sub-pixel 300A, a center of the fourth via hole 264 of the second color sub-pixel 300B, a center of the fourth via hole 264 of the third color sub-pixel 300C, and a center of the fourth via hole 264 of the fourth color sub-pixel 300D are misaligned in the second direction; the center of the fourth via hole 264 of the first color sub-pixel 300A and the center of the fourth via hole 264 of the fourth color sub-pixel 300D are located at a first virtual straight line 401, and the center of the fourth via hole 264 of the second color sub-pixel 300B and the center of the fourth via hole 264 of the third color sub-pixel 300C are located at a second virtual straight line 402 parallel to the first virtual straight line. In this way, a regular bright line formed by the reflection of ambient light passing through the fourth via hole of the first color sub-pixel 300A, the fourth via hole of the second color sub-pixel 300B, the fourth via hole of the third color sub-pixel 300C, and the fourth via hole of the fourth color sub-pixel 300D can be prevented, so that the display quality can be improved.

Figure 13:
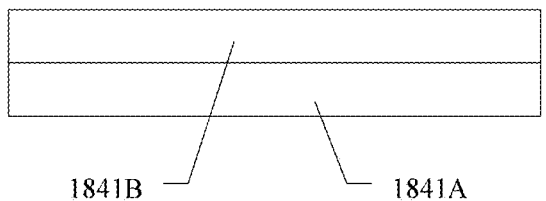
FIG. 13 is a cross-sectional schematic diagram of a first drain electrode in a display substrate provided by an embodiment of the present disclosure.

FIG. 13 is a cross-sectional schematic diagram of a first drain electrode in a display substrate provided by an embodiment of the present disclosure. As shown in FIG. 13, the conductive layer 180 or the first drain electrode 1841 includes a first sub metal layer 1841A and a second sub metal layer 1841B which are stacked in the direction perpendicular to the base substrate 110; a material of the first sub metal layer 1841A is copper, and a material of the second sub metal layer 1841B is a molybdenum titanium alloy.

Figure 14:
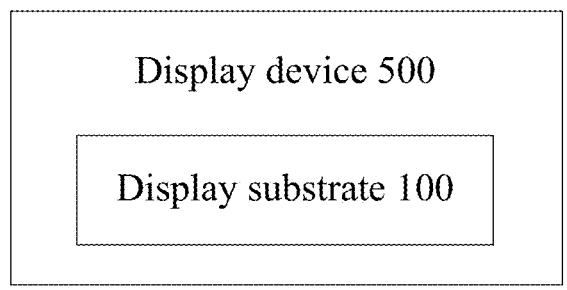
FIG. 14 is a schematic diagram of a display device provided by an embodiment of the present disclosure.

An embodiment of the present disclosure further provides a display device. FIG. 14 is a schematic diagram of a display device provided by an embodiment of the present disclosure. As shown in FIG. 14, the display device 500 includes the above-mentioned display substrate 100. In this way, the display device has beneficial technical effects corresponding to the technical effects of the display substrate included in the display device. For example, in the display device, the conductive structure is connected with the first recessed portion through the first contact hole. Since the first recessed portion is recessed into the conductive light-shielding structure, the area of the surface of the first recessed portion close to the conductive layer is larger than the area of the orthographic projection of the first recessed portion on the base substrate. In this way, the contact area between the conductive structure, for example, the first drain electrode, and the conductive light-shielding structure is increased, and the contact is more sufficient, so that the contact resistance is reduced, the electrical connection effect between the conductive structure and the conductive light-shielding structure is improved, and a charge and discharge efficiency of the capacitor formed by the conductive structure can be effectively improved.

For example, the display device is a television, a tablet computer, a notebook computer, an electronic picture frame, a navigator, a smart phone, and other electronic products.

Figure 15:
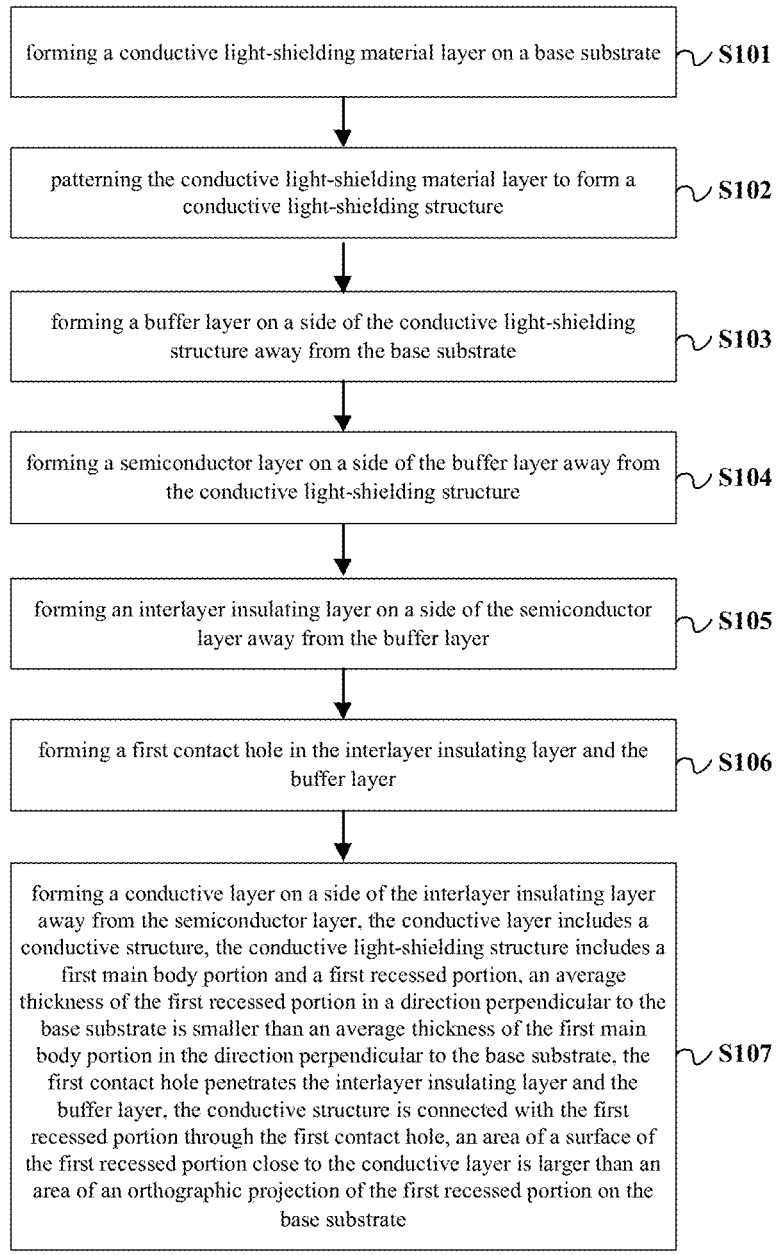
FIG. 15 is a flowchart of a manufacturing method of a display substrate provided by an embodiment of the present disclosure.

An embodiment of the present disclosure further provides a manufacturing method of the display substrate. FIG. 15 is a flowchart of a manufacturing method of a display substrate provided by an embodiment of the present disclosure. As shown in FIG. 15, the manufacturing method of the display substrate includes the following steps S101-S107.

Step S101: forming a conductive light-shielding material layer on a base substrate.

For example, the base substrate is a transparent substrate made of inorganic materials such as glass substrate. In addition, the base substrate can also be a transparent substrate made of organic materials such as polyimide, polycarbonate, and polyethylene terephthalate.

For example, the base substrate is a flexible substrate, such as a polyimide substrate. Of course, the embodiments of the present disclosure include but are not limited to this, and the base substrate can also be a rigid substrate.

For example, a material of the conductive light-shielding material layer is at least one selected from the group consisting of molybdenum and titanium. Of course, the embodiments of the present disclosure include but are not limited to this, and the material of the conductive light-shielding material layer can also be other materials.

For example, a film forming process such as a sputtering process or a vapor deposition process may be used to form a conductive light-shielding material layer on the base substrate.

Step S102: patterning the conductive light-shielding material layer to form a conductive light-shielding structure.

For example, the process of patterning the conductive light-shielding material layer includes exposing, developing, and etching processes.

For example, a photoresist can be coated on the conductive light-shielding material layer first, then a photoresist pattern is formed on the conductive light-shielding material layer through the exposing and developing processes, and then the photoresist pattern is used to etch the conductive light-shielding material, finally, the photoresist pattern is stripped, and a conductive light-shielding structure is formed.

Step S103: forming a buffer layer on a side of the conductive light-shielding structure away from the base substrate.

For example, a material of the buffer layer may be at least one selected from the group consisting of silicon nitride, silicon oxide, and silicon oxynitride.

For example, a thickness of the buffer layer ranges from 380 nanometers to 420 nanometers. Of course, the embodiments of the present disclosure include but are not limited to this, and the thickness of the buffer layer can be arranged according to actual requirements.

Step S104: forming a semiconductor layer on a side of the buffer layer away from the conductive light-shielding structure.

For example, a material of the semiconductor layer is an oxide semiconductor, such as indium gallium zinc oxide (IGZO).

For example, a vapor deposition process is used to form a semiconductor layer on the side of the buffer layer away from the conductive light-shielding structure. Of course, the embodiments of the present disclosure include but are not limited to this, other suitable processes can also be used to form the semiconductor layer.

For example, a thickness of the semiconductor layer ranges from 35 nanometers to 45 nanometers, such as 40 nanometers. Of course, the embodiments of the present disclosure include but are not limited to this, and the thickness of the semiconductor layer can be arranged according to actual requirements.

Step S105: forming an interlayer insulating layer on a side of the semiconductor layer away from the buffer layer.

For example, a material of the interlayer insulating layer may be at least one selected from the group consisting of silicon nitride, silicon oxide, and silicon oxynitride. Of course, the embodiments of the present disclosure include but are not limited to this, and the material of the interlayer insulating layer may also be other materials. It should be noted that the material of the interlayer insulating layer and the material of the buffer layer can be the same or different, even if the materials of the interlayer insulating layer and the buffer layer are the same, the interlayer insulating layer and the buffer layer can be made at different process temperatures, so that densities of the formed films are also different, so that a slope angle of the interlayer insulating layer is different from a slope angle of the buffer layer which are etched.

For example, a thickness of the interlayer insulating layer ranges from 350 nanometers to 600 nanometers, such as 400 nanometers. Of course, the embodiments of the present disclosure include but are not limited to this, and the thickness of the interlayer insulating layer can be arranged according to actual requirements.

Step S106: forming a first contact hole in the interlayer insulating layer and the buffer layer.

For example, an etching process (such as a wet etching process) is used to form the first contact hole in the interlayer insulating layer and the buffer layer.

Step S107: forming a conductive layer on a side of the interlayer insulating layer away from the semiconductor layer, in which the conductive layer includes a conductive structure, such as a first drain electrode, the conductive light-shielding structure includes a first main body portion and a first recessed portion, an average thickness of the first recessed portion in a direction perpendicular to the base substrate is smaller than an average thickness of the first main body portion in the direction perpendicular to the base substrate, the first contact hole penetrates the interlayer insulating layer and the buffer layer, the conductive structure is connected with the first recessed portion through the first contact hole, an area of a surface of the first recessed portion close to the conductive layer is larger than an area of an orthographic projection of the first recessed portion on the base substrate.

In the manufacturing method of the display substrate provided by the embodiment of the present disclosure, the conductive light-shielding structure includes the first main body portion and the first recessed portion, and the first drain electrode is connected with the first recessed portion through the first contact hole. Since the first recessed portion is recessed into the conductive light-shielding structure, the area of the surface of the first recessed portion close to the first drain electrode is larger than the area of the orthographic projection of the first recessed portion on the base substrate. In this way, the display substrate manufactured by the manufacturing method of the display substrate can increase a contact area between the first drain electrode and the conductive light-shielding structure, and the contact is more sufficient, so that a contact resistance is reduced, an electrical connection effect between the first drain electrode and the conductive light-shielding structure is improved, and a charge and discharge efficiency of a capacitor formed by the conductive structure can be effectively improved.

For example, a material of the conductive layer is at least one selected from the group consisting of copper, molybdenum, and titanium. Of course, the embodiments of the present disclosure include but are not limited to this, and the conductive layer can also be made of other materials.

In some examples, a thickness of the conductive light-shielding structure in the direction perpendicular to the base substrate ranges from 90 nanometers to 120 nanometers, and a thickness of the conductive layer in the direction perpendicular to the base substrate ranges from 200 nanometers to 600 nanometers.

In some examples, in the manufacturing method of the display substrate, forming the first contact hole in the interlayer insulating layer and the buffer layer includes: forming a first buffer portion and a second buffer portion in the buffer layer, a side of the first buffer portion away from the base substrate is arranged in contact with the conductive layer, and a side of the first buffer portion close to the base substrate is arranged in contact with the conductive light-shielding structure, a side of the second buffer portion away from the base substrate is arranged in contact with the interlayer insulating layer, and a side of the second buffer portion close to the base substrate is arranged in contact with the conductive light-shielding structure. In this way, in a case that the above-mentioned conductive structure is deposited in the first contact hole, the first buffer portion can play a role of supporting a part of the conductive structure, the conductive structure is prevented from disconnecting caused by too large drop or too large slope angle. Therefore, the display substrate has a higher yield.

In some examples, the first contact hole includes side walls, the side walls at least include: a first sub side wall, located in the interlayer insulating layer; and a second sub side wall, located in the buffer layer, in which an included angle between the first sub side wall and the base substrate constitutes a first slope angle, an included angle between the second side wall and the base substrate constitutes a second slope angle, the first slope angle is smaller than the second slope angle; a contact portion between the second sub side wall and the first buffer portion is located between the first buffer portion and the second buffer portion.

In some examples, the side walls of the first contact hole further include: a third sub side wall, located in the first buffer portion, an included angle between the third sub side wall and the base substrate constitutes a third slope angle, and the first slope angle, the second slope angle, and the third slope angle are different from each other. Detailed descriptions of the side walls of the first contact hole can be referred to the related descriptions of FIG. 6A and FIG. 6B, which are omitted herein.

In some examples, the manufacturing method of the display substrate further includes: forming a planarization layer on a side of the conductive layer, for example, a source and drain metal layer, away from the interlayer insulating layer, in which the planarization layer includes an anode hole; and forming an anode layer on a side of the planarization layer away from the conductive layer to form a plurality of sub-pixels on the base substrate, in which each of the plurality of sub-pixels includes an anode, the anode includes a light emitting portion, a driving portion and an extension portion connecting the light emitting portion and the driving portion, and the driving portion is at least partially located in the anode hole; in at least one of the sub-pixels, an orthographic projection of the first contact hole on the base substrate at least partially overlaps with an orthographic projection of the driving portion on the base substrate, the display substrate further includes: a power line, located in the conductive layer; and a sensing line, located in the conductive layer; the power line and the sensing line are arranged in a first direction, both the power line and the sensing line extend along a second direction that intersects the first direction; The plurality of sub-pixels include a first sub-pixel pair and a second sub-pixel pair, the first sub-pixel pair includes two sub-pixels, which are respectively located on two sides of the power line, the second sub-pixel pair includes two sub-pixels, which are respectively located on two sides of the sensing line; the first sub-pixel pair and the second sub-pixel pair are alternately arranged in the first direction, in the two sub-pixels in the second sub-pixel pair, a first overlapping region is provided between an orthographic projection of the anode hole on the base substrate and an orthographic projection of the first recessed portion on the base substrate, and an area of the first overlapping region is smaller than an area of an orthographic projection of the first contact hole on the base substrate. In this way, in the two sub-pixels in the second sub-pixel pair, the first overlapping region is provided between the anode hole and the first recessed portion, in this way, in a case that the light shielding performance of the first recessed portion is reduced due to its thinning, the anode at a position of the anode hole has a curved interface, so that light can be focused, and thus the light passing through the first recessed portion is prevented from affecting the normal display of the display substrate.

In some examples, the anode further includes a concave structure at an edge position of the anode hole, a concave direction of the concave structure faces the conductive light-shielding structure. In this way, in a case that the light shielding performance of the first recessed portion is reduced due to its thinning, since the concave structure has at least two inclined surfaces, the concave structure can reflect light passing through the first recessed portion. In addition, since the concave structure itself is a microstructure, the concave structure can also scatter light passing through the first recessed portion, so that the light passing through the first recessed portion is further prevented from affecting the normal display of the display substrate. It should be noted that, the above-mentioned edge position of the anode hole refers to a boundary between the anode hole and a surface of the planarization layer away from the semiconductor layer.

In some examples, the conductive layer further includes a first source electrode and a first drain electrode, and the conductive structure is the first drain electrode.

In some examples, the conductive layer further includes the first source electrode, the semiconductor layer includes a first active layer, the first active layer includes a first channel region and a first source electrode region and a first drain electrode region that are located on two sides of the first channel region, the manufacturing method of the display substrate further includes: forming a first contact hole in the interlayer insulating layer and the buffer layer, and at the same time forming a first via hole and a second via hole in the interlayer insulating layer, the first source electrode is connected with the first source electrode region through the first via hole, and the first drain electrode is connected with the first drain electrode region through the second via hole.

In some examples, a same etching process is used to simultaneously pattern the interlayer insulating layer and the buffer layer to form the first via hole and the first contact hole. In this case, even if a size of a bottom of the first contact hole is small, since the area of the surface of the first recessed portion close to the first drain is larger than the area of the orthographic projection of the first recessed portion on the base substrate, the display substrate manufactured by the manufacturing method of the display substrate can increase a contact area between the first drain electrode and the conductive light-shielding structure, and the contact is more sufficient, so that the contact resistance is reduced, and an electrical connection effect between the first drain electrode and the conductive light-shielding structure is improved.

In some examples, a halftone mask process is also used to pattern the interlayer insulating layer and the buffer layer to form the first via hole and the first contact hole.

For example, the using a halftone mask process to pattern the interlayer insulating layer and the buffer layer to form the first via hole and the first contact hole includes: forming a first photoresist on a side of the interlayer insulating layer away from the base substrate; exposing and developing the first photoresist by using a first halftone mask, to form a first photoresist pattern including a first photoresist completely removed portion, a first photoresist partially removed portion, and a first photoresist remaining portion; etching the interlayer insulating layer by using the first photoresist pattern as a mask, to remove the interlayer insulating layer corresponding to the first photoresist completely removed portion; ashing the first photoresist pattern, removing the first photoresist partially removed portion and thinning the first photoresist remaining portion to form a second photoresist pattern; and etching the buffer layer by using the second photoresist pattern as a mask, in which an orthographic projection of the first contact hole on the base substrate overlaps with an orthographic projection of the first photoresist completely removed portion on the base substrate, and an orthographic projection of the first via hole on the base substrate overlaps with an orthographic projection of the first photoresist partially removed portion on the base substrate. It should be noted that the above-mentioned "overlap" includes a case of completed overlapping and a case of roughly overlapping (a degree of the overlapping is greater than 80%).

In some examples, the conductive light-shielding structure further includes a first insulating portion, an orthographic projection of the first insulating portion on the base substrate at least partially overlaps with an orthographic projection of the first via hole on the base substrate, and an orthographic projection of the first insulating portion on the base substrate at least partially overlaps with an orthographic projection of the first source electrode region on the base substrate. The above-mentioned first insulating portion is a part of the conductive light-shielding structure, and with respect to other parts of the conductive light-shielding structure, the first insulating portion is insulated from other parts. In a case that the first source electrode region is partially missing due to the semiconductor layer itself is thin, and in a case that an etchant is etched from the first source electrode region down to the first insulating portion, since the first insulating portion is insulated from other parts of the conductive light-shielding structure, even if the first source electrode is connected with the first insulating portion through the first via hole, the first source electrode will be not caused to be electrically connected to other parts of the conductive light-shielding structure. In this way, the display substrate can reduce a process risk, and improves a yield.

For example, as shown in FIG. 10A, the first insulating portion 1221 includes a first hollow portion 1221A, and the first hollow portion 1221A is filled with a material of the buffer layer 130. In this way, the first insulating portion 1221 may be insulated from other parts of the conductive light-shielding structure 122 through the first hollow portion 1221A. It should be noted that, the first insulating portion 1221 itself may be the first hollow portion 1221A, that is, the first insulating portion 1221 may be a part where the conductive light-shielding structure 122 is removed.

For example, as shown in FIG. 10B, the first hollow portion 1221A is a first hollow ring, that is, the first hollow portion may be a ring-shaped hollow portion. Both an inner part of the first hollow ring 1221A and an outer side of the first hollow ring 1221A are made of the material of the conductive light-shielding structure 122. In this way, the first insulating portion 1221 can be insulated from other parts of the conductive light-shielding structure 122 by arranging the first hollow ring 1221A.

For example, as shown in FIG. 10C, the first insulating portion 1221 is an oxidation portion. That is, a part of the conductive light-shielding structure 122 can be oxidized through an oxidation process, to form the above-mentioned first insulating portion 1221.

In some examples, in a case that the first insulating portion is the first insulating portion 1221 shown in FIGS. 10A and 10B, patterning the conductive light-shielding material layer to form the conductive light-shielding structure includes: patterning the conductive light-shielding material layer through a same patterning process to form the first main body portion, the first recessed portion, and the first hollow portion. That is, the first recessed portion and the first hollow portion are formed in a same patterning process, a masking process can be reduced, and a cost is reduced.

In some examples, patterning the conductive light-shielding material layer to form a conductive light-shielding structure includes: forming a photoresist on a side of the conductive light-shielding structure away from the base substrate; exposing and developing the photoresist by using a second halftone mask, to form a third photoresist pattern including a second photoresist completely removed portion, a second photoresist partially removed portion, and a second photoresist remaining portion; etching the conductive light-shielding material layer by using the third photoresist pattern as a mask, to remove the conductive light-shielding material layer corresponding to the completely removed portion of the second photoresist; ashing the third photoresist pattern, removing the second photoresist partially removed portion and thinning the second photoresist remaining portion to form a fourth photoresist pattern; and etching the conductive light-shielding material layer by using the fourth photoresist pattern as a mask, in which an orthographic projection of the first main body portion on the base substrate overlaps with an orthographic projection of the second photoresist remaining portion on the base substrate, and an orthographic projection of the first recessed portion on the base substrate overlaps with an orthographic projection of the second photoresist partially removed portion on the base substrate. In this way, the manufacturing method can realize the formation of the first recessed portion and the first hollow portion in a same mask process by using the halftone mask, so that the masking process can be reduced, and the cost is reduced. It should be noted that, the above-mentioned "overlap" includes a complete overlapping and a roughly overlapping (a degree of overlapping is greater than 80%).

In some examples, the first recessed portion includes a first edge portion, in a direction from an edge of the first recessed portion to a center of the first recessed portion, a thickness of at least a part of the first recessed portion close to the edge, for example, a first edge portion, in the direction perpendicular to the base substrate continuously and gradually decreases. Since an average thickness of the first recessed portion in the direction perpendicular to the base substrate is smaller than an average thickness of the first main body portion in the direction perpendicular to the base substrate, so that the light shielding performance of the first recessed portion may be affected. Since the thickness of the first recessed portion in the direction perpendicular to the base substrate continuously and gradually decreases, even if light can penetrate the first recessed portion, the first recessed portion can also play a role of converging light, so that the ambient light is prevented from penetrating the entire display substrate, and the ambient light is prevented from affecting the normal display of the display substrate.

In some examples, in the direction perpendicular to the base substrate, at least a part of the first recessed portion close to the edge, that is, a slope angle of the first edge portion close to the conductive layer is continuously changed. In this way, even if light can penetrate the first recessed portion, the first recessed portion can also play a role of converging light, so that the light is prevented from penetrating the entire display substrate to be observed by a user.

In some examples, a surface of the first recessed portion close to the first drain electrode is a continuous arc surface, or is a combined surface composed of at least one segment of a continuous arc surface and at least one segment of a plane. The combined surface composed of at least one segment of a continuous arc surface and at least one segment of a plane, can play a role of converging light, in this way, even if light can penetrate the first recessed portion, the first recessed portion can prevent the light from penetrating the entire display substrate to be observed by the user.

In some examples, the orthographic projection of the first contact hole on the base substrate at least partially overlaps with the orthographic projection of the first recessed portion on the base substrate. In this way, the first drain electrode in the conductive layer can be connected with the first recessed portion through the first contact hole.

In some examples, the fourth slope angle α of a surface of the first edge portion close to the conductive layer satisfies the following formula:

$$0<\alpha<k*H/L\text{max}$$

in which Lmax is a maximum aperture of the orthographic projection of the first recessed portion on the base substrate, H is an average thickness of the first main body portion, and k is a constant greater than 1 and less than or equal to 2.

In some examples, k is equal to 2, a range of the fourth slope angle is from 1 to π/18.

For example, a size range of an orthographic projection of the first recessed portion on the base substrate in a direction parallel to the base substrate is from 5 microns to 10 microns.

In some examples, forming the first contact hole in the interlayer insulating layer and the buffer layer includes: forming a first buffer portion and a second buffer portion in the buffer layer, in which the first buffer portion is located in the first contact hole, and is arranged in contact with the conductive light-shielding structure, and the second buffer portion is located on a side of the first buffer portion away from the center of the first recessed portion.

In some examples, forming the conductive layer on a side of the interlayer insulating layer away from the semiconductor layer may include: forming a source and drain metal material layer on a side of the interlayer insulating layer away from the semiconductor layer, for example, forming a source and drain metal material layer on a side of the interlayer insulating layer away from the semiconductor layer by using a deposition process; and then etching the source and drain metal material layer by using a mask, to form a conductive layer including the above-mentioned first drain electrode.

In some examples, the manufacturing method of the display substrate further includes: forming a passivation layer on a side of the conductive layer away from the base substrate; forming a color filter layer on a side of the passivation layer away from the conductive layer; forming a planarization layer on a side of the color filter layer away from the passivation layer; and forming an anode layer on a side of the planarization layer away from the color filter layer.

For example, a material of the planarization layer is an organic material such as organic resin. Of course, the embodiments of the present disclosure include but are not limited to this.

For example, each of the sub-pixels further includes an anode located on the anode layer. The display substrate further includes a third via hole located in the passivation layer, and the anode is connected with the first drain electrode through the third via hole. In this way, the display substrate can apply a driving current to the anode through the first thin film transistor, to drive the light emitting layer corresponding to the anode to light emitting display.

In some examples, the manufacturing method of the display substrate further includes: forming a pixel definition layer on a side of the anode layer away from the color filter layer. The pixel definition layer may include a plurality of openings, the plurality of openings are arranged in one-to-one correspondence with the anodes of the plurality of sub-pixels, and each of the openings partially exposes the corresponding anode.

In some examples, the manufacturing method of the display substrate further includes: forming a light emitting layer on a side of the pixel definition layer away from the anode layer. The light emitting layer is in contact with exposed parts of the anodes of the plurality of sub-pixels through the plurality of openings mentioned above.

In some examples, the manufacturing method of the display substrate further includes: forming a cathode on a side of the light emitting layer away from the anode. In this way, the anode, the light emitting layer and the cathode can constitute a light emitting unit.

The following points required to be explained:

(1) the drawings of the embodiments of the present disclosure only relate to the structures related to the embodiments of the present disclosure, and other structures can refer to the general design.

(2) without conflict, the embodiments of the present disclosure and the features in the embodiments may be combined with each other to obtain new embodiments.

What are described above is related to only the illustrative embodiments of the present disclosure and not limitative to the protection scope of the present application. Therefore, the protection scope of the present application shall be defined by the accompanying claims.

What is claimed is:

1. A display substrate, comprising a base substrate and a plurality of sub-pixels located on the base substrate, wherein each of the plurality of sub-pixels comprises:
   a conductive light-shielding structure, located on the base substrate;
   a buffer layer, located on a side of the conductive light-shielding structure away from the base substrate;
   a semiconductor layer, located on a side of the buffer layer away from the conductive light-shielding structure;
   an interlayer insulating layer, located on a side of the semiconductor layer away from the buffer layer; and
   a conductive layer, located on a side of the interlayer insulating layer away from the semiconductor layer, and comprising a conductive structure,
   wherein the conductive light-shielding structure comprises a first main body portion and a first recessed portion, the display substrate further comprises a first contact hole, the first contact hole penetrates both the interlayer insulating layer and the buffer layer, the conductive structure is electrically connected with the first recessed portion through the first contact hole, an area of a surface of the first recessed portion close to the conductive layer is larger than an area of an orthographic projection of the first recessed portion on the base substrate, and an average thickness of the first recessed portion in a direction perpendicular to the base substrate is smaller than an average thickness of the first main body portion in the direction perpendicular to the base substrate,
   the buffer layer comprises:
   a first buffer portion, wherein a side of the first buffer portion away from the base substrate is arranged in contact with the conductive layer, and a side of the first buffer portion close to the base substrate is arranged in contact with the conductive light-shielding structure; and
   a second buffer portion, wherein a side of the second buffer portion away from the base substrate is arranged in contact with the interlayer insulating layer, and a side of the second buffer portion close to the base substrate is arranged in contact with the conductive light-shielding structure.

2. The display substrate according to claim 1, wherein the first contact hole comprises a side wall, and the side wall at least comprises:
   a first sub side wall, located in the interlayer insulating layer; and
   a second sub side wall, located in the buffer layer,
   wherein an included angle between the first sub side wall and the base substrate constitutes a first slope angle, an included angle between the second sub side wall and the base substrate constitutes a second slope angle, the first slope angle is smaller than the second slope angle; and a contact portion of the second sub side wall and the first buffer portion is located between the first buffer portion and the second buffer portion.

3. The display substrate according to claim 2, wherein the side wall of the first contact hole further comprises:
   a third sub side wall, located in the first buffer portion,
   wherein an included angle between the third sub side wall and the base substrate constitutes a third slope angle, and the first slope angle, the second slope angle, and the third slope angle are different from each other.

4. The display substrate according to claim 3, wherein, along a radial direction of the first contact hole, a ratio of a length of the first buffer portion to an average thickness of the first buffer portion is greater than a ratio of a projected length of the first sub side wall on the base substrate to an average thickness of the interlayer insulating layer.

5. The display substrate according to claim 3, wherein, along a radial direction of the first contact hole, a ratio of a projected length of the first sub side wall on the base substrate to an average thickness of the interlayer insulating layer is greater than a ratio of a projected length of the second sub side wall on the base substrate to an average thickness of the buffer layer.

6. The display substrate according to claim 3, wherein the second slope angle is greater than the third slope angle, and the first slope angle is greater than the third slope angle.

7. The display substrate according to claim 6, wherein a dimension L of an orthographic projection of the first recessed portion on the base substrate in a direction parallel to the base substrate satisfies the following formula:

$$2(A\cot\beta + B\cot\gamma + C\cot\theta) < L < D$$

wherein A is a maximum thickness of the first buffer portion, B is a maximum thickness of the second buffer portion, C is a maximum thickness of the interlayer insulating layer, $\beta$ is the first slope angle, $\gamma$ is the second slope angle, $\theta$ is the third slope angle, and D is a largest dimension of an orthographic projection of the first contact hole on the base substrate in the direction parallel to the base substrate.

8. A display substrate, comprising a base substrate and a plurality of sub-pixels located on the base substrate, wherein each of the plurality of sub-pixels comprises:
   a conductive light-shielding structure, located on the base substrate;
   a buffer layer, located on a side of the conductive light-shielding structure away from the base substrate;
   a semiconductor layer, located on a side of the buffer layer away from the conductive light-shielding structure;
   an interlayer insulating layer, located on a side of the semiconductor layer away from the buffer layer; and a conductive layer, located on a side of the interlayer insulating layer away from the semiconductor layer, and comprising a conductive structure, wherein the conductive light-shielding structure comprises a first main body portion and a first recessed portion, the display substrate further comprises a first contact hole, the first contact hole penetrates both the interlayer insulating layer and the buffer layer, the conductive structure is electrically connected with the first recessed portion through the first contact hole, an area of a surface of the first recessed portion close to the conductive layer is larger than an area of an orthographic projection of the first recessed portion on the base substrate, and an average thickness of the first recessed portion in a direction perpendicular to the base substrate is smaller than an average thickness of the first main body portion in the direction perpendicular to the base substrate, the first recessed portion comprises a first edge portion, and in a direction from an edge of the first recessed portion to a center of the first recessed portion, a thickness of the first edge portion in the direction perpendicular to the base substrate gradually decreases.

9. The display substrate according to claim 1, wherein the first recessed portion comprises a first edge portion, and a fourth slope angle α of a surface of the first edge portion close to the conductive layer satisfies the following formula:

$$0 < \alpha < k*H/L\max$$

wherein Lmax is a maximum aperture of an orthographic projection of the first recessed portion on the base substrate, H is an average thickness of the first main body portion, and k is a constant greater than 1 and less than or equal to 2.

10. The display substrate according to claim 3, wherein the first recessed portion comprises a first edge portion, a fourth slope angle α of a surface of the first edge portion close to the conductive layer is smaller than the third slope angle of the third sub side wall, and the following formula is satisfied:

$$(A \cot\beta + B \cot\gamma + C \cot\theta + L/2 \tan\alpha) \leq D/2,$$

wherein A is a maximum thickness of the first buffer portion, B is a maximum thickness of the second buffer portion, C is a maximum thickness of the interlayer portion, β is the first slope angle, γ is the second slope angle, θ is the third slope angle, and D is a largest dimension of an orthographic projection of the first contact hole on the base substrate in the direction parallel to the base substrate.

11. The display substrate according to claim 10, further comprising:

a planarization layer, wherein the planarization layer is located on a side of the conductive layer away from the semiconductor layer, and the planarization layer comprises an anode hole; and an anode, wherein the anode is located on a side of the planarization layer away from the semiconductor layer, and comprises a light emitting portion, a driving portion and an extension portion connecting the light emitting portion and the driving portion, and at least a portion of the driving portion is located within the anode hole, wherein in at least one of the sub-pixels, an orthographic projection of the first contact hole on the base substrate at least partially overlaps with an orthographic projection of the driving portion on the base substrate, the display substrate further comprises: a power line, located in the conductive layer; and a sensing line, located in the conductive layer; the power line and the sensing line are arranged in a first direction, both the power line and the sensing line extend in a second direction that intersects the first direction;

the plurality of sub-pixels comprise a first sub-pixel pair and a second sub-pixel pair, the first sub-pixel pair comprises two of the sub-pixels, which are located on two sides of the power line respectively, the second sub-pixel pair comprises two of the sub-pixels, which are located on two sides of the sensing line respectively; the first sub-pixel pair and the second sub-pixel pair are alternately arranged in the first direction, in the two sub-pixels in the second sub-pixel pair, a first overlapping region is provided between an orthographic projection of the anode hole on the base substrate and an orthographic projection of the first recessed portion on the base substrate, and an area of the first overlapping region is smaller than an area of an orthographic projection of the first contact hole on the base substrate.

12. The display substrate according to claim 11, wherein the anode further comprises a concave structure at an edge position of the anode hole, and a concave direction of the concave structure faces the conductive light-shielding structure.

13. The display substrate according to claim 1, wherein an orthographic projection of the first contact hole on the base substrate at least partially overlaps with an orthographic projection of the first recessed portion on the base substrate.

14. A display substrate, comprising a base substrate and a plurality of sub-pixels located on the base substrate, wherein each of the plurality of sub-pixels comprises:

a conductive light-shielding structure, located on the base substrate;

a buffer layer, located on a side of the conductive light-shielding structure away from the base substrate;

a semiconductor layer, located on a side of the buffer layer away from the conductive light-shielding structure;

an interlayer insulating layer, located on a side of the semiconductor layer away from the buffer layer; and a conductive layer, located on a side of the interlayer insulating layer away from the semiconductor layer, and comprising a conductive structure, wherein the conductive light-shielding structure comprises a first main body portion and a first recessed portion, the display substrate further comprises a first contact hole, the first contact hole penetrates both the interlayer insulating layer and the buffer layer, the conductive structure is electrically connected with the first recessed portion through the first contact hole, an area of a surface of the first recessed portion close to the conductive layer is larger than an area of an orthographic projection of the first recessed portion on the base substrate, and an average thickness of the first recessed portion in a direction perpendicular to the base substrate is smaller than an average thickness of the first main body portion in the direction perpendicular to the base substrate, each of the sub-pixels comprises a pixel driving circuit, the pixel driving circuit comprises a first thin film transistor, and the conductive structure is a first drain electrode of the first thin film transistor.

15. The display substrate according to claim 14, wherein the first thin film transistor further comprises:

a first active layer, wherein the first active layer is located in the semiconductor layer, and comprises a first channel region, and a first source electrode region and a first drain electrode region that are located on two sides of the first channel region respectively; and a first source electrode, located in the conductive layer, wherein the display substrate further comprises a first via hole and a second via hole, the first via hole and the second via hole are located in the interlayer insulating layer, the first source electrode is connected with the first source electrode region through the first via hole, and the first drain electrode is connected with the first drain electrode region through the second via hole.

16. The display substrate according to claim 15, wherein the conductive light-shielding structure further comprises:

a first insulating portion, wherein an orthographic projection of the first insulating portion on the base substrate at least partially overlaps with an orthographic projection of the first via hole on the base substrate, and an orthographic projection of the first insulating portion on the base substrate at least partially overlaps with an orthographic projection of the first source electrode region on the base substrate.

17. The display substrate according to claim 11, further comprising:

a gate insulating layer, located between the semiconductor layer and the interlayer insulating layer;

a gate electrode layer, located between the gate insulating layer and the interlayer insulating layer;

a passivation layer, located on a side of the conductive layer away from the base substrate;

a color filter layer, wherein the color filter layer is located on a side of the passivation layer away from the conductive layer, and comprises at least three filters with different colors; and an anode layer, wherein, the planarization layer is located on a side of the color filter layer away from the passivation layer, the anode layer is located on a side of the planarization layer away from the color filter layer, and the anode is located in the anode layer.

18. The display substrate according to claim 17, further comprising:

a power connection line, arranged on a same layer as the conductive light-shielding structure, wherein the power connection line comprises a second main body portion and a plurality of power recessed portions, an average thickness of the power recessed portions in the direction perpendicular to the base substrate is smaller than an average thickness of the second main body portion in the direction perpendicular to the base substrate, and an area of a surface of one of the power recessed portions close to the conductive layer is larger than an area of an orthographic projection of the one of the power recessed portions on the base substrate.

19. The display substrate according to claim 18, wherein an orthographic projection of at least one of the plurality of power recessed portions on the base substrate at least partially overlaps with orthographic projections of the filters in the color filter layer on the base substrate.

20. The display substrate according to claim 17, further comprising:

a sensing connection line, arranged on a same layer as the conductive light-shielding structure, wherein the sensing connection line comprises a third main body portion and a plurality of sensing recessed portions, an average thickness of the sensing recessed portions in a direction perpendicular to the base substrate is smaller than an average thickness of the third main body portion in a direction perpendicular to the base substrate, an area of a surface of one of the sensing recessed portions close to the conductive layer is larger than an area of an orthographic projection of the one of the sensing recessed portions on the base substrate.

21. The display substrate according to claim 20, wherein an orthographic projection of at least one of the plurality of sensing recessed portions on the base substrate at least partially overlaps with orthographic projections of the filters in the color filter layer on the base substrate.

22. The display substrate according to claim 17, wherein each of the sub-pixels comprises a driving region and a light emitting region, the conductive light-shielding structure is located in the driving region, the driving portion of the anode is located in the driving region, and the light emitting portion of the anode is located in the light emitting region.

23. A display device, comprising the display substrate according to claim 1.

* * * * *